US012751152B2

(12) United States Patent
Sasagawa et al.

(10) Patent No.: US 12,751,152 B2
(45) Date of Patent: Sep. 29, 2026

(54) DISPLAY APPARATUS, DISPLAY MODULE, ELECTRONIC DEVICE, AND METHOD FOR FABRICATING DISPLAY APPARATUS

(71) Applicant: Semiconductor Energy Laboratory Co., Ltd., Atsugi (JP)

(72) Inventors: Shinya Sasagawa, Chigasaki (JP); Ryota Hodo, Atsugi (JP); Kentaro Sugaya, Isehara (JP); Yoshikazu Hiura, Atsugi (JP); Takahiro Fujie, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 360 days.

(21) Appl. No.: 18/575,971

(22) PCT Filed: Jun. 30, 2022

(86) PCT No.: PCT/IB2022/056088

§ 371 (c)(1),
(2) Date: Jan. 2, 2024

(87) PCT Pub. No.: WO2023/285906

PCT Pub. Date: Jan. 19, 2023

(65) Prior Publication Data

US 2024/0315084 A1 Sep. 19, 2024

(30) Foreign Application Priority Data

Jul. 16, 2021 (JP) ................................ 2021-117958

(51) Int. Cl.

*H10K 59/122* (2023.01)
*H10K 59/12* (2023.01)
*H10K 59/35* (2023.01)

(52) U.S. Cl.

CPC ....... *H10K 59/122* (2023.02); *H10K 59/1201* (2023.02); *H10K 59/35* (2023.02)

(58) Field of Classification Search

CPC ... H10K 59/122; H10K 59/1201; H10K 59/35
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | | |
|---|---|---|---|
| CN | 112314056 | A | 2/2021 |
| CN | 114514613 | A | 5/2022 |

(Continued)

OTHER PUBLICATIONS

International Search Report (Application No. PCT/IB2022/056088) Dated Sep. 27, 2022.

(Continued)

*Primary Examiner* — Richard A Booth
(74) *Attorney, Agent, or Firm* — Eric J. Robinson; Robinson Intellectual Property Law Office, P.C.

(57) ABSTRACT

A display apparatus with high display quality is provided. The display apparatus includes a first light-emitting device including a first pixel electrode, a first layer, and a common electrode; a second light-emitting device including a second pixel electrode, a second layer, and the common electrode; a first coloring layer; a second coloring layer transmitting light with a color different from a color of light transmitted by the first coloring layer; a first insulating layer; and a second coloring layer. The first layer and the second layer each contain a first light-emitting material emitting blue light and a second light-emitting material emitting light with a longer wavelength than blue light and are separated from (Continued)

each other. The first insulating layer covers a side surface and part of a top surface of the first layer and a side surface and part of a top surface of the second layer. The second insulating layer overlaps with the side surface and the part of the top surface of the first layer and the side surface and the part of the top surface of the second layer with the first insulating layer therebetween. The common electrode covers the second insulating layer. In a cross-sectional view, an end portion of the second insulating layer has a tapered shape with a taper angle less than 90 degrees.

27 Claims, 39 Drawing Sheets

(56) References Cited

U.S. PATENT DOCUMENTS

| | | | |
|---|---|---|---|
| 2002/0072139 A1 | 6/2002 | Kashiwabara | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2020/0203662 A1 | 6/2020 | Mollard et al. | |
| 2021/0265432 A1* | 8/2021 | Kato | H10K 59/873 |
| 2022/0130918 A1 | 4/2022 | Yamazaki et al. | |
| 2022/0278177 A1 | 9/2022 | Kubota et al. | |
| 2023/0301151 A1 | 9/2023 | Kato | |
| 2024/0099068 A1 | 3/2024 | Yamazaki et al. | |

FOREIGN PATENT DOCUMENTS

| | | |
|---|---|---|
| JP | 2000-036385 A | 2/2000 |
| JP | 2003-059663 A | 2/2003 |
| JP | 2008-098106 A | 4/2008 |
| JP | 2008-108482 A | 5/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| WO | WO-2018/087625 | 5/2018 |
| WO | WO-2020/004086 | 1/2020 |
| WO | WO-2021/009621 | 1/2021 |

OTHER PUBLICATIONS

Written Opinion (Application No. PCT/IB2022/056088) Dated Sep. 27, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner 140
127b
127
125A
118a
111a
111b
111c
113
123
255c
101
X1
X2
Y1
Y2

DISPLAY APPARATUS, DISPLAY MODULE, ELECTRONIC DEVICE, AND METHOD FOR FABRICATING DISPLAY APPARATUS

TECHNICAL FIELD

One embodiment of the present invention relates to a display apparatus, a display module, and an electronic device. One embodiment of the present invention relates to a method for fabricating a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

Recent display apparatuses have been expected to be applied to a variety of uses. Usage examples of large-sized display apparatuses include a television device for home use (also referred to as TV or television receiver), digital signage, and a PID (Public Information Display). In addition, a smartphone and a tablet terminal each including a touch panel, and the like, are being developed as portable information terminals.

Furthermore, higher-resolution display apparatuses have been required. For example, devices for virtual reality (VR), augmented reality (AR), substitutional reality (SR), or mixed reality (MR) are given as devices required by high-resolution display apparatuses and have been actively developed.

Light-emitting apparatuses including light-emitting devices (also referred to as light-emitting elements) have been developed as display apparatuses, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display apparatuses.

Patent Document 1 discloses a display apparatus using an organic EL device (also referred to as organic EL element) for VR.

REFERENCE

Patent Document

[Patent Document 1] PCT International Publication No. 2018/087625

SUMMARY OF THE INVENTION

Problems to be Solved by the Invention

An object of one embodiment of the present invention is to provide a display apparatus with high display quality. An object of one embodiment of the present invention is to provide a high-resolution display apparatus. An object of one embodiment of the present invention is to provide a high-definition display apparatus. An object of one embodiment of the present invention is to provide a highly reliable display apparatus.

An object of one embodiment of the present invention is to provide a method for fabricating a high-resolution display apparatus. An object of one embodiment of the present invention is to provide a method for fabricating a high-definition display apparatus. An object of one embodiment of the present invention is to provide a method for fabricating a highly reliable display apparatus. An object of one embodiment of the present invention is to provide a method for fabricating a display apparatus with a high yield.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display apparatus including a first light-emitting device, a second light-emitting device, a first coloring layer, a second coloring layer, a first insulating layer, and a second insulating layer. The first light-emitting device includes a first pixel electrode, a first layer over the first pixel electrode, and a common electrode over the first layer. The second light-emitting device includes a second pixel electrode, a second layer over the second pixel electrode, and the common electrode over the second layer. The first layer and the second layer each contain a first light-emitting material emitting blue light and a second light-emitting material emitting light with a longer wavelength than blue light and are separated from each other. The first coloring layer overlaps with the first light-emitting device. The second coloring layer overlaps with the second light-emitting device. The second coloring layer and the first coloring layer transmit light of different colors. The first insulating layer covers a side surface and part of a top surface of the first layer and a side surface and part of a top surface of the second layer. The second insulating layer overlaps with the side surface and the part of the top surface of the first layer and the side surface and the part of the top surface of the second layer with the first insulating layer therebetween. The common electrode covers the second insulating layer. In a cross-sectional view, an end portion of the second insulating layer has a tapered shape with a taper angle less than 90°.

A top surface of the second insulating layer preferably has a convex shape.

In the cross-sectional view, an end portion of the first insulating layer preferably has a tapered shape with a taper angle less than 90°.

The second insulating layer preferable covers at least part of a side surface of the end portion of the first insulating layer.

An end portion of the second insulating layer is preferably positioned outward from the end portion of the first insulating layer.

A side surface of the second insulating layer preferably has a concave shape.

Preferably, the display apparatus further includes a third insulating layer and a fourth insulating layer, the third insulating layer is positioned between the top surface of the first layer and the first insulating layer, the fourth insulating layer is positioned between the top surface of the second layer and the first insulating layer, and an end portion of the third insulating layer and an end portion of the fourth insulating layer are each positioned outward from the end portion of the first insulating layer.

The second insulating layer preferably covers at least part of a side surface of the third insulating layer and at least part of a side surface of the fourth insulating layer.

In the cross-sectional view, the end portion of the third insulating layer and the end portion of the fourth insulating layer each preferably have a tapered shape with a taper angle less than 90°.

Preferably, the end portion of the first insulating layer is positioned on an outer side of the end portion of the second insulating layer, and in the cross-sectional view, the end portion of the first insulating layer has a tapered shape with a taper angle less than 90°.

The end portion of the first insulating layer preferably includes a portion with a smaller thickness than a portion overlapping with the second insulating layer.

Preferably, the display apparatus further includes the third insulating layer and the fourth insulating layer, the third insulating layer is positioned between the top surface of the first layer and the first insulating layer, the fourth insulating layer is positioned between the top surface of the second layer and the first insulating layer, and the end portion of the third insulating layer and the end portion of the fourth insulating layer are each positioned outward from the end portion of the first insulating layer.

In the cross-sectional view, the end portion of the third insulating layer and the end portion of the fourth insulating layer each preferably have a tapered shape with a taper angle less than 90°.

Preferably, the first layer and the second layer each include a light-emitting layer and a functional layer over the light-emitting layer, and the functional layer includes at least one of a hole-injection layer, an electron-injection layer, a hole-transport layer, an electron-transport layer, a hole-blocking layer, and an electron-blocking layer.

The first insulating layer and the second insulating layer each preferably include a portion overlapping with a top surface of the first pixel electrode and a portion overlapping with a top surface of the second pixel electrode.

Preferably, the first layer covers a side surface of the first pixel electrode, and the second layer covers a side surface of the second pixel electrode.

In the cross-sectional view, an end portion of the first pixel electrode and an end portion of the second pixel electrode each preferably have a tapered shape with a taper angle less than 90°.

Preferably, the first insulating layer is an inorganic insulating layer, and the second insulating layer is an organic insulating layer. The first insulating layer preferably includes aluminum oxide. The second insulating layer preferably includes an acrylic resin.

Preferably, the first light-emitting device includes a common layer between the first layer and the common electrode, the second light-emitting device includes the common layer between the second layer and the common electrode, and the common layer is positioned between the second insulating layer and the common electrode.

One embodiment of the present invention is a display module including the display apparatus having any of the above structures; for example, the display module is provided with a connector such as a flexible printed circuit (hereinafter referred to as an FPC) or a TCP (Tape Carrier Package), or mounted with an integrated circuit (IC) by a COG (Chip On Glass) method, a COF (Chip On Film) method, or the like.

One embodiment of the present invention is an electronic device including the above display module and at least one of a housing, a battery, a camera, a speaker, and a microphone.

One embodiment of the present invention is a method for fabricating a display apparatus, including: forming a first pixel electrode and a second pixel electrode; forming a first film over the first pixel electrode and the second pixel electrode; forming a mask film over the first film; processing the first film and the mask film to form a first layer and a first mask layer over the first pixel electrode and to form a second layer and a second mask layer over the second pixel electrode; forming a first insulating film over the first mask layer and the second mask layer; forming a second insulating film over the first insulating film; processing the second insulating film to form a second insulating layer so as to overlap with a region interposed between the first pixel electrode and the second pixel electrode; performing heat treatment and then performing first etching treatment using the second insulating layer as a mask to remove part of the first mask layer and part of the second mask layer and to expose a top surface of the first layer and a top surface of the second layer; and forming a common electrode to cover the first layer, the second layer, and the second insulating layer. The first layer and the second layer each contain a first light-emitting material emitting blue light and a second light-emitting material emitting light with a longer wavelength than blue light.

Second etching treatment is preferably performed using the second insulating layer as a mask before the heat treatment to remove part of the first insulating film and to thin down the part of the first mask layer and the part of the second mask layer.

Preferably, the second etching treatment is performed using the second insulating layer as a mask after the heat treatment to remove part of the first insulating film and to thin down the part of the first mask layer and the part of the second mask layer, plasma treatment is performed in an oxygen atmosphere to shrink the second insulating layer, and the first etching treatment is then performed.

Preferably, the first layer and the second layer each include a light-emitting layer and a functional layer over the light-emitting layer, and the functional layer includes at least one of a hole-injection layer, an electron-injection layer, a hole-transport layer, an electron-transport layer, a hole-blocking layer, and an electron-blocking layer.

As the first insulating film, oxide aluminum is preferably deposited by an ALD method.

As the mask film, aluminum oxide is preferably deposited by an ALD method.

The second insulating film is preferably formed using a photosensitive acrylic resin.

The first etching treatment is preferably performed by wet etching.

Effect of the Invention

With one embodiment of the present invention, a display apparatus with high display quality can be provided. With one embodiment of the present invention, a high-resolution display apparatus can be provided. With one embodiment of the present invention, a high-definition display apparatus can be provided. With one embodiment of the present invention, a highly reliable display apparatus can be provided.

With one embodiment of the present invention, a method for fabricating a high-resolution display apparatus can be provided. With one embodiment of the present invention, a method for fabricating a high-definition display apparatus can be provided. With one embodiment of the present invention, a method for fabricating a highly reliable display apparatus can be provided. With one embodiment of the present invention, a method for fabricating a display apparatus with a high yield can be provided.

Note that the description of these effects does not preclude the existence of other effects. One embodiment of the present invention does not necessarily have all of these effects. Other effects can be derived from the description of the specification, the drawings, and the claims.

MODE FOR CARRYING OUT THE INVENTION

Figure 1A:
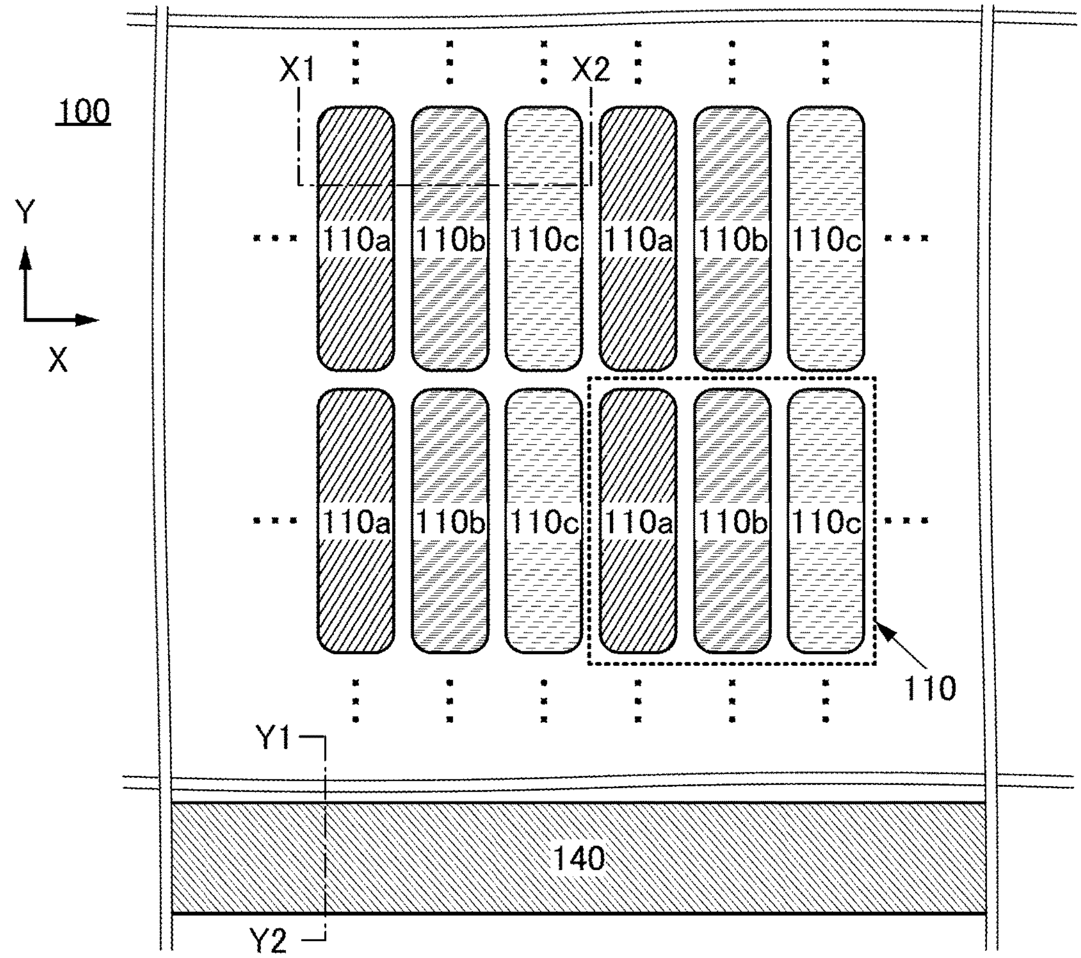
FIG. 1A is a top view illustrating an example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same reference numerals are commonly used for the same portions or portions having similar functions in different drawings, and a repeated description thereof is omitted. The same hatching pattern is applied to portions having similar functions, and the portions are not especially denoted by reference numerals in some cases.

The position, size, range, or the like of each component illustrated in drawings does not represent the actual position, size, range, or the like in some cases for easy understanding.

Therefore, the disclosed invention is not necessarily limited to the position, size, range, or the like disclosed in the drawings.

Note that the term "film" and the term "layer" can be interchanged with each other depending on the case or the circumstances. For example, the term "conductive layer" can be replaced with the term "conductive film". As another example, the term "insulating film" can be replaced with the term "insulating layer".

In this specification and the like, a device fabricated using a metal mask or an FMM (fine metal mask) is sometimes referred to as a device having an MM (metal mask) structure. In this specification and the like, a device fabricated without using a metal mask or an FMM may be referred to as a device having an MML (metal maskless) structure.

In this specification and the like, a structure in which light-emitting layers of light-emitting devices having different emission wavelengths are separately formed is sometimes referred to as an SBS (Side By Side) structure. The SBS structure allows optimization of materials and structures of light-emitting devices and thus can extend freedom of choice of the materials and the structures, which makes it easy to improve the luminance and the reliability.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that the above-described carrier-injection layer, carrier-transport layer, and carrier-blocking layer cannot be distinguished from each other on the basis of the cross-sectional shape, properties, or the like in some cases. Furthermore, one layer may have two or three functions of the carrier-injection layer, the carrier-transport layer, and the carrier-blocking layer in some cases.

In this specification and the like, a light-emitting device (also referred to as a light-emitting element) includes an EL layer between a pair of electrodes. The EL layer includes at least a light-emitting layer. In this specification and the like, a light-receiving device (also referred to as a light-receiving element) includes at least an active layer functioning as a photoelectric conversion layer between a pair of electrodes. In this specification and the like, one of the pair of electrodes may be referred to as a pixel electrode and the other may be referred to as a common electrode.

Note that in this specification and the like, a tapered shape refers to a shape such that at least part of a side surface of a component is inclined with respect to a substrate surface or a formation surface. For example, a tapered shape preferably includes a region where the angle formed by the inclined side surface and the substrate surface or the formation surface (such an angle is also referred to as a taper angle) is less than 90°. Note that the side surface of the component and the substrate surface are not necessarily completely flat and may be substantially flat with a slight curvature or substantially flat with slight unevenness.

Embodiment 1

In this embodiment, display apparatuses of one embodiment of the present invention will be described with reference to FIG. 1 to FIG. 11.

In the display apparatus of one embodiment of the present invention, subpixels include light-emitting devices including EL layers with the same structure, and coloring layers overlapping with the light-emitting devices. Coloring layers that can transmit visible light of different colors are provided for subpixels, whereby full-color display can be performed.

In the base where light-emitting devices including EL layers with the same structure are used, layers included in the light-emitting devices other than a pixel electrode (e.g., a light-emitting layer) can be used in common between a plurality of subpixels. Thus, the plurality of subpixels can share a continuous film. However, some of the layers included in the light-emitting device have relatively high conductivity. When the plurality of subpixels share a continuous film with high conductivity, leakage current might be generated between the subpixels. Particularly when an increase in the resolution or the aperture ratio of a display apparatus reduces the distance between subpixels, the leakage current might become too large to ignore and cause a decrease in display quality or the like of the display apparatus.

In view of the above, in the display apparatus of one embodiment of the present invention, at least one layer included in the EL layer is formed in an island shape in each light-emitting device. When at least one layer included in the EL layer is separated between light-emitting devices, generation of crosstalk between adjacent subpixels can be inhibited. This enables the display apparatus to achieve both high resolution and high display quality.

Note that in this specification and the like, "island shape" refers to a state where two or more layers formed using the same material in the same step are physically separated from each other. For example, "island-shaped light-emitting layer" refers to a state where the light-emitting layer and its adjacent light-emitting layer are physically separated from each other.

For example, an island-shaped light-emitting layer can be formed by a vacuum evaporation method using a metal mask. However, this method causes a deviation from the designed shape and position of an island-shaped light-emitting layer due to various influences such as the low accuracy of the metal mask, the positional deviation between the metal mask and a substrate, a warp of the metal mask, and the vapor-scattering-induced expansion of outline of the formed film; accordingly, it is difficult to achieve higher resolution and a higher aperture ratio of the display apparatus. In addition, the outline of the layer may blur during vapor deposition, whereby the thickness of an end portion may be reduced. That is, the thickness of the island-shaped light-emitting layer may vary from area to area. In the case of fabricating a display apparatus with a large size, high definition, or high resolution, the manufacturing yield might be decreased because of low dimensional accuracy of the metal mask and deformation due to heat or the like.

In view of this, in fabricating a display apparatus of one embodiment of the present invention, fine patterning of light-emitting layers is performed by a photolithography method without a shadow mask such as a metal mask. Specifically, pixel electrodes are formed for the respective subpixels, and then a light-emitting layer is formed across the pixel electrodes. After that, the light-emitting layer is processed by a photolithography method, so that one island-shaped light-emitting layer is formed per pixel electrode. Thus, the light-emitting layer can be divided for the respective subpixels, so that island-shaped light-emitting layers can be formed for the respective subpixels.

In the case of processing the light-emitting layer into an island shape, a structure is possible where processing is performed by a photolithography method directly on the light-emitting layer. In the case of this structure, damage to the light-emitting layer (e.g., processing damage) might significantly degrade the reliability. In view of this, in fabrication of the display apparatus of one embodiment of the present invention, a mask layer (also referred to as a sacrificial layer, a protective layer, or the like) or the like is preferably formed over a layer positioned above the light-emitting layer (e.g., a carrier-transport layer or a carrier-injection layer, specifically, an electron-transport layer, an electron-injection layer, or the like), followed by processing of the light-emitting layer into an island shape. Such a method provides a highly reliable display apparatus. A layer provided between the light-emitting layer and the mask layer can inhibit the light-emitting layer from being exposed on the outermost surface during the fabrication step of the display apparatus and can reduce damage to the light-emitting layer.

Note that in this specification and the like, each of a mask film and a mask layer is positioned above at least a light-emitting layer (specifically, a layer processed into an island shape among layers included in an EL layer) and has a function of protecting the light-emitting layer in the manufacturing process.

Note that in the light-emitting device, it is not necessary to form all layers included in the EL layer separately, and some of the layers can be formed in the same step. Examples of the layers (also referred to as functional layers) in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In the method for fabricating a display apparatus of one embodiment of the present invention, after some layers included in the EL layer are formed into an island shape separately for each color, the mask layer is removed at least partly; then, the other layers (sometimes referred to as common layers) included in the EL layers and a common electrode (also referred to as an upper electrode) are formed (as a single film) to be shared by the light-emitting devices of different colors. For example, a carrier-injection layer and a common electrode can be formed so as to be shared by the light-emitting devices of different colors.

Meanwhile, the carrier-injection layer is often a layer having relatively high conductivity in the EL layer. Therefore, when the carrier-injection layer is in contact with a side surface of any layer of the EL layer formed into an island shape or a side surface of the pixel electrode, the light-emitting device might be short-circuited. Note that also in the case where the carrier-injection layer is provided in an island shape and the common electrode is formed to be shared by the light-emitting devices of different colors, the light-emitting device might be short-circuited when the common electrode is in contact with the side surface of the EL layer or the side surface of the pixel electrode.

Thus, the display apparatus of one embodiment of the present invention includes an insulating layer covering at least the side surface of the island-shaped light-emitting layer. The insulating layer preferably covers part of the top surface of the island-shaped light-emitting layer.

This can inhibit at least one layer of the island-shaped EL layers and the pixel electrodes from being in contact with the carrier-injection layer or the common electrode. Hence, a short circuit of the light-emitting device is inhibited, and the reliability of the light-emitting device can be increased.

In a cross-sectional view, an end portion of the insulating layer preferably has a tapered shape with a taper angle less than 90°. In this case, step disconnection of the common layer and the common electrode provided over the insulating layer can be prevented. Consequently, it is possible to inhibit a connection defect due to step disconnection. Alternatively, an increase in electrical resistance caused by local thinning of the common electrode due to level difference can be inhibited.

Note that in this specification and the like, step disconnection refers to a phenomenon in which a layer, a film, or an electrode is disconnected because of the shape of the formation surface (e.g., a level difference).

As described above, the island-shaped light-emitting layers fabricated by the method for fabricating a display apparatus of one embodiment of the present invention are formed not by using a fine metal mask but by processing a light-emitting layer formed over the entire surface. Accordingly, a high-resolution display apparatus or a display apparatus with a high aperture ratio, which has been difficult to achieve, can be manufactured. Moreover, providing the mask layer over the light-emitting layer can reduce damage to the light-emitting layer in the fabrication process of the display apparatus, resulting in an increase in reliability of the light-emitting device.

The small number of times of processing of the light-emitting layer by a photolithography method is preferable because a reduction in manufacturing cost and an improvement of manufacturing yield become possible. In the method for fabricating the display apparatus of one embodiment of the present invention, the number of times of processing of the light-emitting layer by a photolithography method can be one; thus, the display apparatus can be fabricated with a high yield.

It is difficult to reduce the distance between adjacent light-emitting devices to less than m with a formation method using a metal mask, for example. However, the method using photolithography according to one embodiment of the present invention can shorten the distance between adjacent light-emitting devices, the distance between adjacent EL layers, or the distance between adjacent pixel electrodes to less than 10 μm, less than or equal to 5 μm, less than or equal to 3 μm, less than or equal to 2 μm, less than or equal to 1.5 μm, less than or equal to 1 μm, or even less than or equal to 0.5 μm, for example, in a process over a glass substrate. Using a light exposure apparatus for LSI can further shorten the distance between adjacent light-emitting devices, the distance between adjacent EL layers, or the distance between adjacent pixel electrodes to less than or equal to 500 nm, less than or equal to 200 nm, less than or equal to 100 nm, or even less than or equal to 50 nm, for example, in a process over a Si wafer. Accordingly, the area of a non-light-emitting region that could exist between two light-emitting devices can be significantly reduced, and the aperture ratio can be close to 100%. For example, in the display apparatus of one embodiment of the present invention, the aperture ratio higher than or equal to 40%, higher than or equal to 50%, higher than or equal to 60%, higher than or equal to 70%, higher than or equal to 80%, or higher than or equal to 90% and lower than 100% can be achieved.

Note that increasing the aperture ratio of the display apparatus can improve the reliability of the display apparatus. Specifically, with reference to the lifetime of a display apparatus including an organic EL device and having an aperture ratio of 10%, a display apparatus having an aperture ratio of 20% (that is, two times the aperture ratio of the reference) has a lifetime approximately 3.25 times as long as that of the reference, and a display apparatus having an aperture ratio of 40% (that is, four times the aperture ratio of the reference) has a lifetime approximately 10.6 times as long as that of the reference. Thus, the density of current flowing to the organic EL device can be reduced with increasing aperture ratio, and accordingly the lifetime of the display apparatus can be increased. The display apparatus of one embodiment of the present invention can have a higher aperture ratio and thus can have higher display quality. Furthermore, the display apparatus of one embodiment of the present invention has excellent effect that the reliability (especially the lifetime) can be significantly improved with increasing aperture ratio.

Furthermore, a pattern of the light-emitting layer itself (also referred to as a processing size) can be made much smaller than that in the case of using a fine metal mask. For example, in the case of using a metal mask for forming light-emitting layers separately, a variation in the thickness occurs between the center and the edge of the light-emitting layer. This causes a reduction in an effective area that can be used as a light-emitting region with respect to the area of the light-emitting layer. In contrast, in the above fabricating method, a film formed to have a uniform thickness is processed, so that island-shaped light-emitting layers can be formed to have a uniform thickness. Accordingly, even in a fine pattern, almost the whole area can be used as a light-emitting region. Thus, a display apparatus having both a high resolution and a high aperture ratio can be fabricated. Furthermore, the display apparatus can be reduced in size and weight.

Specifically, for example, the display apparatus of one embodiment of the present invention can have a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

In this embodiment, cross-sectional structures of the display apparatus of one embodiment of the present invention are mainly described, and a method for fabricating the display apparatus of one embodiment of the present invention will be described in detail in Embodiment 2.

FIG. 1A is a top view of a display apparatus 100. The display apparatus 100 includes a display portion in which a plurality of pixels 110 are arranged, and a connection portion 140 outside the display portion. A plurality of subpixels are arranged in a matrix in the display portion. FIG. 1A illustrates subpixels in two rows and six columns, which form pixels in two rows and two columns. The connection portion 140 can also be referred to as a cathode contact portion.

The top surface shapes of the subpixels illustrated in FIG. 1A correspond to the top surface shapes of light-emitting regions. Note that in this specification and the like, a top surface shape refers to a shape in a plan view, i.e., a shape seen from above.

Examples of a top surface shape of the subpixel include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in FIG. 1A and may be placed outside the subpixels. For example, transistors included in the subpixel 110*a* may be positioned within the range of the subpixel 110*b* illustrated in FIG. 1A, or some or all of the transistors may be positioned outside the range of the subpixel 110*a*.

Although the subpixels 110*a*, 110*b*, and 110*c* have the same or substantially the same aperture ratio (also referred to as size or size of a light-emitting region) in FIG. 1A, one embodiment of the present invention is not limited thereto. The aperture ratio of each of the subpixels 110*a*, 110*b*, and 110*c* can be determined as appropriate. The subpixels 110*a*, 110*b*, and 110*c* may have different aperture ratios, or two or more of the subpixels 110*a*, 110*b*, and 110*c* may have the same or substantially the same aperture ratio.

The pixel 110 illustrated in FIG. 1A employs stripe arrangement. The pixel 110 illustrated in FIG. 1A is composed of three subpixels: the subpixels 110*a*, 110*b*, and 110*c*. The subpixels 110*a*, 110*b*, and 110*c* emit light of different colors. As the subpixels 110*a*, 110*b*, and 110*c*, subpixels of three colors of red (R), green (G), and blue (B) or subpixels of three colors of yellow (Y), cyan (C), and magenta (M) can be given, for example. The number of types of subpixels is not limited to three, and may be four or more. As the four subpixels, subpixels of four colors of R, G, B, and white (W), subpixels of four colors of R, G, B, and Y, or four subpixels of R, G, B, and infrared light (IR) can be given, for example.

In this specification and the like, the row direction is referred to as X direction and the column direction is referred to as Y direction in some cases. The X direction and the Y direction intersect with each other and are, for example, orthogonal to each other (see FIG. 1A). FIG. 1A illustrates an example where subpixels of different colors are arranged in the X direction and subpixels of the same color are arranged in the Y direction.

Although FIG. 1A illustrates an example where the connection portion 140 is positioned on the lower side of the display portion in the top view, there is no particular limitation on the position of the connection portion 140. The connection portion 140 may be provided in at least one of the upper side, the right side, the left side, and the lower side of the display portion in the top view, and may be provided so as to surround the four sides of the display portion. The top surface shape of the connection portion 140 can be a belt-like shape, an L shape, a U shape, a frame-like shape, or the like. The number of the connection portions 140 can be one or more.

Figure 1B:
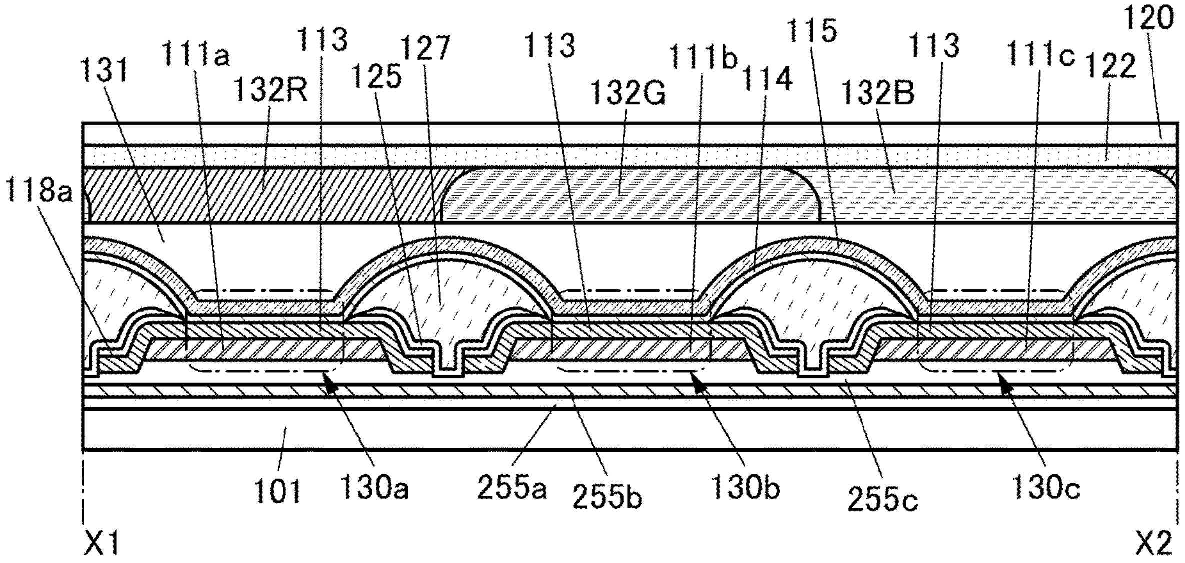
FIG. 1B is a cross-sectional view illustrating the example of a display apparatus.
Figure 2A:
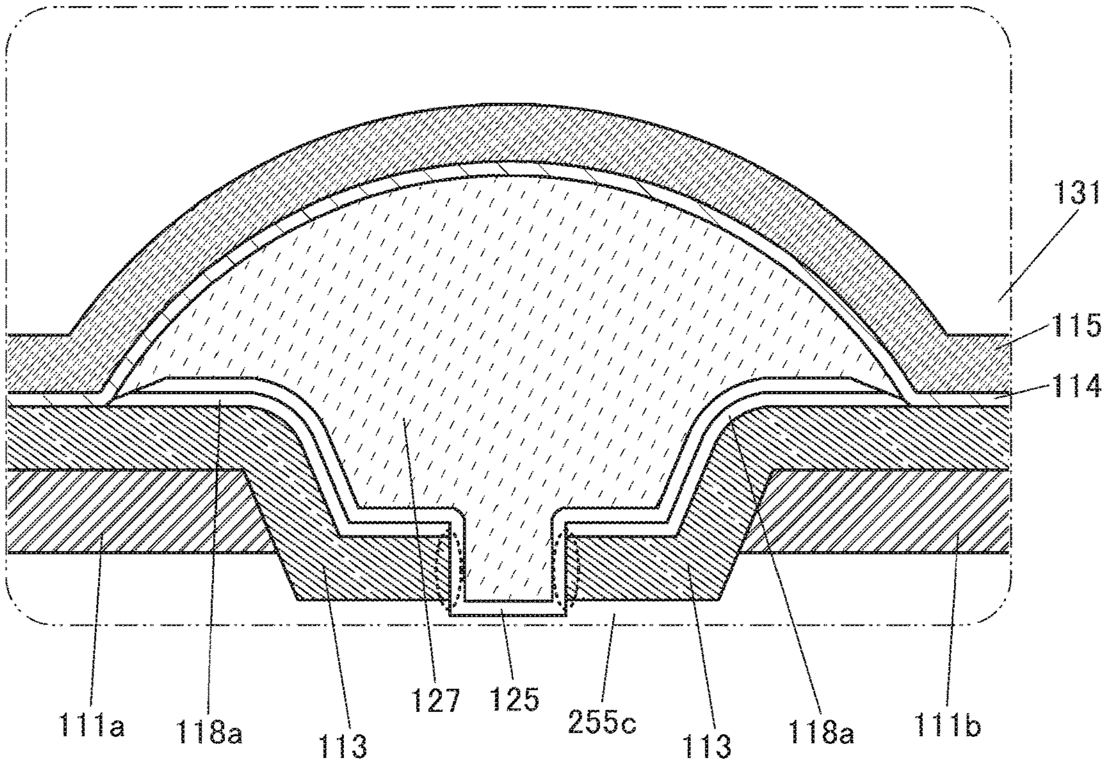
FIG. 2A and FIG. 2B are cross-sectional views illustrating an example of a display apparatus.
Figure 2B:
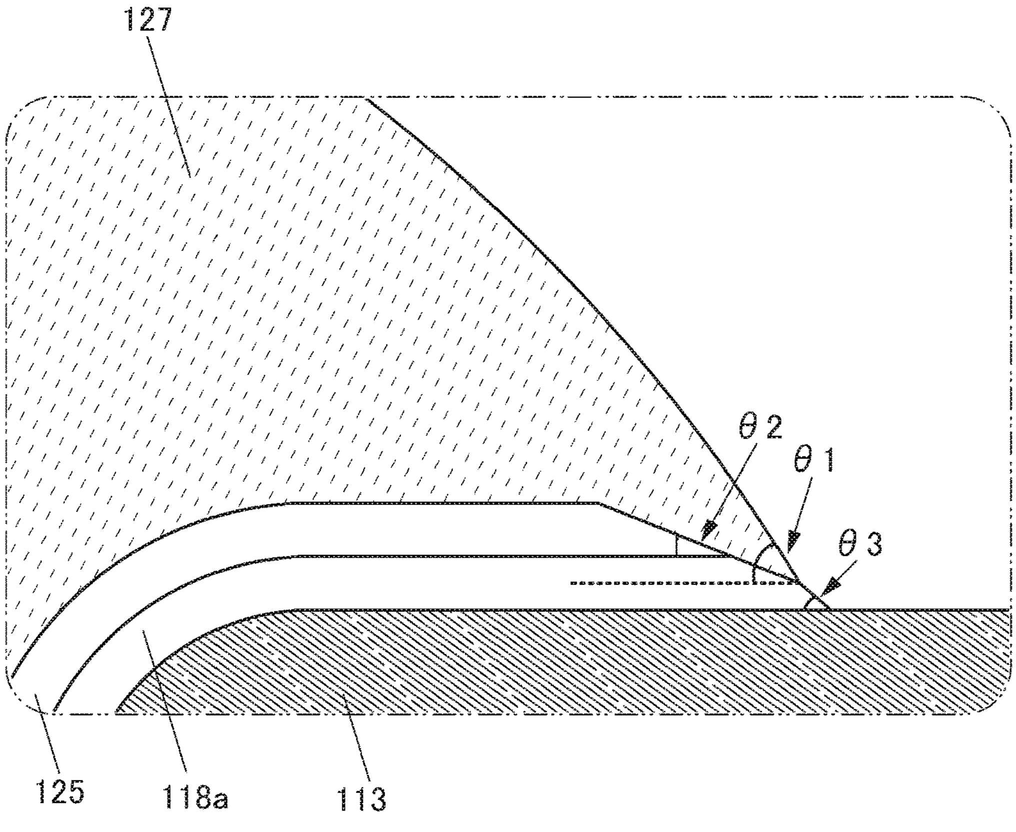
Figure 10A:
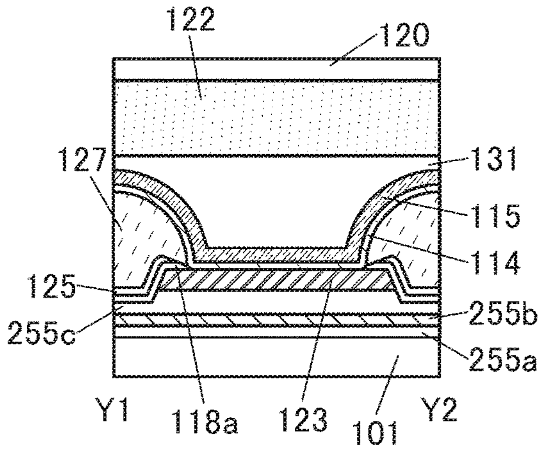
FIG. 10A and FIG. 10B are cross-sectional views illustrating examples of a display apparatus.
Figure 10B:
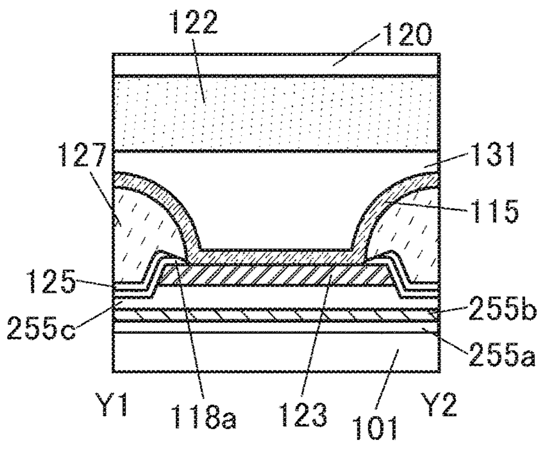

FIG. 1B is a cross-sectional view along dashed-dotted line X1-X2 in FIG. 1A. FIG. 2A and FIG. 2B are enlarged views of part of the cross-sectional view in FIG. 1B. FIG. 3 to FIG. 6 illustrate variation examples of FIG. 2. FIG. 10A and FIG. 10B each illustrate a cross-sectional view along dashed-dotted line Y1-Y2 in FIG. 1A.

The subpixel 110*a* includes a light-emitting device 130*a* and a coloring layer 132R transmitting red light. Thus, light emitted from the light-emitting device 130*a* is extracted as red light to the outside of the display apparatus through the coloring layer 132R.

Similarly, the subpixel 110*b* includes a light-emitting device 130*b* and a coloring layer 132G transmitting green light. Thus, light emitted from the light-emitting device 130*b* is extracted as green light to the outside of the display apparatus through the coloring layer 132G.

The subpixel 110*c* includes a light-emitting device 130*c* and a coloring layer 132B transmitting blue light. Thus, light emitted from the light-emitting device 130*c* is extracted as blue light to the outside of the display apparatus through the coloring layer 132B.

As illustrated in FIG. 1B, in the display apparatus 100, an insulating layer is provided over a layer 101 including transistors, light-emitting devices 130*a*, 130*b*, and 130*c* are provided over the insulating layer, and a protective layer 131 is provided to cover these light-emitting devices. The coloring layers 132R, 132G, and 132B are provided over the protective layer 131, and a substrate 120 is attached onto the protective layer 131 with a resin layer 122. In a region between adjacent light-emitting devices, an insulating layer 125 and an insulating layer 127 over the insulating layer 125 are provided.

Although FIG. 1B illustrates a plurality of cross sections of the insulating layer 125 and the insulating layer 127, the insulating layer 125 and the insulating layer 127 are each a continuous layer when the display apparatus 100 is seen from above. In other words, the display apparatus 100 can have a structure including one insulating layer 125 and one insulating layer 127, for example. Note that the display apparatus 100 may include a plurality of insulating layers 125 which are separated from each other and a plurality of insulating layers 127 which are separated from each other.

The display apparatus of one embodiment of the present invention can have any of the following structures: a top-emission structure where light is emitted in a direction opposite to the substrate where the light-emitting device is formed, a bottom-emission structure where light is emitted toward the substrate where the light-emitting device is formed, and a dual-emission structure where light is emitted toward both surfaces.

The layer 101 including transistors can employ a stacked-layer structure where a plurality of transistors are provided over a substrate and an insulating layer is provided to cover these transistors, for example. The insulating layer over the transistors may have a single-layer structure or a stacked-layer structure. In FIG. 1B, an insulating layer 255*a*, an insulating layer 255*b* over the insulating layer 255*a*, and an insulating layer 255*c* over the insulating layer 255*b* are illustrated as the insulating layer over the transistors. The insulating layers may have a depressed portion between adjacent light-emitting devices. FIG. 1B and the like illustrate examples where a depressed portion is provided in the insulating layer 255*c*. Note that the insulating layers (the insulating layer 255*a* to the insulating layer 255*c*) over the transistors may be regarded as part of the layer 101 including transistors.

As each of the insulating layer 255*a*, the insulating layer 255*b*, and the insulating layer 255*c*, a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as the insulating layer 255*a* and the insulating layer 255*c* and a silicon nitride film be used as the insulating layer 255*b*. The insulating layer 255*b* preferably has a function of an etching protective film.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

Structure examples of the layer 101 including transistors will be described later in Embodiment 4.

As the light-emitting device, an OLED (Organic Light Emitting Diode) or a QLED (Quantum-dot Light Emitting Diode) is preferably used. Examples of a light-emitting substance (also referred to as a light-emitting material) contained in the light-emitting device include a substance exhibiting fluorescence (a fluorescent material), a substance exhibiting phosphorescence (a phosphorescent material), an inorganic compound (a quantum dot material or the like), and a substance exhibiting thermally activated delayed fluorescence (a thermally activated delayed fluorescence (TADF) material). In addition, an LED (Light Emitting Diode) such as a micro LED can also be used as the light-emitting device.

The light-emitting device can emit infrared, red, green, blue, cyan, magenta, yellow, or white light, for example. Furthermore, the color purity can be further increased when the light-emitting device has a microcavity structure.

Embodiment 5 can be referred to for the structure and materials of the light-emitting device.

One of a pair of electrodes of the light-emitting device functions as an anode and the other electrode functions as a cathode. The case where the pixel electrode functions as an anode and the common electrode functions as a cathode is described below as an example in some cases.

The light-emitting device 130*a* includes a pixel electrode 111*a* over the insulating layer 255*c*, an island-shaped first layer 113 over the pixel electrode 111*a*, a common layer 114 over the island-shaped first layer 113, and a common electrode 115 over the common layer 114. The light-emitting device 130*b* includes a pixel electrode 111*b* over the insulating layer 255*c*, the island-shaped first layer 113 over the pixel electrode 111*b*, the common layer 114 over the island-shaped first layer 113, and the common electrode 115 over the common layer 114. The light-emitting device 130*c* includes a pixel electrode 112*c* over the insulating layer 255*c*, the island-shaped first layer 113 over the pixel electrode 111*c*, the common layer 114 over the island-shaped first layer 113, and the common electrode 115 over the common layer 114. In the light-emitting devices 130*a*, 130*b*, and 130*c*, the first layer 113 and the common layer 114 can be collectively referred to as an EL layer.

In this specification and the like, in the EL layers included in the light-emitting devices, the island-shaped layer provided in each light-emitting device is referred to as the first layer 113, and the layer shared by the plurality of light-emitting devices is referred to as the common layer 114. Note that in this specification and the like, the first layer 113 is sometimes referred to as an island-shaped EL layer, an EL layer formed into an island shape, or the like, in which case the common layer 114 is not included in the EL layer.

The light-emitting devices 130*a*, 130*b*, and 130*c* each include the first layer 113, and the first layers 113 are apart from each other. When the EL layer is provided in an island shape for each light-emitting device, a leakage current between adjacent light-emitting devices can be inhibited. This can prevent crosstalk due to unintended light emission, so that a display apparatus with extremely high contrast can be achieved. Specifically, a display apparatus having high current efficiency at low luminance can be achieved.

When the light-emitting devices 130*a*, 130*b*, and 130*c* include EL layers with the same structure, the steps of fabricating the display apparatus can be reduced, which can reduce the manufacturing cost and increase the manufacturing yield.

The end portions of the pixel electrode 111*a*, the pixel electrode 111*b*, and the pixel electrode 111*c* each preferably have a tapered shape. Specifically, the end portions of the pixel electrode 111*a*, the pixel electrode 111*b*, and the pixel electrode 111*c* each preferably have a tapered shape with a taper angle less than 90°. In the case where the end portions of these pixel electrodes have a tapered shape, the first layer 113 provided along the side surfaces of the pixel electrodes also have a tapered shape (corresponding to an inclined portion described later). When the side surface of the pixel electrode has a tapered shape, coverage with the EL layer provided along the side surface of the pixel electrode can be improved. Furthermore, when the side surface of the pixel electrode has a tapered shape, a material (also referred to as dust or particles) in the fabrication step is easily removed by processing such as cleaning, which is preferable.

In FIG. 1B, an insulating layer covering an end portion of the top surface of the pixel electrode is not provided between the pixel electrode and the first layer 113. Thus, the distance between adjacent light-emitting devices can be extremely short. Accordingly, the display apparatus can have high resolution or high definition. In addition, a mask for forming the insulating layer is not needed, which leads to a reduction in manufacturing cost of the display apparatus.

Furthermore, light emitted from the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display apparatus of one embodiment of the present invention can significantly reduce the viewing angle dependence. A reduction in the viewing angle dependence leads to an increase in visibility of an image on the display apparatus. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 1500 and less than or equal to 170°. Note that the above viewing angle refers to that in both the vertical direction and the horizontal direction.

The light-emitting device of this embodiment may have either a single structure (a structure including only one light-emitting unit) or a tandem structure (a structure including a plurality of light-emitting units). The light-emitting unit includes at least one light-emitting layer.

The first layer 113 includes at least a light-emitting layer. In addition, the first layer 113 may include one or more of a hole-injection layer, a hole-transport layer, a hole-blocking layer, a charge-generation layer, an electron-blocking layer, an electron-transport layer, and an electron-injection layer.

For example, the first layer 113 can contain a light-emitting material emitting blue light and a light-emitting material emitting visible light with a longer wavelength than blue light. For example, a structure containing a light-emitting material emitting blue light and a light-emitting material emitting yellow light, or a structure containing a light-emitting material emitting blue light, a light-emitting material emitting green light, and a light-emitting material emitting red light can be used for the first layer 113.

As the light-emitting devices 130*a*, 130*b*, and 130*c*, for example, a single-structure light-emitting device including two light-emitting layers, which are a light-emitting layer emitting yellow (Y) light and a light-emitting layer emitting blue (B) light, or a single-structure light-emitting device including three light-emitting layers, which are a light-emitting layer emitting red (R) light, a light-emitting layer emitting green (G) light, and a light-emitting layer emitting blue light, can be used. As examples of the number of stacked light-emitting layers and the order of colors thereof, a three-layer structure of R, G, and B and a three-layer structure of R, B, and G from the anode side can be given. Another layer (also referred to as a buffer layer) may be provided between two light-emitting layers. The buffer layer can be formed using a material that can be used for the hole-transport layer or the electron-transport layer, for example.

In the case where a light-emitting device with a tandem structure is used, examples of applicable structures are as follows: a two-unit tandem structure including a light-emitting unit that emits yellow light and a light-emitting unit that emits blue light; a two-unit tandem structure including a light-emitting unit that emits red light and green light and a light-emitting unit that emits blue light; and a three-unit tandem structure in which a light-emitting unit that emits blue light, a light-emitting unit that emits yellow, yellow-green, or green light and red light, and a light-emitting unit that emits blue light are stacked in this order. Examples of the number of stacked units and the order of colors from an anode side include a two-unit structure of B and Y; a two-unit structure of B and X; a three-unit structure of B, Y, and B; and a three-unit structure of B, X, and B. Examples of the number of light-emitting layers stacked in the light-emitting unit X and the order of colors from the anode side include a two-layer structure of R and Y; a two-layer structure of R and G; a two-layer structure of G and R; a three-layer structure of G, R, and G; and a three-layer structure of R, G, and R. Another layer may be provided between two light-emitting layers.

In the case where the light-emitting device with a tandem structure is used, the first layer 113 includes a plurality of light-emitting units. A charge-generation layer is preferably provided between the light-emitting units.

The light-emitting unit includes at least one light-emitting layer. For example, when emission colors of the plurality of light-emitting units are complementary to each other, the light-emitting device can emit white light. The light-emitting unit may include one or more of a hole-injection layer, a hole-transport layer, a hole-blocking layer, an electron-blocking layer, an electron-transport layer, and an electron-injection layer.

In the case where the light-emitting device configured to emit white light has a microcavity structure, light of a specific wavelength such as red, green, blue, or infrared light is sometimes intensified and emitted.

For example, the first layer 113 may include a hole-injection layer, a hole-transport layer, a light-emitting layer, and an electron-transport layer in this order. In addition, an electron-blocking layer may be provided between the hole-transport layer and the light-emitting layer. Furthermore, an electron-injection layer may be provided over the electron-transport layer.

Alternatively, the first layer 113 may include an electron-injection layer, an electron-transport layer, a light-emitting layer, and a hole-transport layer in this order, for example. In addition, a hole-blocking layer may be provided between the electron-transport layer and the light-emitting layer. Furthermore, a hole-injection layer may be provided over the hole-transport layer.

The first layer 113 preferably includes a light-emitting layer and a carrier-transport layer (an electron-transport layer or a hole-transport layer) over the light-emitting layer. Since the surface of the first layer 113 is exposed in the fabrication process of the display apparatus, providing the carrier-transport layer over the light-emitting layer inhibits the light-emitting layer from being exposed on the outermost surface, thereby reducing damage to the light-emitting layer. Thus, the reliability of the light-emitting device can be increased.

The first layer 113 includes a first light-emitting unit, a charge-generation layer, and a second light-emitting unit stacked in this order over the pixel electrode, for example.

The second light-emitting unit preferably includes a light-emitting layer and a carrier-transport layer (an electron-transport layer or a hole-transport layer) over the light-emitting layer. Since the surface of the second light-emitting unit is exposed in the fabrication process of the display apparatus, providing the carrier-transport layer over the light-emitting layer inhibits the light-emitting layer from being exposed on the outermost surface, thereby reducing damage to the light-emitting layer. Thus, the reliability of the light-emitting device can be increased. Note that in the case where three or more light-emitting units are provided, the uppermost light-emitting unit preferably includes a light-emitting layer and a carrier-transport layer (an electron-transport layer or a hole-transport layer) over the light-emitting layer.

The common layer 114 includes an electron-injection layer or a hole-injection layer, for example. Alternatively, the common layer 114 may include a stack of an electron-transport layer and an electron-injection layer, and may include a stack of a hole-transport layer and a hole-injection layer. The common layer 114 is shared by the light-emitting devices 130*a*, 130*b*, and 130*c*.

FIG. 1B illustrates an example where the end portion of the first layer 113 is positioned outward from the end portion of the pixel electrode. In FIG. 1B, the first layer 113 is formed to cover the end portion of the pixel electrode. Such a structure enables the entire top surface of the pixel electrode to be a light-emitting region, and the aperture ratio can be easily increased as compared with the structure where the end portion of the island-shaped EL layer is positioned inward from the end portion of the pixel electrode.

Covering the side surface of the pixel electrode with the EL layer inhibits contact between the pixel electrode and the common electrode 115, thereby inhibiting a short circuit of the light-emitting device. Furthermore, the distance between the light-emitting region (i.e., the region overlapping with the pixel electrode) in the EL layer and the end portion of the EL layer can be increased. Since the end portion of the EL layer might be damaged by processing, the use of a region away from the end portion of the EL layer as a light-emitting region can improve the reliability of the light-emitting device in some cases.

The common electrode 115 is shared by the light-emitting devices 130*a*, 130*b*, and 130*c*. The common electrode 115 used in common to the plurality of light-emitting devices is electrically connected to a conductive layer 123 provided in the connection portion 140 (see FIG. 10A and FIG. 10B). As the conductive layer 123, a conductive layer formed using the same material in the same step as the pixel electrodes 111*a*, 111*b*, and 111*c* is preferably used.

Note that FIG. 10A illustrates an example where the common layer 114 is provided over the conductive layer 123 and the conductive layer 123 and the common electrode 115 are electrically connected to each other through the common layer 114. The common layer 114 is not necessarily provided in the connection portion 140. In FIG. 10B, the conductive layer 123 and the common electrode 115 are directly connected to each other. For example, by using a mask for specifying a film formation area (also referred to as an area mask, a rough metal mask, or the like to be distinguished from a fine metal mask), the common layer 114 and the common electrode 115 can be formed in different regions.

In FIG. 1B, the mask layer 118*a* is positioned over the first layer 113 included in the light-emitting device. The mask layer 118*a* is a remaining part of a mask layer provided in contact with the top surface of the first layer 113 at the time of processing the first layer 113. Thus, the mask layer used to protect the EL layer in fabrication of the display apparatus may partly remain in the display apparatus of one embodiment of the present invention.

In FIG. 1B, one end portion of the mask layer 118*a* is aligned or substantially aligned with the end portion of the first layer 113, and the other end portion of the mask layer 118*a* is positioned over the first layer 113. Here, the other end portion of the mask layer 118*a* preferably overlaps with the first layer 113 and the pixel electrode. In this case, the other end portion of the mask layer 118*a* is easily formed over a flat or substantially flat surface of the first layer 113. The mask layer 118*a* remains between the top surface of the EL layer processed into an island shape (the first layer 113) and the insulating layer 125. The mask layer will be described in detail in Embodiment 2.

In the case where end portions are aligned or substantially aligned with each other and the case where top surface shapes are the same or substantially the same, it can be said that outlines of stacked layers at least partly overlap with each other in a top view. For example, the case of processing the upper layer and the lower layer with the use of the same mask pattern or mask patterns that are partly the same is included. However, in some cases, the outlines do not completely overlap with each other and the upper layer is positioned inward rom the lower layer or the upper layer is positioned outward from the lower layer; such a case is also represented by the expression "end portions are substantially aligned with each other" or "top surface shapes are substantially the same".

The side surface of the first layer 113 is covered with the insulating layer 125. The insulating layer 127 overlaps with (covers) the side surface of the first layer 113 with the insulating layer 125 therebetween.

The top surface of first layer 113 is partly covered with the mask layer 118*a*. The insulating layer 125 and the insulating layer 127 overlap with part of the top surface of the first layer 113 with the mask layer 118*a* therebetween. Note that the top surface of the first layer 113 is not limited to the top surface of a flat portion overlapping with the top surface of the pixel electrode, and can include the top surfaces of the inclined portion and the flat portion (see a region 103 in FIG. 6A) which are positioned outward from the top surface of the pixel electrode.

The side surface and part of the top surface of the first layer 113 are covered with at least one of the insulating layer 125, the insulating layer 127, and the mask layer 118*a*, so that the common layer 114 (or the common electrode 115) can be inhibited from being in contact with the side surfaces of the pixel electrodes 111*a*, 111*b*, and 111*c* and the first layer 113, leading to inhibition of a short circuit of the light-emitting device. Thus, the reliability of the light-emitting device can be increased.

The insulating layer 125 is preferably in contact with the side surface of the first layer 113 (see a portion surrounded by a dashed line in the end portion of the first layer 113 and the vicinity thereof illustrated in FIG. 2A). The insulating layer 125 in contact with the first layer 113 can prevent peeling of the first layer 113. Close contact between the insulating layer 125 and the first layer 113 has an effect of fixing or bonding adjacent first layers 113 by the insulating layer 125. Thus, the reliability of the light-emitting device can be increased. The manufacturing yield of the light-emitting device can be increased.

As illustrated in FIG. 1B, the insulating layer 125 and the insulating layer 127 cover both the side surface and part of the top surface of the first layer 113, whereby peeling of the EL layer can be further prevented and the reliability of the light-emitting device can be increased. In addition, the manufacturing yield of the light-emitting devices can be further increased.

FIG. 1B illustrates an example where the stacked-layer structure of the first layer 113, the mask layer 118*a*, the insulating layer 125, and the insulating layer 127 is positioned over an end portion of the pixel electrode 111*a*, an end portion of the pixel electrode 111*b*, and an end portion of the pixel electrode 111*c*.

FIG. 1B illustrates a structure where the end portions of the pixel electrodes 111*a*, 111 *b*, and 111*c* are each covered with the first layer 113 and the insulating layer 125 is in contact with the side surface of the first layer 113.

The insulating layer 127 is provided over the insulating layer 125 to fill a depressed portion of the insulating layer 125. The insulating layer 127 can be configured to overlap with at least the side surface and part of the top surface of the first layer 113 with the insulating layer 125 therebetween. The insulating layer 127 preferably covers at least part of the side surface of the insulating layer 125.

Providing the insulating layer 125 and the insulating layer 127 makes it possible to fill a gap between adjacent island-shaped layers, whereby the formation surface of a layer (e.g., a carrier-injection layer and a common electrode) provided over the island-shaped layers can have less unevenness with a big level difference and can be flatter. Consequently, the coverage with the carrier-injection layer, the common electrode, and the like can be increased.

The common layer 114 and the common electrode 115 are provided over the first layer 113, the mask layer 118*a*, the insulating layer 125, and the insulating layer 127. At the stage before the insulating layer 125 and the insulating layer 127 are provided, a level difference due to a region where the pixel electrode and the island-shaped EL layer are provided and a region where the pixel electrode and the island-shaped EL layer are not provided (a region between the light-emitting devices) is caused. In the display apparatus of one embodiment of the present invention, the level difference can be planarized with the insulating layer 125 and the insulating layer 127, and the coverage with the common layer 114 and the common electrode 115 can be improved. Consequently, it is possible to inhibit a connection defect due to step disconnection. Alternatively, an increase in electrical resistance caused by local thinning of the common electrode 115 due to level difference can be inhibited.

The top surface of the insulating layer 127 preferably has a shape with higher flatness; however, it may include a projecting portion, a convex surface, a concave surface, or a depressed portion. For example, the top surface of the insulating layer 127 preferably has a smooth convex shape with high flatness.

Next, examples of materials of the insulating layer 125 and the insulating layer 127 are described.

The insulating layer 125 can be formed using an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer when the insulating layer 127 to be described later is formed. In particular, when an inorganic insulating film such as an aluminum oxide film, a hafnium oxide film, or a silicon oxide film that is formed by an atomic layer deposition (ALD) method is employed for the insulating layer 125, it is possible to form the insulating layer 125 that has few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen.

Note that in this specification and the like, a barrier insulating layer refers to an insulating layer having a barrier property.

A barrier property in this specification and the like refers to a function of inhibiting diffusion of a particular substance (also referred to as having low permeability). Alternatively, a barrier property refers to a function of capturing or fixing (also referred to as gettering) a particular substance.

When the insulating layer 125 has a function of a barrier insulating layer or a gettering function, entry of impurities (typically, at least one of water and oxygen) that might diffuse into the light-emitting devices from the outside can be inhibited. With this structure, a highly reliable light-emitting device and a highly reliable display apparatus can be provided.

The insulating layer 125 preferably has a low impurity concentration. In this case, deterioration of the EL layer due to entry of impurities from the insulating layer 125 into the EL layer can be inhibited. In addition, when the impurity concentration is reduced in the insulating layer 125, a barrier property against at least one of water and oxygen can be increased. For example, the insulating layer 125 preferably has one of a sufficiently low hydrogen concentration and a sufficiently low carbon concentration, desirably has both of them.

Note that the insulating layer 125 and the mask layer 118*a* can be formed using the same material. In this case, the boundary between the mask layer 118*a* and the insulating layer 125 is unclear and thus the layers cannot be distinguished from each other in some cases. Thus, the mask layer 118*a* and the insulating layer 125 are observed as one layer in some cases. In other words, it sometimes appears that one layer is provided in contact with the side surface and part of the top surface of the first layer 113, and the insulating layer 127 covers at least part of the side surface of the one layer.

The insulating layer 127 provided over the insulating layer 125 has a planarization function for unevenness with a big level difference on the insulating layer 125, which is formed between adjacent light-emitting devices. In other words, the insulating layer 127 has an effect of improving the flatness of the formation surface of the common electrode 115.

As the insulating layer 127, an insulating layer containing an organic material can be suitably used. As the organic material, a photosensitive organic resin is preferably used, and for example, a photosensitive acrylic resin is preferably used. Note that in this specification and the like, an acrylic resin refers to not only a polymethacrylic acid ester or a methacrylic resin, but also all the acrylic polymer in a broad sense in some cases.

For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like may be used, for example. Examples of organic materials used for the insulating layer 127 include polyvinyl alcohol (PVA), polyvinyl butyral, polyvinyl pyrrolidone, polyethylene glycol, polyglycerin, pullulan, water-soluble cellulose, and an alcohol-soluble polyamide resin. A photoresist may be used as the photosensitive resin. As the photosensitive organic resin, either a positive material or a negative material may be used.

The insulating layer 127 may be formed using a material absorbing visible light. When the insulating layer 127 absorbs light from the light-emitting device, leakage of light (stray light) from the light-emitting device to the adjacent light-emitting device through the insulating layer 127 can be inhibited. Thus, the display quality of the display apparatus can be improved. Since the display quality of the display apparatus can be improved without using a polarizing plate in the display apparatus, the weight and thickness of the display apparatus can be reduced.

Examples of the material absorbing visible light include a material containing a pigment of black or the like, a material containing a dye, a resin material with a light-absorbing property (e.g., polyimide), and a resin material that can be used for a color filter (a color filter material). Using a resin material obtained by stacking or mixing color filter materials of two or three or more colors is particularly preferable to enhance the effect of blocking visible light. In particular, mixing color filter materials of three or more colors makes it possible to form a black or nearly black resin layer.

Next, a structure of the insulating layer 127 and the vicinity thereof will be described with reference to FIG. 2A and FIG. 2B. FIG. 2A is an enlarged cross-sectional view of a region including the insulating layer 127 between the light-emitting device 130*a* and the light-emitting device 130*b* and the vicinity of the insulating layer 127. Although the insulating layer 127 between the light-emitting device 130*a* and the light-emitting device 130*b* is described below as an example, the same applies to the insulating layer 127 between the light-emitting device 130*b* and the light-emitting device 130*c*, the insulating layer 127 between the light-emitting device 130*c* and the light-emitting device 130*a*, and the like. FIG. 2B is an enlarged view of an end portion of the insulating layer 127 over the first layer 113 included in the light-emitting device 130*b* and the vicinity thereof illustrated in FIG. 2A.

As illustrated in FIG. 2A, the first layer 113 is provided to cover the pixel electrode 111*a* and another first layer 113 is provided to cover the pixel electrode 111*b*. The mask layers 118*a* are provided in contact with parts of the top surfaces of the first layers 113, and the insulating layer 125 is provided in contact with the top surfaces and the side surfaces of the two mask layers 118*a*, the side surfaces of the two first layers 113, and the top surface of the insulating layer 255*c*. The insulating layer 125 covers parts of the top surfaces of the two first layers 113. The insulating layer 127 is provided in contact with the top surface of the insulating layer 125. The insulating layer 127 overlaps with the side surfaces and the parts of the top surfaces of the two first layers 113 with the insulating layer 125 therebetween, and is in contact with at least part of the side surface of the insulating layer 125. The common layer 114 is provided to cover the first layers 113, the mask layers 118*a*, the insulating layer 125, and the insulating layer 127, and the common electrode 115 is provided over the common layer 114.

As illustrated in FIG. 2B, the end portion of the insulating layer 127 preferably has a tapered shape with a taper angle 1 in the cross-sectional view of the display apparatus. The taper angle θ1 is an angle formed by the side surface of the insulating layer 127 and the substrate surface. Note that the taper angle θ1 is not limited to the angle with the substrate surface, and may be an angle formed by the side surface of the insulating layer 127 and the top surface of the flat portion of the first layer 113 or the top surface of the flat portion of the pixel electrode 111*b*.

The taper angle θ1 of the insulating layer 127 is less than 90°, preferably less than or equal to 60°, further preferably less than or equal to 45°, still further preferably less than or equal to 20°. When the end portion of the insulating layer 127 has such a forward tapered shape, the common layer 114 and the common electrode 115 that are provided over the insulating layer 127 can be formed with favorable coverage, thereby inhibiting step disconnection, local thinning, or the like. Consequently, the in-plane uniformity of the common layer 114 and the common electrode 115 can be increased, so that the display quality of the display apparatus can be improved.

As illustrated in FIG. 2A, in a cross-sectional view of the display apparatus, the top surface of the insulating layer 127 preferably has a convex shape. The convex shape of the top surface of the insulating layer 127 is preferably a shape gently bulging toward the center. The convex portion at the center of the top surface of the insulating layer 127 preferably has a shape connected smoothly to the tapered portion of the end portion. When the insulating layer 127 has such a shape, the common layer 114 and the common electrode 115 can be formed with favorable coverage over the whole the insulating layer 127.

As illustrated in FIG. 2B, the end portion of the insulating layer 127 is preferably positioned outward from the end portion of the insulating layer 125. In that case, unevenness of the formation surface of the common layer 114 and the common electrode 115 is reduced, and coverage with the common layer 114 and the common electrode 115 can be improved.

As illustrated in FIG. 2B, the end portion of the insulating layer 125 preferably has a tapered shape with a taper angle θ2 in the cross-sectional view of the display apparatus. The taper angle θ2 is an angle formed by the side surface of the insulating layer 125 and the substrate surface. Note that the taper angle θ2 is not limited to the angle with the substrate surface, and may be an angle formed by the side surface of the insulating layer 125 and the top surface of the flat portion of first layer 113 or the top surface of the flat portion of the pixel electrode 111*b*.

The taper angle θ2 of the insulating layer 125 is less than 90°, preferably less than or equal to 60°, further preferably less than or equal to 45°, still further preferably less than or equal to 20°.

As illustrated in FIG. 2B, the end portion of the mask layer 118*a* preferably has a tapered shape with a taper angle θ3 in the cross-sectional view of the display apparatus. The taper angle θ3 is an angle formed by the side surface of the mask layer 118*a* and the substrate surface. Note that the taper angle θ3 is not limited to the angle with the substrate surface, and may be an angle formed by the side surface of the insulating layer 127 and the top surface of the flat portion of the first layer 113 or the top surface of the flat portion of the pixel electrode 111*b*.

The taper angle θ3 of the mask layer 118*a* is less than 90°, preferably less than or equal to 60°, further preferably less than or equal to 45°, still further preferably less than or equal to 20°. When the mask layer 118*a* has such a forward tapered shape, the common layer 114 and the common electrode 115 that are provided over the mask layer 118*a* can be formed with favorable coverage.

The end portion of the mask layer 118*a* is preferably positioned outward from the end portion of the insulating layer 125. In that case, unevenness of the formation surface of the common layer 114 and the common electrode 115 is reduced, and coverage with the common layer 114 and the common electrode 115 can be improved.

Although the details will be described in Fabrication method example 1 of display apparatus in Embodiment 2, when the insulating layer 125 and the mask layer 118*a* are collectively etched, the insulating layer 125 and the mask layer below the end portion of the insulating layer 127 are eliminated by side etching and accordingly a cavity (also referred to as a hole) is formed in some cases. The cavity causes unevenness in the formation surface of the common layer 114 and the common electrode 115, so that step disconnection is likely to occur in the common layer 114 and the common electrode 115. Thus, the etching treatment is performed in two separate steps with heat treatment performed between the two etching steps, whereby even when a cavity is formed by the first etching treatment, the cavity can be filled with the insulating layer 127 deformed by the heat treatment. Since the second etching treatment is for etching a thinner film, the amount of side etching decreases, a cavity is less likely to be formed, and even if a cavity is formed, it can be extremely small. Thus, generation of unevenness in the formation surface of the common layer 114 and the common electrode 115 can be inhibited and accordingly step disconnection of the common layer 114 and the common electrode 115 can be inhibited. Since the etching treatment is performed twice in this manner, the taper angle θ2 and the taper angle θ3 are different from each other in some cases. Furthermore, the taper angle θ2 and the taper angle θ3 may each be smaller than the taper angle θ1.

The insulating layer 127 may cover at least part of the side surface of the mask layer 118*a*. For example, FIG. 2B illustrates an example where the insulating layer 127 covers to be in contact with an inclined surface (an upper inclined surface) positioned at an end portion of the mask layer 118*a* which is formed by the first etching treatment, and an inclined surface (a lower incline surface) positioned at an end portion of the mask layer 118*a* which is formed by the second etching treatment is exposed. These two inclined surfaces can sometimes be distinguished from each other because of different taper angles. There might be almost no difference between the taper angles formed at the side surfaces by the two etching steps; in this case, the inclined surfaces cannot be distinguished from each other.

Figure 3A:
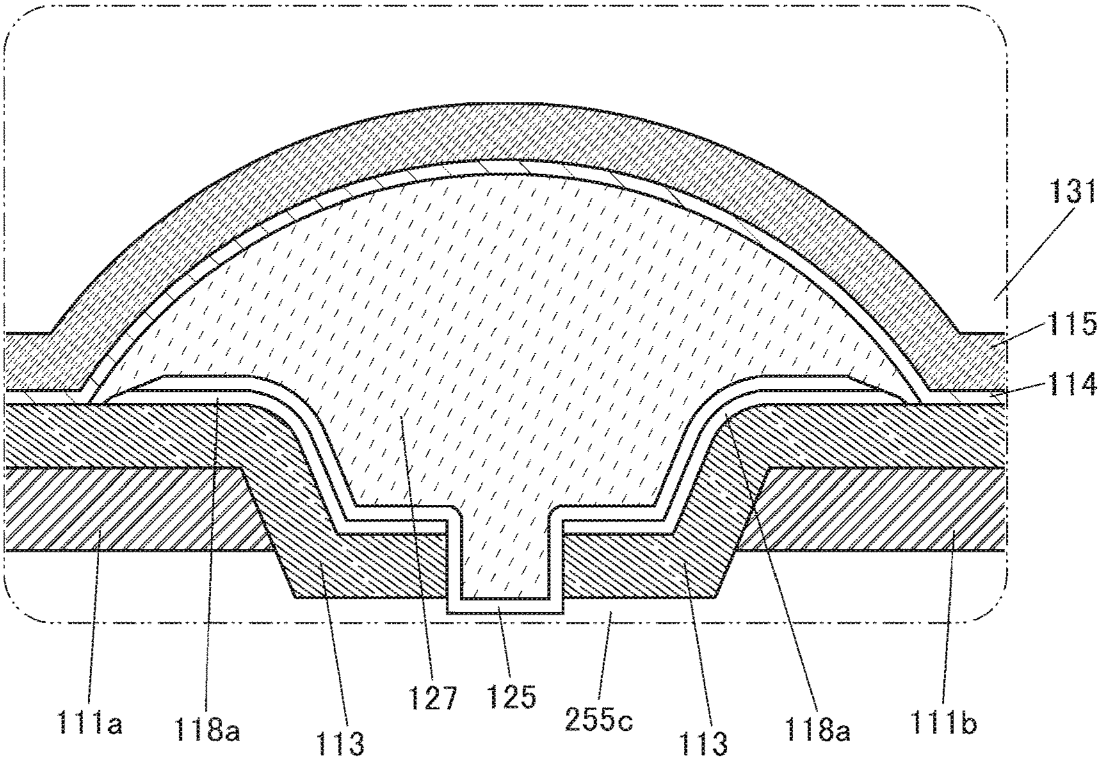
FIG. 3A and FIG. 3B are cross-sectional views illustrating examples of a display apparatus.
Figure 3B:
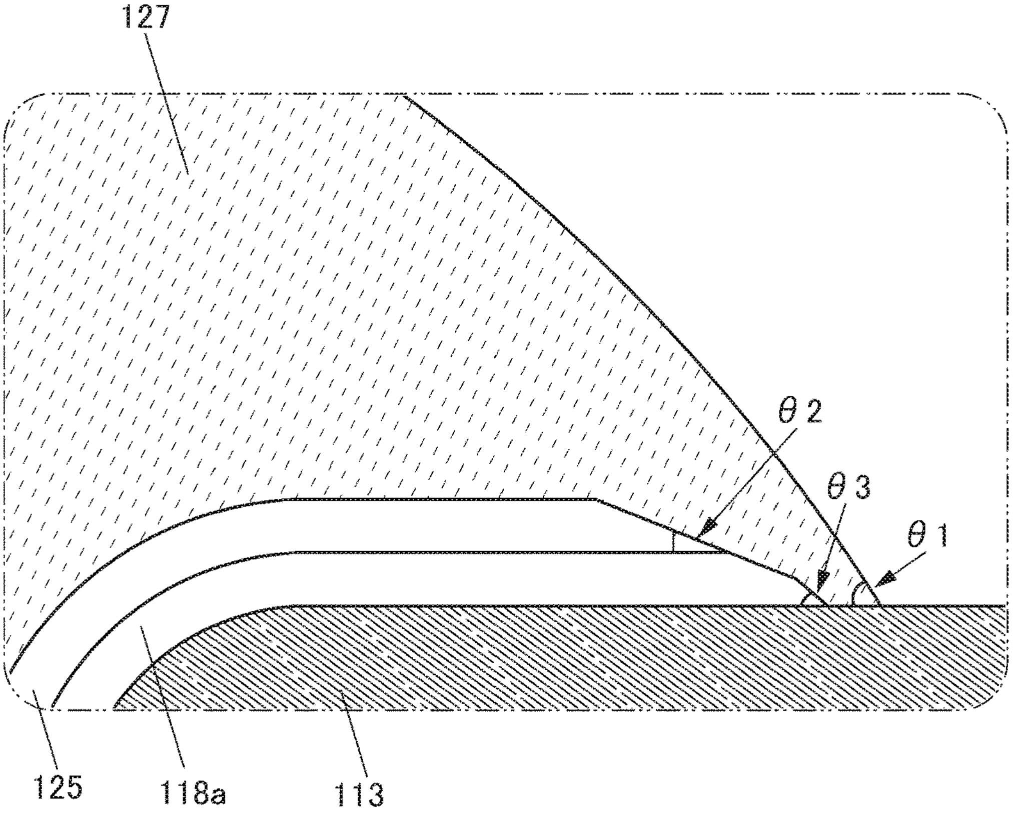

FIG. 3A and FIG. 3B illustrate an example where the insulating layer 127 covers the entire side surface of the mask layer 118*a*. Specifically, in FIG. 3B, the insulating layer 127 covers to be in contact with both of the two inclined surfaces. This is preferable because unevenness of the formation surface of the common layer 114 and the common electrode 115 can be further reduced. FIG. 3B illustrates an example where the end portion of the insulating layer 127 is positioned outward from the end portion of the mask layer 118*a*. As illustrated in FIG. 2B, the end portion of the insulating layer 127 may be positioned inward from the end portion of the mask layer 118*a*, or may be aligned or substantially aligned with the end portion of the mask layer 118*a*. As illustrated in FIG. 3B, the insulating layer 127 is in contact with the first layer 113 in some cases.

FIG. 4A, FIG. 4B, FIG. 5A, and FIG. 5B illustrate examples where the side surface of the insulating layer 127 has a concave shape (also referred to as a narrowed portion, a depressed portion, a dent, a hollow, or the like). Depending on the materials and the formation conditions (e.g., heating temperature, heating time, and heating atmosphere) of the insulating layer 127, a concave shape is formed in the side surface of the insulating layer 127 in some cases.

Figure 4A:
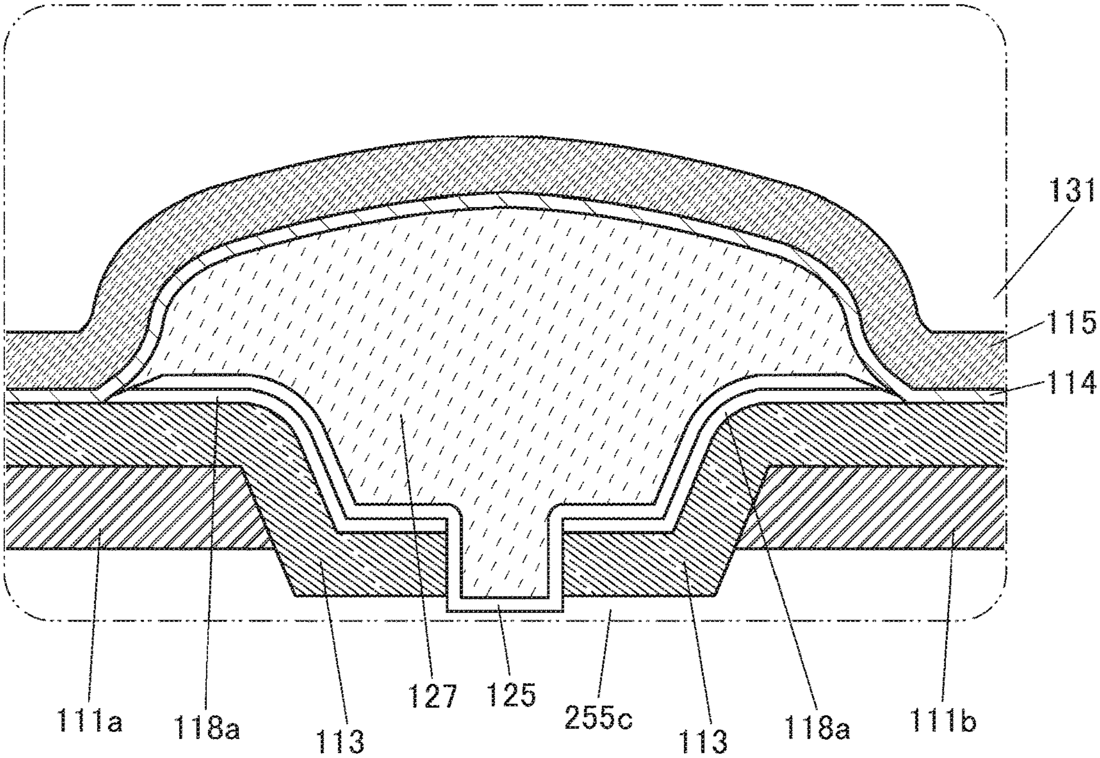
FIG. 4A and FIG. 4B are cross-sectional views illustrating an example of a display apparatus.
Figure 4B:
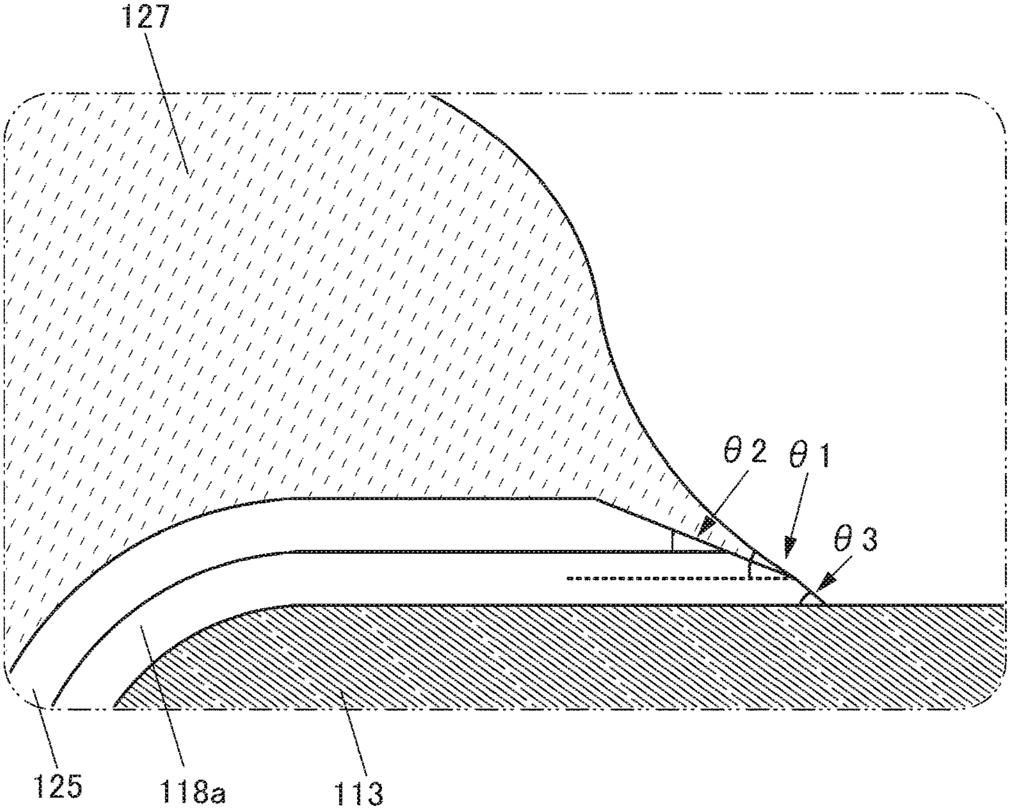
Figure 5A:
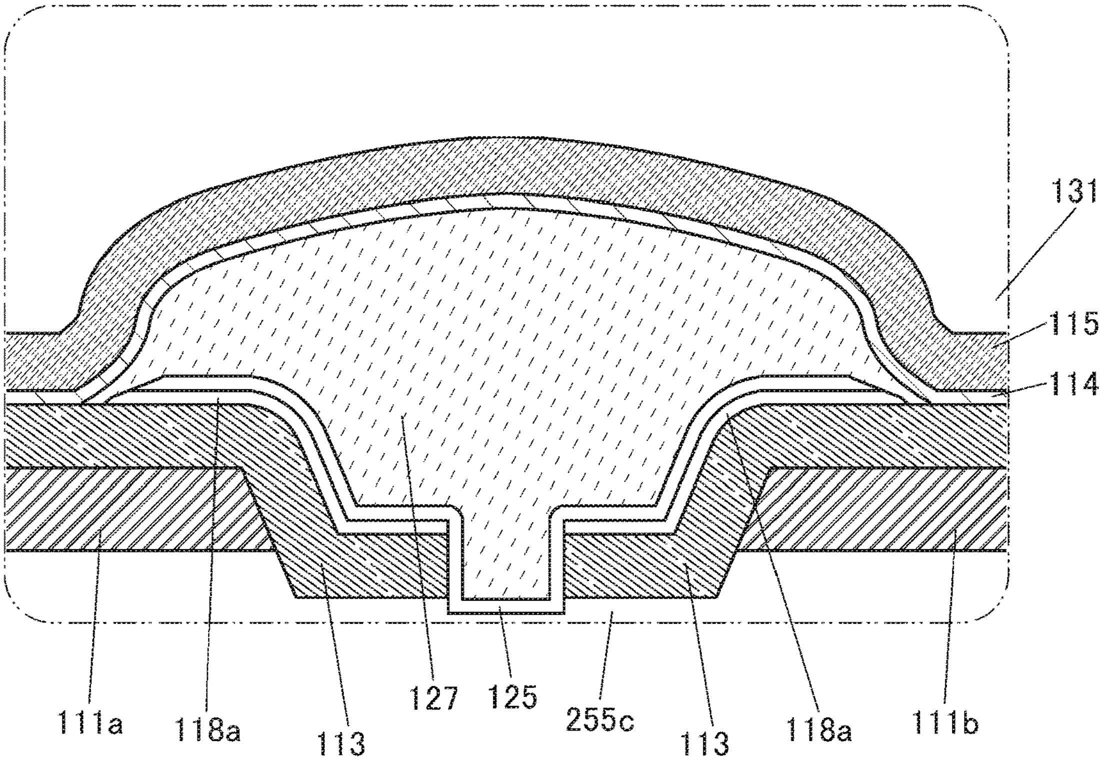
FIG. 5A and FIG. 5B are cross-sectional views illustrating an example of a display apparatus.
Figure 5B:
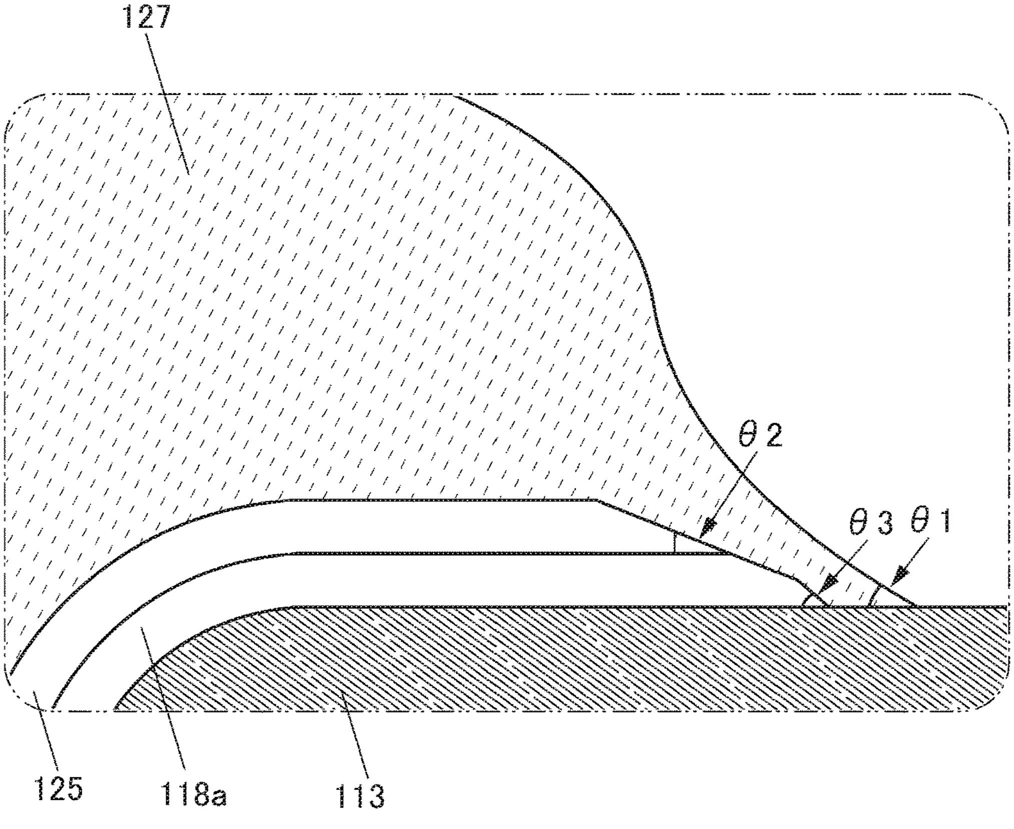

FIG. 4A and FIG. 4B illustrate an example where the insulating layer 127 covers part of the side surface of the mask layer 118*a* and the other part of the side surface of the mask layer 118*a* is exposed. FIG. 5A and FIG. 5B illustrate an example where the insulating layer 127 covers to be in contact with the entire side surface of the mask layer 118*a*.

The taper angle θ1 to the taper angle θ3 in FIG. 3 to FIG. 5 are also preferably within the above range.

As illustrated in FIG. 2 to FIG. 5, it is preferable that one end portion of the insulating layer 127 overlap with the top surface of the pixel electrode 111*a* and the other end portion of the insulating layer 127 overlap with the top surface of the pixel electrode 111*b*. With such a structure, the end portion of the insulating layer 127 can be formed over a flat or substantially flat region of the first layer 113. This makes it relatively easy to form a tapered shape in each of the insulating layer 127, the insulating layer 125, and the mask layer 118*a*. In addition, peeling of the pixel electrodes 111*a* and 111*b* and the first layer 113 can be inhibited. Meanwhile, a portion where the top surface of the pixel electrode and the insulating layer 127 overlap with each other is preferably smaller because the light-emitting region of the light-emitting device can be wider and the aperture ratio can be higher.

Figure 6A:
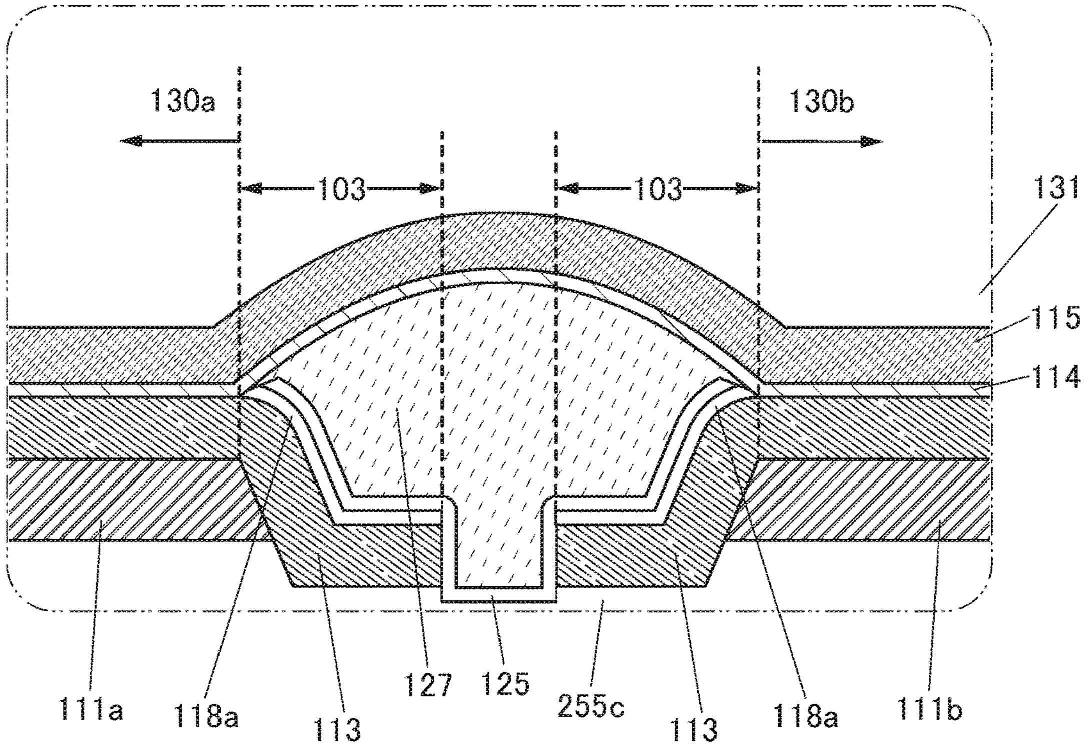
FIG. 6A and FIG. 6B are cross-sectional views illustrating examples of a display apparatus.
Figure 6B:
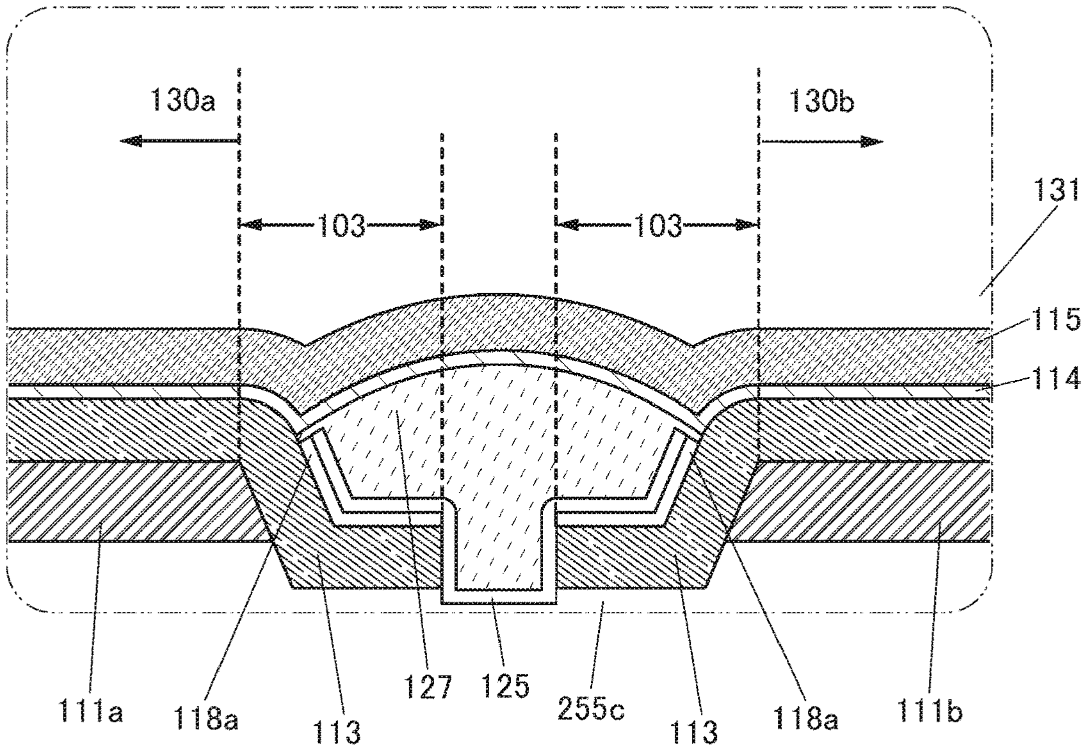

Note that the insulating layer 127 does not necessarily overlap with the top surface of the pixel electrode. As illustrated in FIG. 6A, the insulating layer 127 does not necessarily overlap with the top surface of the pixel electrode, and one end portion of the insulating layer 127 may overlap with the side surface of the pixel electrode 111*a* and the other end portion of the insulating layer 127 may overlap with the side surface of the pixel electrode 111*b*. As illustrated in FIG. 6B, the insulating layer 127 does not necessarily overlap with the pixel electrode, and may be provided in a region interposed between the pixel electrode 111*a* and the pixel electrode 111*b*. In FIG. 6A and FIG. 6B, out of the top surface of the first layer 113, the top surface of the inclined portion and the flat portion (the region 103) positioned on the outside of the top surface of the pixel electrode is partly or entirely covered with the mask layer 118*a*, the insulating layer 125, and the insulating layer 127. Even such a structure can reduce unevenness of the formation surface of the common layer 114 and the common electrode 115 and improve the coverage with the common layer 114 and the common electrode 115, as compared with the structure where the mask layer 118*a*, the insulating layer 125, and the insulating layer 127 are not provided.

Figure 7A:
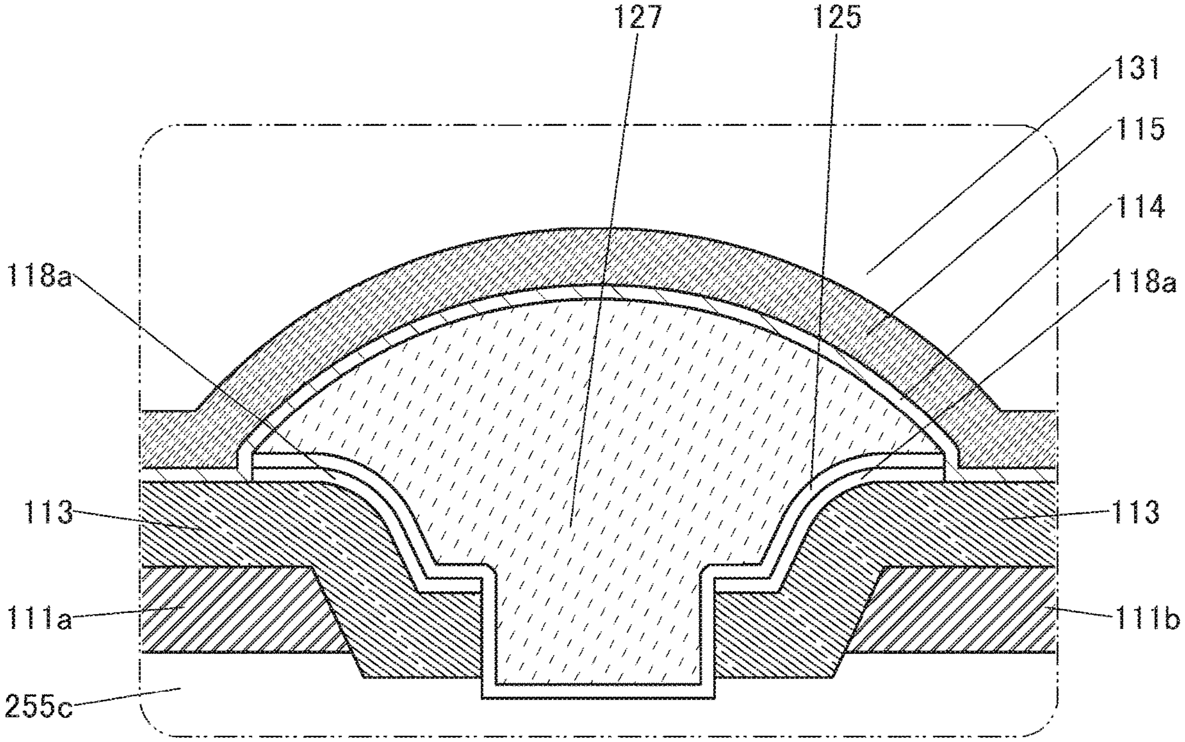
FIG. 7A and FIG. 7B are cross-sectional views illustrating an example of a display apparatus.
Figure 7B:
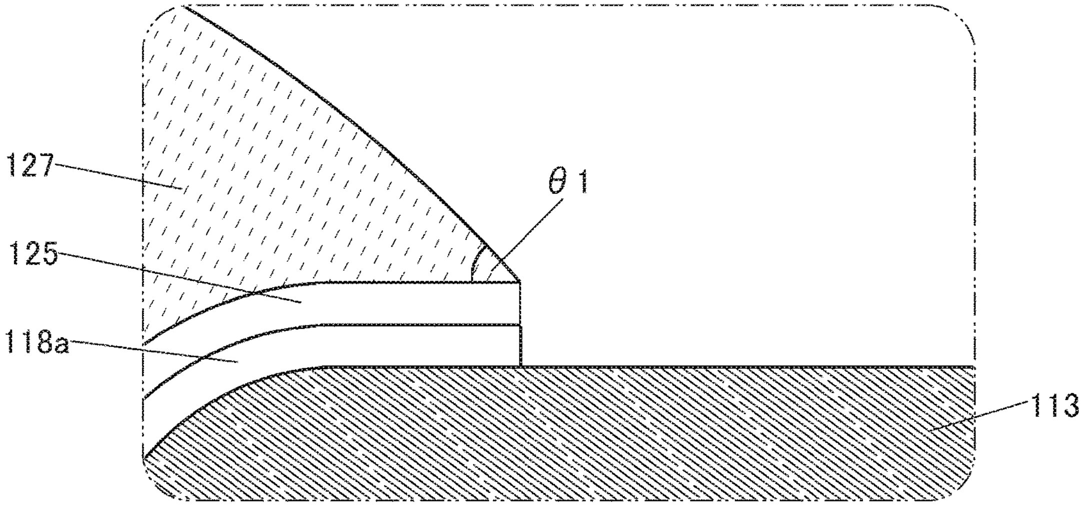

Next, FIG. 7A and FIG. 7B illustrate a variation example of the structure illustrated in FIG. 2A and FIG. 2B.

Like the insulating layer 127 illustrated in FIG. 2A and FIG. 2B, the insulating layer 127 illustrated in FIG. 7A and FIG. 7B has a taper-shaped end portion with the taper angle θ1. When the end portion of the insulating layer 127 has such a forward tapered shape, the common layer 114 and the common electrode 115 that are provided over the insulating layer 127 can be formed with favorable coverage, thereby inhibiting step disconnection, local thinning, or the like. Consequently, the in-plane uniformity of the common layer 114 and the common electrode 115 can be increased, so that the display quality of the display apparatus can be improved.

The structure in FIG. 7A and FIG. 7B is different from that illustrated in FIG. 2A and FIG. 2B in that the side surfaces of the mask layer 118*a* and the insulating layer 125 are perpendicular to the substrate surface and the insulating layer 127 does not cover the side surfaces of the mask layer 118*a* and the insulating layer 125. Such a structure is also one embodiment of the present invention.

Figure 8A:
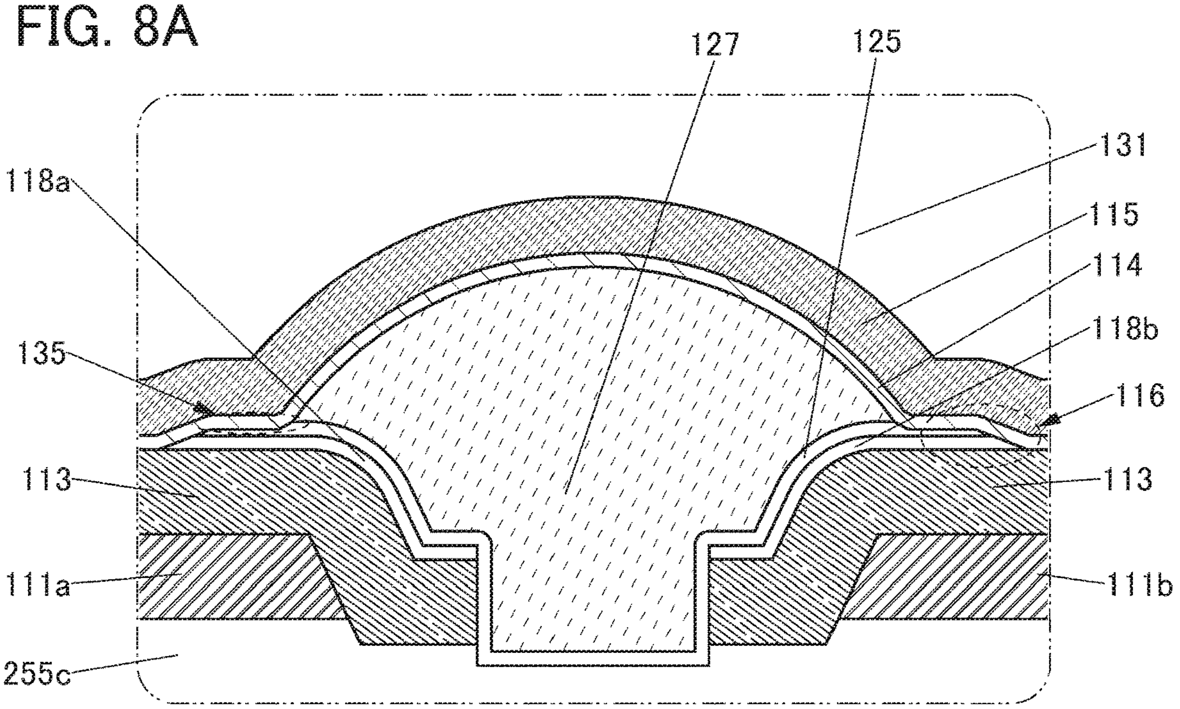
FIG. 8A to FIG. 8C are cross-sectional views illustrating examples of a display apparatus.
Figure 8B:
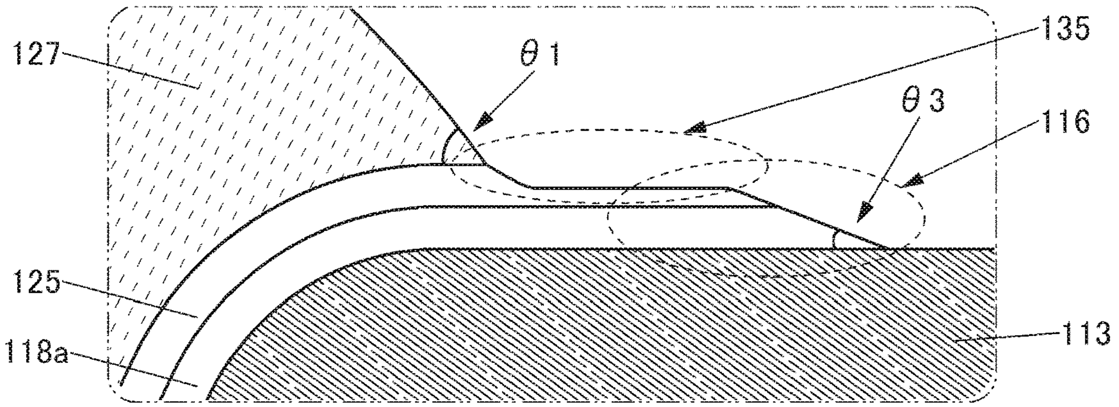

Next, FIG. 8A and FIG. 8B illustrate a variation example of the structure illustrated in FIG. 2A and FIG. 2B.

Like the insulating layer 127 illustrated in FIG. 2A and FIG. 2B, the insulating layer 127 illustrated in FIG. 8A and FIG. 8B has a taper-shaped end portion with the taper angle θ1. When the end portion of the insulating layer 127 has such a forward tapered shape, the common layer 114 and the common electrode 115 that are provided over the insulating layer 127 can be formed with favorable coverage, thereby inhibiting step disconnection, local thinning, or the like. Consequently, the in-plane uniformity of the common layer 114 and the common electrode 115 can be increased, so that the display quality of the display apparatus can be improved.

The structure in FIG. 8A and FIG. 8B is different from that illustrated in FIG. 2A and FIG. 2B in that the mask layer 118*a* and the insulating layer 125 include a protruding portion 116 and the insulating layer 127 does not cover the side surfaces of the mask layer 118*a* and the insulating layer 125. Such a structure is also one embodiment of the present invention.

The protruding portion 116 is positioned outside an end portion of the insulating layer 127.

An end portion of the protruding portion 116 preferably has a tapered shape with a taper angle θ3. The taper angle θ3 is less than 90°, preferably less than or equal to 60°, further preferably less than or equal to 45°, still further preferably less than or equal to 20°. When the protruding portion 116 has such a forward tapered shape, the common layer 114 and the common electrode 115 that are provided over the protruding portion 116 can be formed with favorable coverage.

Providing the protruding portion 116 on the outer side of the insulating layer 127 can inhibit side etching of the insulating layer 125 and formation of a cavity between the end portion of the insulating layer 127 and the insulating layer 125. When such a cavity is formed, step disconnection is likely to occur in the common layer 114 and the common electrode 115 due to a level difference caused by the cavity. However, the insulating layer 125 and the mask layer 118*a* provided to have the protruding portion 116 can inhibit side etching from proceeding deeply under the insulating layer 127 and can prevent the cavity growing to a great size. Thus, providing the protruding portion 116 can prevent step disconnection or the like from occurring in the common layer 114 and the common electrode 115 in a region from the insulating layer 127 to the first layer 113.

Figure 8C:
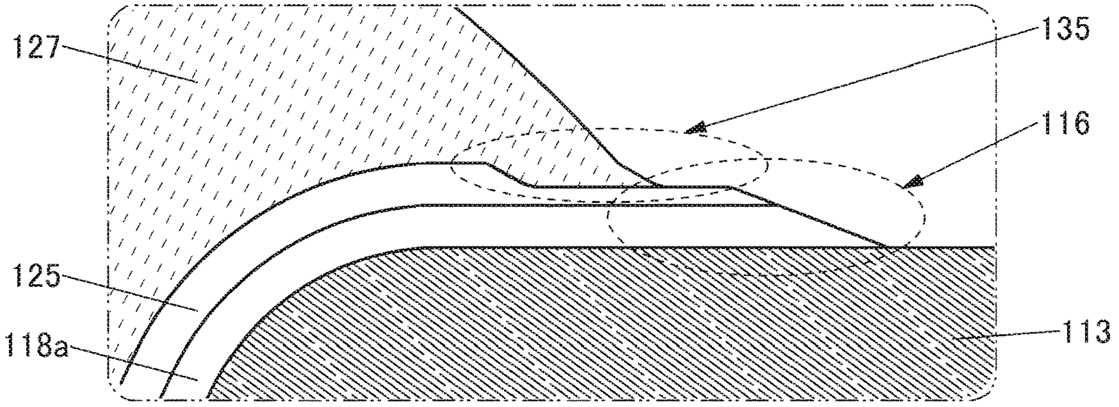

The insulating layer 125 in the protruding portion 116 sometimes includes a region (hereinafter referred to as a depression portion 135) having a smaller thickness than another portion of the insulating layer 125 (e.g., a portion overlapping with the insulating layer 127). Depending on the thickness of the insulating layer 125, for example, the insulating layer 125 in the protruding portion 116 disappears and the depression portion 135 is formed to reach the mask layer 118*a* in some cases. FIG. 8C illustrates a variation example of FIG. 8B. FIG. 8C illustrates an example in which part of the depression portion 135 overlaps with the insulating layer 127.

The taper angle θ1 to the taper angle θ3 in FIG. 7 and FIG. 8 are also preferably within the above range.

As described above, in the structures illustrated in FIG. 2 to FIG. 8, with the insulating layer 127, the insulating layer 125, and the mask layer 118*a*, the common layer 114 and common electrode 115 can be formed with favorable coverage from the flat or substantially flat region of the first layer 113 to the flat or substantially flat region of an adjacent first layer 113. It is also possible to prevent formation of a disconnected portion and a locally thinned portion in the common layer 114 and the common electrode 115. It is also possible to prevent formation of a disconnected portion and a locally thinned portion in the common layer 114 and the common electrode 115. This can inhibit the common layer 114 and the common electrode 115 between light-emitting devices from having connection defects due to the disconnected portion and an increased electric resistance due to the locally thinned portion. Accordingly, the display quality of the display apparatus of one embodiment of the present invention can be improved.

The protective layer 131 is preferably included over the light-emitting devices 130*a*, 130*b*, and 130*c*. Providing the protective layer 131 can improve the reliability of the light-emitting device. The protective layer 131 may have a single-layer structure or a stacked-layer structure of two or more layers.

There is no limitation on the conductivity of the protective layer 131. As the protective layer 131, at least one type of an insulating film, a semiconductor film, and a conductive film can be used.

The protective layer 131 including an inorganic film can inhibit deterioration of the light-emitting device by preventing oxidation of the common electrode 115 and inhibiting entry of impurities (e.g., moisture and oxygen) into the light-emitting device, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Specific examples of these inorganic films are as listed in the description of the insulating layer 125. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can employ, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) to the EL layer side.

Furthermore, the protective layer 131 may include an organic film. For example, the protective layer 131 may include both an organic film and an inorganic film. Examples of an organic material that can be used for the protective layer 131 include organic insulating materials that can be used for the insulating layer 127.

The protective layer 131 may have a stacked-layer structure of two layers which are formed by different formation methods. Specifically, the first layer of the protective layer 131 may be formed by an ALD method, and the second layer of the protective layer 131 may be formed by a sputtering method.

A light-blocking layer may be provided on a surface of the substrate 120 on the resin layer 122 side. Moreover, a variety of optical members can be provided on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 120. For example, a glass layer or a silica layer ($SiO_x$ layer) is preferably provided as the surface protective layer to inhibit the surface contamination and generation of a scratch. The surface protective layer may be formed using DLC (diamond like carbon), aluminum oxide ($AlO_x$), a polyester-based material, a polycarbonate-based material, or the like. For the surface protective layer, a material having a high visible-light-transmitting property is preferably used. The surface protective layer is preferably formed using a material with high hardness.

For the substrate 120, glass, quartz, ceramic, sapphire, a resin, a metal, an alloy, a semiconductor, or the like can be used. The substrate on the side from which light from the light-emitting device is extracted is formed using a material that transmits the light. When a flexible material is used for the substrate 120, the display apparatus can have increased flexibility and a flexible display can be achieved. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display apparatus might be changed, e.g., creases are generated. Thus, for the substrate, a film with a low water absorption rate is preferably used. For example, a film with a water absorption rate lower than or equal to 1% is preferably used, a film with a water absorption rate lower than or equal to 0.1% is further preferably used, and a film with a water absorption rate lower than or equal to 0.01% is still further preferably used.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-liquid-mixture-type resin may be used. An adhesive sheet or the like may be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A single layer or a stacked-layer structure including a film containing any of these materials can be used.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to have a light-transmitting property. Furthermore, a stacked-layer film of the above materials can be used for a conductive layer. For example, a stacked film of indium tin oxide and an alloy of silver and magnesium is preferably used for increased conductivity. They can also be used for conductive layers such as wirings and electrodes included in the display apparatus, and conductive layers (e.g., a conductive layer functioning as a pixel electrode or a counter electrode) included in a light-emitting device.

Examples of an insulating material that can be used for each insulating layer include resins such as an acrylic resin and an epoxy resin, and inorganic insulating materials such as silicon oxide, silicon oxynitride, silicon nitride oxide, silicon nitride, and aluminum oxide.

FIG. 1B illustrates an example where the coloring layers 132R, 132G, and 132B are directly provided over the light-emitting devices 130*a*, 130*b*, and 130*c* with the protective layer 131 therebetween. With such a structure, the alignment accuracy of the light-emitting devices and the coloring layers can be improved. Furthermore, the structure is preferable because the distance between the light-emitting devices and the coloring layers can be reduced, so that color mixing can be inhibited and the viewing angle characteristics can be improved.

Figure 9A:
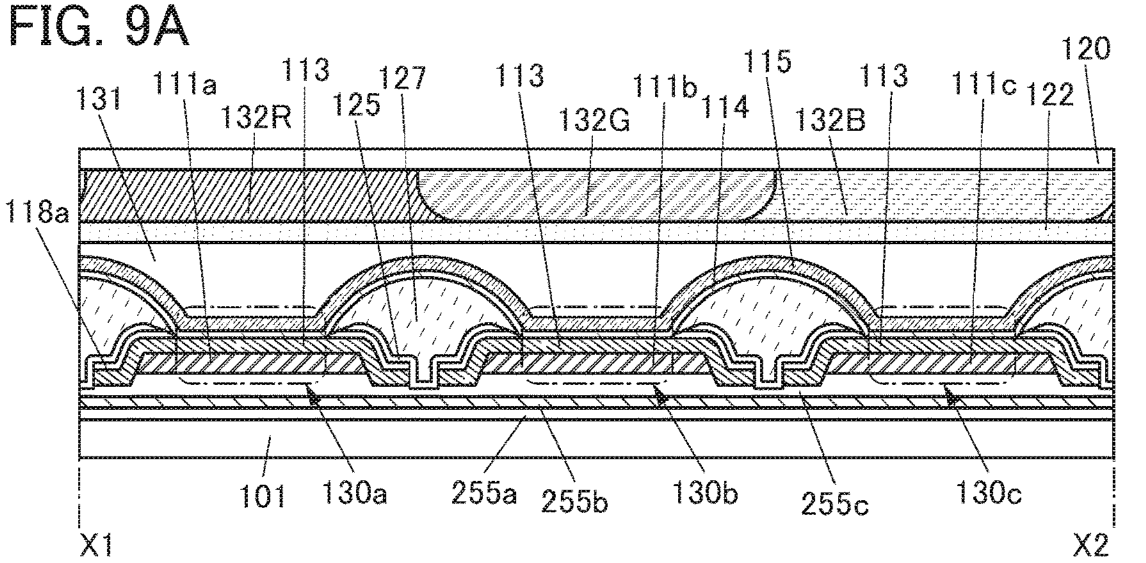
FIG. 9A to FIG. 9C are cross-sectional views illustrating examples of a display apparatus.
Figure 9B:
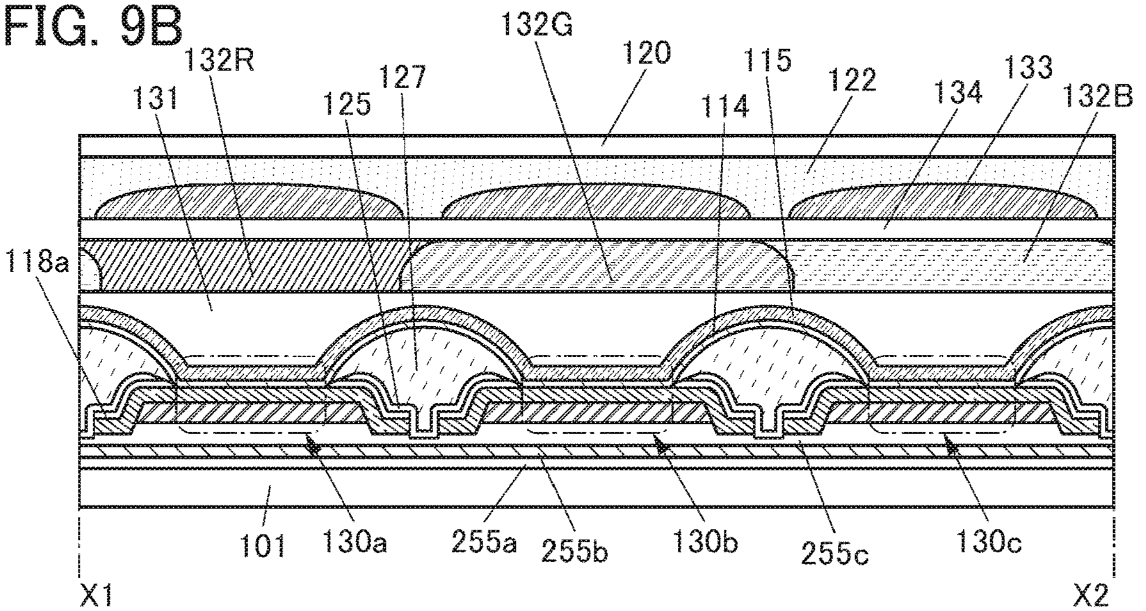
Figure 9C:
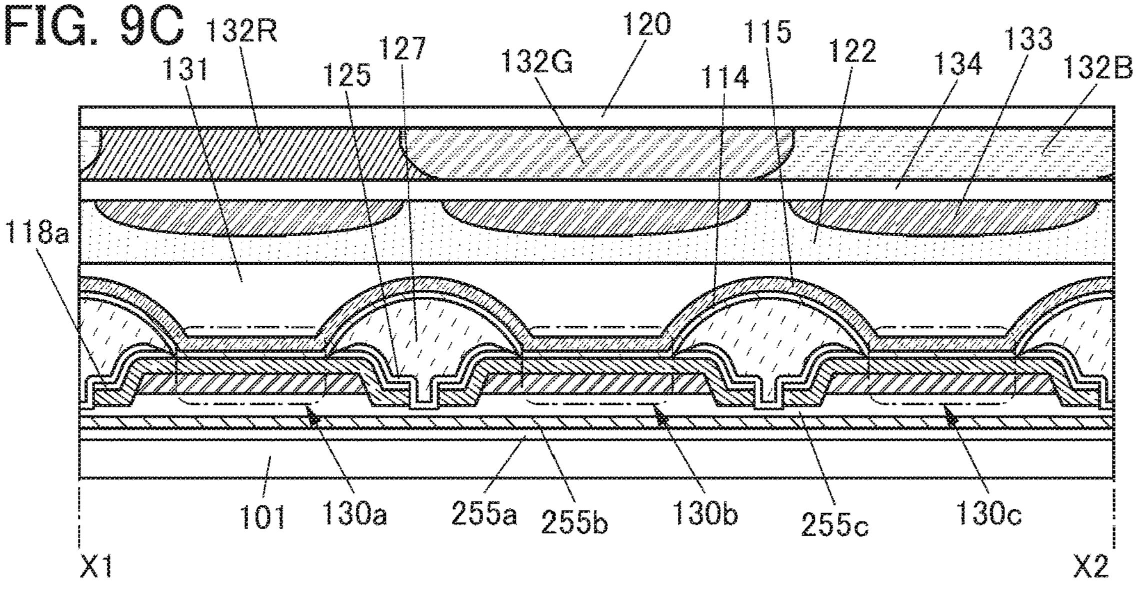

FIG. 9A to FIG. 9C are cross-sectional views along the dashed-dotted line X1-X2 in FIG. 1A.

As illustrated in FIG. 9A, the substrate 120 provided with the coloring layers may be attached to the protective layer 131 with the resin layer 122. The coloring layers are provided on the substrate 120, whereby the heat treatment temperature in the process of forming the coloring layers can be increased.

As illustrated in FIG. 9B and FIG. 9C, a lens array 133 may be provided in the display apparatus. The lens array 133 can be provided so as to overlap with the light-emitting device.

FIG. 9B illustrates an example where the coloring layers 132R, 132G, and 132B are provided over the light-emitting devices 130*a*, 130*b*, and 130*c* with the protective layer 131 therebetween, an insulating layer 134 is provided over the coloring layers 132R, 132G, and 132B, and the lens array 133 is provided over the insulating layer 134. The coloring layer 132R, the coloring layer 132G, the coloring layer 132B, and the lens array 133 are directly formed over the substrate provided with the light-emitting devices, whereby the accuracy of positional alignment of the light-emitting devices and the coloring layers or the lens array can be enhanced.

For the insulating layer 134, one or both of an inorganic insulating film and an organic insulating film can be used. The insulating layer 134 may have either a single-layer structure or a stacked-layer structure. The insulating layer 134 can be formed using a material that can be used for the protective layer 131, for example. When light emitted by the light-emitting device is extracted through the insulating layer 134, the insulating layer 134 preferably has a high visible-light-transmitting property.

In FIG. 9B, light emitted by the light-emitting device passes through the coloring layer and then passes through the lens array 133, resulting in being extracted to the outside of the display apparatus. It is preferable to shorten the distance between the light-emitting device and the coloring layer because color mixing can be inhibited and the viewing angle characteristics can be improved. Note that a structure where the lens array 133 is provided over the light-emitting device and the coloring layer is provided over the lens array 133 may be employed.

FIG. 9C illustrates an example where the substrate 120 provided with the coloring layer 132R, the coloring layer 132G, the coloring layer 132B, and the lens array 133 is attached onto the protective layer 131 with the resin layer 122. The substrate 120 is provided with the coloring layer 132R, the coloring layer 132G, the coloring layer 132B, and the lens array 133, whereby the heat treatment temperature in the forming process of them can be increased.

FIG. 9C illustrates an example where the coloring layers 132R, 132G, and 132B are provided in contact with the substrate 120, the insulating layer 134 is provided in contact with the coloring layers 132R, 132G, and 132B, and the lens array 133 is provided in contact with the insulating layer 134.

In FIG. 9C, light emitted by the light-emitting device passes through the lens array 133 and then passes through the coloring layer, resulting in being extracted to the outside of the display apparatus. Note that a structure where the lens array 133 is provided in contact with the substrate 120, the insulating layer 134 is provided in contact with the lens array 133, and the coloring layers are provided in contact with the insulating layer 134 may be employed. In this case, light emitted by the light-emitting device passes through the coloring layer and then passes through the lens array 133, resulting in being extracted to the outside of the display apparatus. Note that as illustrated in FIG. 9B and FIG. 9C, it is preferable that a region where the coloring layer 132R and the coloring layer 132G overlap with each other be provided between adjacent lens arrays 133. When such a region where coloring layers of different colors overlap with each other is provided, color mixture of light emitted from the light-emitting devices can be inhibited.

The lens array 133 may have a convex surface facing the substrate 120 side or a convex surface facing the light-emitting device side.

The lens array 133 can be formed using at least one of an inorganic material and an organic material. For example, a material containing a resin can be used for the lens. Moreover, a material containing at least one of an oxide and a sulfide can be used for the lens. As the lens array 133, a microlens array can be used, for example. The lens array 133 may be directly formed over the substrate or the light-emitting device. Alternatively, a lens array separately formed may be attached thereto.

Figure 11A:
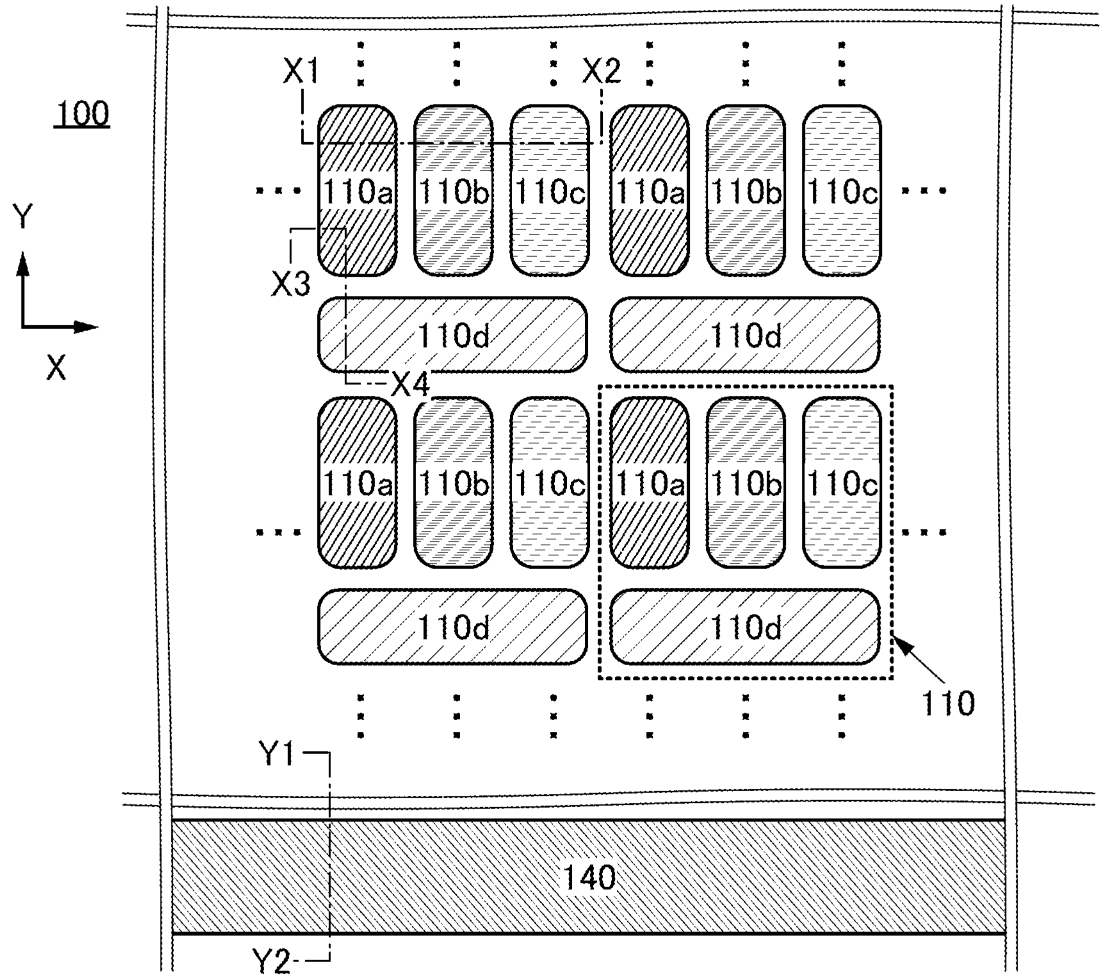
FIG. 11A is a top view illustrating an example of a display apparatus.

FIG. 11A is a top view of the display apparatus 100 different from that in FIG. 1A. The pixel 110 illustrated in FIG. 11A is composed of four subpixels: the subpixels 110*a*, 110*b*, 110*c*, and 110*d*.

The subpixels 110*a*, 110*b*, 110*c*, and 110*d* can include light-emitting devices that emit light of different colors. For example, as the subpixels 110*a*, 110*b*, 110*c*, and 110*d*, subpixels of four colors of R, G, B, and W, subpixels of four colors of R, G, B, and Y, and four subpixels of R, G, B, and IR can be given.

The display apparatus of one embodiment of the present invention may include a light-receiving device in the pixel.

Three of the four subpixels included in the pixel 110 in FIG. 11A may include light-emitting devices and the other one may include a light-receiving device.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

The light-receiving device can detect one or both of visible light and infrared light. In the case where visible light is detected, one or more of blue light, violet light, bluish violet light, green light, yellowish green light, yellow light, orange light, red light, and the like can be detected, for example. Infrared light is preferably detected because an object can be detected even in a dark place.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display apparatuses.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display apparatus using the organic EL device.

When the light-receiving device is driven by application of reverse bias between the pixel electrode and the common electrode, light entering the light-receiving device can be detected and electric charge can be generated and extracted as current.

A fabrication method similar to that of the light-emitting device can be employed for the light-receiving device. An island-shaped active layer (also referred to as a photoelectric conversion layer) included in the light-receiving device is formed by processing a film that is to be the active layer and formed over the entire surface, not by using a fine metal mask; thus, the island-shaped active layer can be formed to have a uniform thickness. In addition, a mask layer provided over the active layer can reduce damage to the active layer in the fabrication process of the display apparatus, increasing the reliability of the light-receiving device.

Embodiment 6 can be referred to for the structure and materials of the light-receiving device.

Figure 11B:
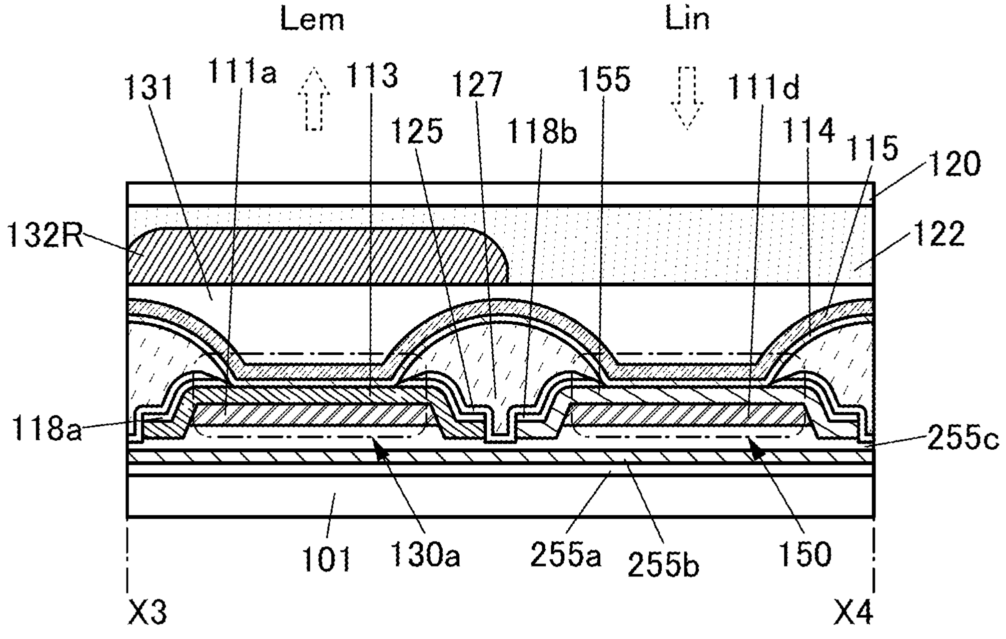
FIG. 11B is a cross-sectional view illustrating the example of a display apparatus.

FIG. 11B is a cross-sectional view along the dashed-dotted line X3-X4 in FIG. 11A. FIG. 1B can be referred to for a cross-sectional view along the dashed-dotted line X1-X2 in FIG. 11A, and FIG. 10A or FIG. 10B can be referred to for the cross-sectional view along the dashed-dotted line Y1-Y2.

As illustrated in FIG. 11B, in the display apparatus 100, an insulating layer is provided over the layer 101 including transistors, the light-emitting device 130*a* and a light-receiving device 150 are provided over the insulating layer, the protective layer 131 is provided to cover the light-emitting device and the light-receiving device, the coloring layers 132R, 132G, and 132B are provided over the protective layer 131, and the substrate 120 is attached with the resin layer 122. In a region between adjacent devices among the light-emitting devices and the light-receiving device, the insulating layer 125 and the insulating layer 127 over the insulating layer 125 are provided.

In FIG. 11B, light from the light-emitting device 130*a* is emitted to the substrate 120 side, and light is incident on the light-receiving device 150 from the substrate 120 side (see light Lem and light Lin).

The structure of the light-emitting device 130*a* is as described above.

The light-receiving device 150 includes a pixel electrode 111*d* over the insulating layer 255*c*, a second layer 155 over the pixel electrode 111*d*, the common layer 114 over the second layer 155, and the common electrode 115 over the common layer 114. The second layer 155 includes at least an active layer.

The second layer 155 is provided in the light-receiving device 150, and not provided in the light-emitting devices. Meanwhile, the common layer 114 is a continuous layer shared by the light-emitting devices and the light-receiving device.

Here, a layer used in common to the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer used in common to the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The mask layer 118*a* is positioned between the first layer 113 and the insulating layer 125, and a mask layer 118*b* is positioned between the second layer 155 and the insulating layer 125. The mask layer 118*a* is a remaining portion of the mask layer provided over the first layer 113 when the first layer 113 is processed. The mask layer 118*b* is a remaining portion of a mask layer provided in contact with the top surface of the second layer 155 at the time of processing the second layer 155, which is a layer including the active layer. The mask layer 118*a* and the mask layer 118*b* may contain the same material or different materials.

Although FIG. 11A illustrates an example where an aperture ratio (also referred to as a size or a size of the light-emitting region or the light-receiving region) of the subpixel 110*d* is higher than those of the subpixels 110*a*, 110*b*, and 110*c*, one embodiment of the present invention is not limited thereto. The aperture ratio of each of the subpixels 110*a*, 110*b*, 110*c*, and 110*d* can be determined as appropriate. The subpixels 110*a*, 110*b*, 110*c*, and 110*d* may have different aperture ratios, or two or more of them may have the same or substantially the same aperture ratio.

The subpixel 110*d* may have a higher aperture ratio than at least one of the subpixels 110*a*, 110*b*, and 110*c*. The wide light-receiving area of the subpixel 110*d* can make it easy to detect an object in some cases. For example, in some cases, the aperture ratio of the subpixel 110*d* is higher than that of the other subpixels depending on the resolution of the display apparatus and the circuit structure or the like of the subpixel.

The subpixel 110*d* may have a lower aperture ratio than at least one of the subpixels 110*a*, 110*b*, and 110*c*. A smaller light-receiving area of the subpixel 110*d* leads to a narrower image-capturing range, so that a blur in a capturing result can be inhibited and the definition can be improved. Accordingly, high-resolution or high-definition image capturing can be performed, which is preferable.

As described above, the subpixel 110*d* can have a detection wavelength, a resolution, and an aperture ratio that are suitable for the intended use.

In the display apparatus of one embodiment of the present invention, each light-emitting device includes an island-shaped EL layer, which can inhibit generation of leakage current between the subpixels. This can prevent crosstalk due to unintended light emission, so that a display apparatus with extremely high contrast can be achieved. The insulating layer having a tapered end portion and being provided between adjacent island-shaped EL layers can prevent generation of step disconnection and formation of a locally thinned portion in the common electrode at the time of forming the common electrode. Thus, a connection defect due to a disconnected portion and an increase in electrical resistance due to a locally thinned portion can be inhibited from being caused in the common layer and the common electrode. Consequently, the display apparatus of one embodiment of the present invention achieves both high resolution and high display quality.

This embodiment can be combined with the other embodiments as appropriate. In this specification, in the case where a plurality of structure examples are described in one embodiment, the structure examples can be combined as appropriate.

Embodiment 2

In this embodiment, a method for fabricating the display apparatus of one embodiment of the present invention will be described with reference to FIG. 12 to FIG. 21. Note that as for a material and a formation method of each component, portions similar to those described in Embodiment 1 are not described in some cases. Details of the structure of the light-emitting device will be described in Embodiment 5.

FIG. 12 to FIG. 15 and FIG. 17 to FIG. 20 each illustrate a cross-sectional view along the dashed-dotted line X1-X2 and a cross-sectional view along the dashed-dotted line Y1-Y2 shown in FIG. 1A side by side. FIG. 16 and FIG. 21 show enlarged views of an end portion of the insulating layer 127 and the vicinity thereof.

Thin films included in the display apparatus (an insulating film, a semiconductor film, a conductive film, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD) method can be given.

Alternatively, thin films included in the display apparatus (an insulating film, a semiconductor film, a conductive film, and the like) can be formed by a wet film-formation method such as spin coating, dipping, spray coating, ink-jetting, dispensing, screen printing, offset printing, a doctor knife method, slit coating, roll coating, curtain coating, or knife coating.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a hole-blocking layer, a light-emitting layer, an electron-blocking layer, an electron-transport layer, an electron-injection layer, and a charge-generation layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, a screen printing (stencil) method, an offset printing (planography) method, a flexography (relief printing) method, a gravure printing method, or a micro-contact printing method), or the like.

The thin films included in the display apparatus can be processed by a photolithography method or the like. Alternatively, thin films may be processed by a nanoimprinting method, a sandblasting method, a lift-off method, or the like. Alternatively, island-shaped thin films may be directly formed by a film formation method using a shielding mask such as a metal mask.

There are the following two typical methods of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. In addition, light exposure may be performed by liquid immersion exposure technique. As the light for exposure, extreme ultraviolet (EUV) light or X-rays may also be used. Instead of the light used for the light exposure, an electron beam can also be used. It is preferable to use extreme ultraviolet light, X-rays, or an electron beam because they can perform extremely minute processing. Note that a photomask is not needed when light exposure is performed by scanning with a beam such as an electron beam.

For etching of thin films, a dry etching method, a wet etching method, a sandblast method, or the like can be used.

Fabrication Method Example 1

Figures 12A, 12B, 12C:
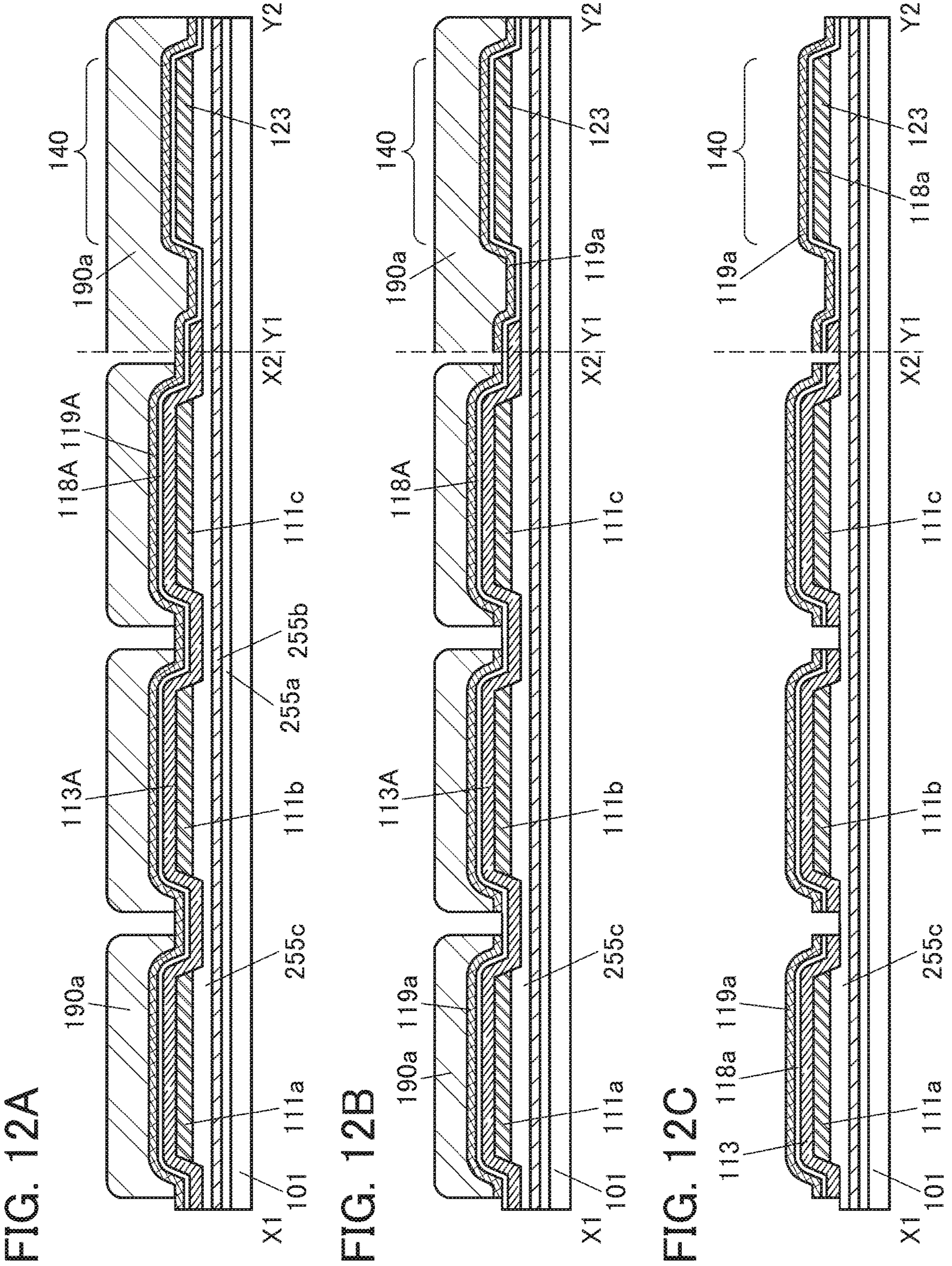
FIG. 12A to FIG. 12C are cross-sectional views illustrating an example of a method for fabricating a display apparatus.

A method for fabricating the display apparatus illustrated in FIG. 2 to FIG. 6 is mainly described in Fabrication method example 1. First, the insulating layer 255*a*, the insulating layer 255*b*, and the insulating layer 255*c* are formed in this order over the layer 101 including transistors. Next, the pixel electrodes 111*a*, 111*b*, and 111*c*, and the conductive layer 123 are formed over the insulating layer 255*c* (FIG. 12A). The pixel electrode can be formed by a sputtering method or a vacuum evaporation method, for example.

Then, the pixel electrode is preferably subjected to hydrophobic treatment. The hydrophobic treatment for the pixel electrode can improve adhesion between the pixel electrode and a film to be formed in a later step (here, a film 113A), thereby inhibiting film separation. Note that the hydrophobic treatment is not necessarily performed.

The hydrophobic treatment can be performed by fluorine modification of the pixel electrode, for example. The fluorine modification can be performed by, for example, treatment or heat treatment using a fluorine-containing gas, plasma treatment in an atmosphere of a fluorine-containing gas, or the like. A fluorine gas can be used as the fluorine-containing gas, and for example, a fluorocarbon gas can be used. As the fluorocarbon gas, a low carbon fluoride gas such as a carbon tetrafluoride ($CF_4$) gas, a $C_4F_6$ gas, a $C_2F_6$ gas, a $C_4F_8$ gas, or $C_5F_8$ can be used, for example. Moreover, as the fluorine-containing gas, an $SF_6$ gas, an $NF_3$ gas, a $CHF_3$ gas, or the like can be used, for example. Alternatively, a helium gas, an argon gas, a hydrogen gas, or the like can be added to any of the above gases as appropriate.

In addition, treatment using a silylation agent is performed on the surface of the pixel electrode after plasma treatment is performed in a gas atmosphere containing a Group 18 element such as argon, so that the surface of the pixel electrode can become hydrophobic. As the silylation agent, hexamethyldisilazane (HMDS), trimethylsilylimidazole (TMSI), or the like can be used. Alternatively, treatment using a silane coupling agent is performed on the surface of the pixel electrode after plasma treatment is performed in a gas atmosphere containing a Group 18 element such as argon, so that the surface of the pixel electrode can become hydrophobic.

Plasma treatment on the surface of the pixel electrode in a gas atmosphere containing a Group 18 element such as argon can apply damage to the surface of the pixel electrode. Accordingly, a methyl group included in the silylation agent such as HMDS is likely to bond to the surface of the pixel electrode. Moreover, silane coupling due to the silane coupling agent is likely to occur. As described above, treatment using a silylation agent or a silane coupling agent performed on the surface of the pixel electrode after plasma treatment in a gas atmosphere containing a Group 18 element such as argon enables the surface of the pixel electrode to become hydrophobic.

The treatment using the silylation agent, the silane coupling agent, or the like can be performed by application of the silylation agent, the silane coupling agent, or the like by a spin coating method or a dipping method, for example. The treatment using the silylation agent, the silane coupling agent, or the like can also be performed by forming a film containing the silylation agent, a film containing the silane coupling agent, or the like over the pixel electrode and the like by a gas phase method, for example. In a gas phase method, first, a material containing the silylation agent, a material containing the silane coupling agent, or the like is volatilized so that the silylation agent, the silane coupling agent, or the like is included in the atmosphere. Next, a substrate where the pixel electrode and the like are formed is put in the atmosphere. Accordingly, a film containing the silylation agent, a film containing the silane coupling agent, or the like can be formed over the pixel electrode, so that the surface of the pixel electrode can become hydrophobic.

Then, the film 113A to be the first layer 113 later is formed over the pixel electrodes (FIG. 12A).

As illustrated in FIG. 12A, the film 113A is not formed over the conductive layer 123 in the cross-sectional view along the dashed-dotted line Y1-Y2. For example, a mask for specifying a film formation area (also referred to as an area mask, a rough metal mask, or the like to be distinguished from a fine metal mask) is used, so that the film 113A can be formed only in a desired region. A light-emitting device can be fabricated through a relatively simple process, by employing a film formation step using an area mask and a processing step using a resist mask.

The film 113A can be formed by an evaporation method, specifically a vacuum evaporation method, for example. The film 113A may be formed by a transfer method, a printing method, an inkjet method, a coating method, or the like.

Next, a mask film 118A to be the mask layer 118*a* later and a mask film 119A to be the mask layer 119*a* later are formed in this order over the film 113A and the conductive layer 123 (FIG. 12A).

Although this embodiment describes an example where the mask film is formed to have a two-layer structure of the mask film 118A and the mask film 119A, the mask film may have a single-layer structure or a stacked-layer structure of three or more layers.

Provision of a mask film over the film 113A can reduce damage to the film 113A in a fabrication process of the display apparatus and increase the reliability of the light-emitting device.

As the mask film 118A, a film highly resistant to the processing conditions of the film 113A, i.e., a film having high etching selectivity with respect to the film 113A, is used. As the mask film 119A, a film having high etching selectivity with respect to the mask film 118A is used.

The mask film 118A and the mask film 119A are formed at a temperature lower than the upper temperature limit of the film 113A. The typical substrate temperatures in formation of the mask film 118A and the mask film 119A are each lower than or equal to 200° C., preferably lower than or equal to 150° C., further preferably lower than or equal to 120° C., still further preferably lower than or equal to 100° C., yet still further preferably lower than or equal to 80° C.

Examples of indicators of the upper temperature limit are the glass transition point, the softening point, the melting point, the thermal decomposition temperature, and the 5% weight loss temperature. The upper temperature limit of the film 113A (i.e., the first layer 113) can be any of the above temperatures, preferably the lowest one among the temperatures.

As the mask film 118A and the mask film 119A, films that can be removed by a wet etching method are preferably used. Using a wet etching method can reduce damage to the film 113A in processing of the mask film 118A and the mask film 119A, compared to the case of using a dry etching method.

The mask film 118A and the mask film 119A can be formed by a sputtering method, an ALD method (including a thermal ALD method or a PEALD method), a CVD method, or a vacuum evaporation method, for example. Alternatively, the mask film 118A and the mask film 119A may be formed by the above-described wet film-formation method.

The mask film 118A, which is formed over and in contact with the film 113A, is preferably formed by a formation method that causes less damage to the film 113A than a formation method of the mask film 119A. For example, the mask film 118A is preferably formed by an ALD method or a vacuum evaporation method rather than a sputtering method.

As each of the mask film 118A and the mask film 119A, it is possible to use one or more kinds of a metal film, an alloy film, a metal oxide film, a semiconductor film, an organic insulating film, and an inorganic insulating film, for example.

For the mask film 118A and the mask film 119A, it is possible to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the mask film 118A and the mask film 119A is preferable, in which case the film 113A can be inhibited from being irradiated with ultraviolet light and deteriorating.

Furthermore, for the mask film 118A and the mask film 119A, it is possible to use metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), indium tin oxide containing silicon, or the like.

In addition, in place of gallium described above, an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used.

As the mask film, a film containing a material having a light-blocking property, particularly with respect to ultraviolet light, can be used. For example, a film having a reflecting property with respect to ultraviolet light or a film absorbing ultraviolet light can be used. Although a variety of materials, such as a metal having a light-blocking property with respect to ultraviolet light, an insulator, a semiconductor, and a metalloid, can be used as the material having a light-blocking property, a film that can be processed by etching is preferable, and a film having good processability is particularly preferable because part or the whole of the mask film is removed in a later step.

For example, a semiconductor material such as silicon or germanium can be used as a material with excellent compatibility with the semiconductor manufacturing process. Alternatively, an oxide or a nitride of the semiconductor material can be used. Alternatively, a non-metallic (metalloid) material, such as carbon, or a compound thereof can be used. Alternatively, a metal such as titanium, tantalum, tungsten, chromium, or aluminum, or an alloy containing one or more of these metals can be used. Alternatively, an oxide containing the above-described metal, such as titanium oxide or chromium oxide, or a nitride such as titanium nitride, chromium nitride, or tantalum nitride can be used.

The use of a film containing a material having a light-blocking property with respect to ultraviolet light can inhibit the EL layer from being irradiated with ultraviolet light in a light exposure step or the like. The EL layer is inhibited from being damaged by ultraviolet light, so that the reliability of the light-emitting device can be improved.

Note that the same effect is obtained when a film containing a material having a light-blocking property with respect to ultraviolet light is used for an insulating film 125A to be described later.

As the mask film 118A and the mask film 119A, a variety of inorganic insulating films that can be used as the protective layer 131 can be used. In particular, an oxide insulating film is preferable because it has higher adhesion to the film 113A than a nitride insulating film. For example, an inorganic insulating material such as aluminum oxide, hafnium oxide, or silicon oxide can be used for the mask film 118A and the mask film 119A. As the mask film 118A and the mask film 119A, an aluminum oxide film can be formed by an ALD method, for example. The use of an ALD method is preferable, in which case damage to a base (in particular, the EL layer) can be reduced.

For example, an inorganic insulating film (e.g., an aluminum oxide film) formed by an ALD method can be used as the mask film 118A, and an inorganic film (e.g., an In—Ga—Zn oxide film, an aluminum film, or a tungsten film) formed by a sputtering method can be used as the mask film 119A.

Note that the same inorganic insulating film can be used for both the mask film 118A and the insulating layer 125 that is to be formed later. For example, an aluminum oxide film formed by an ALD method can be used for both the mask film 118A and the insulating layer 125. Here, for the mask film 118A and the insulating layer 125, the same film-formation condition may be used or different film-formation conditions may be used. For example, when the mask film 118A is formed under conditions similar to those for the insulating layer 125, the mask film 118A can be an insulating layer having a high barrier property against at least one of water and oxygen. Meanwhile, since the mask film 118A is a layer most or all of which will be removed in a later step, the mask film 118A is preferably easy to process. Therefore, the mask film 118A is preferably formed at a substrate temperature lower than that for the insulating layer 125.

An organic material may be used for one or both of the mask film 118A and the mask film 119A. For example, a material that can be dissolved in a solvent chemically stable with respect to at least the uppermost film of the film 113A may be used as the organic material. Specifically, a material that will be dissolved in water or alcohol can be suitably used. In forming a film of such a material, it is preferable to apply the material dissolved in a solvent such as water or alcohol by a wet film-formation method and then perform heat treatment for evaporating the solvent. At this time, the heat treatment is preferably performed in a reduced-pressure atmosphere, in which case the solvent can be removed at a low temperature in a short time and thermal damage to the film 113A can be reduced accordingly.

The mask film 118A and the mask film 119A may be formed using an organic resin such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluorine resin such as a perfluoro polymer.

For example, an organic film (e.g., a PVA film) formed by an evaporation method or the above wet film-formation method can be used as the mask film 118A, and an inorganic film (e.g., a silicon nitride film) formed by a sputtering method can be used as the mask film 119A.

Note that as described in Embodiment 1, part of the mask film sometimes remains as a mask layer in the display apparatus of one embodiment of the present invention.

Then, a resist mask 190*a* is formed over the mask film 119A (FIG. 12A). The resist mask 190*a* can be formed by application of a photosensitive resin (photoresist), light exposure, and development.

The resist mask 190*a* may be formed using either a positive resist material or a negative resist material.

The resist mask 190*a* is provided at a position overlapping with the pixel electrodes 111*a*, 111*b*, and 111*c*. The resist mask 190*a* is preferably provided also at a position overlapping with the conductive layer 123. This can inhibit the conductive layer 123 from being damaged in the fabrication process of the display apparatus. Note that the resist mask 190*a* is not necessarily provided over the conductive layer 123.

As illustrated in the cross-sectional view along Y1-Y2 in FIG. 12A, the resist mask 190*a* is preferably provided to cover a region from an end portion of the first layer 113 to an end portion of the conductive layer 123 (an end portion on the first layer 113 side). In this case, end portions of the mask layers 118*a* and 119*a* overlap with the end portion of the first layer 113 even after the mask film 118A and the mask film 119A are processed. Since the mask layers 118*a* and 119*a* are provided to cover a region from the end portion of the first layer 113 to the end portion of the conductive layer 123 (the end portion on the first layer 113 side), the insulating layer 255*c* can be inhibited from being exposed (see the cross-sectional view along Y1-Y2 in FIG. 12C). This can prevent removal of the insulating layers 255*a* to 255*c* and part of the insulating layer included in the layer 101 including transistors, and exposure of the conductive layer included in the layer 101 including transistors. Thus, unintentional electrical connection between the conductive layer and another conductive layer can be inhibited. For example, a short circuit between the conductive layer and the common electrode 115 can be inhibited.

Next, part of the mask film 119A is removed using the resist mask 190*a*, so that the mask layer 119*a* is formed (FIG. 12B). The mask layer 119*a* remains over the pixel electrodes 111*a*, 111*b*, and 111*c* and the conductive layer 123. After that, the resist mask 190*a* is removed. Then, part of the mask film 118A is removed using the mask layer 119*a* as a mask (also referred to as a hard mask), whereby the mask layer 118*a* is formed (FIG. 12C).

The mask film 118A and the mask film 119A can each be processed by a wet etching method or a dry etching method. The mask film 118A and the mask film 119A are preferably processed by anisotropic etching.

Using a wet etching method can reduce damage to the film 113A in processing of the mask film 118A and the mask film 119A, compared to the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, or a chemical solution containing a mixed solution of these acids, for example.

Since the film 113A is not exposed in processing the mask film 119A, the range of choices of the processing method is wider than that for the mask film 118A. Specifically, deterioration of the film 113A can be further inhibited even when a gas containing oxygen is used as an etching gas in processing the mask film 119A.

In the case of using a dry etching method for processing the mask film 118A, deterioration of the film 113A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, in the case where an aluminum oxide film formed by an ALD method is used as the mask film 118A, the mask film 118A can be processed by a dry etching method using a combination of $CHF_3$ and He or a combination of $CHF_3$, He, and $CH_4$. In the case where an In—Ga—Zn oxide film formed by a sputtering method is used as the mask film 119A, the mask film 119A can be processed by a wet etching method using a diluted phosphoric acid. Alternatively, the mask film 119A may be processed by a dry etching method using $CH_4$ and Ar. Alternatively, the mask film 119A can be processed by a wet etching method using a diluted phosphoric acid. When a tungsten film formed by a sputtering method is used as the mask film 119A, the mask film 119A can be processed by a dry etching method using a combination of $SF_6$, $CF_4$, and $O_2$ or a combination of $CF_4$, $Cl_2$, and $O_2$.

The resist mask 190*a* can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, or a noble gas such as He may be used. Alternatively, the resist mask 190*a* may be removed by wet etching. At this time, the mask film 118A is positioned on the outermost surface and the film 113A is not exposed; thus, the film 113A can be inhibited from being damaged in the step of removing the resist mask 190*a*. In addition, the range of choices of the method for removing the resist mask 190*a* can be widened.

Then, the film 113A is processed, whereby the first layer 113 is formed. For example, part of the film 113A is removed using the mask layer 119*a* and the mask layer 118*a* as a hard mask, whereby the first layer 113 is formed (FIG. 12C).

Thus, as illustrated in FIG. 12C, a stacked-layer structure of the first layer 113, the mask layer 118*a*, and the mask layer 119*a* remains over the pixel electrode 111*a*, the pixel electrode 111*b*, and the pixel electrode 111*c*.

As illustrated in FIG. 12C, the film 113A is processed, whereby the plurality of first layers 113 can be formed. That is, the film 113A can be divided into the plurality of first layers 113. In this manner, the island-shaped first layer 113 is provided in each subpixel. Furthermore, the island-shaped first layers 113 of adjacent subpixels can be inhibited from being in contact with each other. As a result, generation of leakage current between the subpixels can be inhibited. Accordingly, degradation of the display quality of the display apparatus can be inhibited. In addition, both the higher resolution and higher display quality of the display apparatus can be achieved.

The distance between two adjacent layers among the plurality of first layers 113, which are formed by a photolithography method as described above, can be shortened to less than or equal to 8 μm, less than or equal to 5 μm, less than or equal to 3 μm, less than or equal to 2 μm, or less than or equal to 1 μm. Here, the distance can be specified, for example, by the distance between facing end portions of two adjacent layers among the plurality of first layers 113. The distance between island-shaped EL layers is shortened in this manner, whereby a display apparatus with high resolution and a high aperture ratio can be provided.

Note that the side surface of the first layer 113 is preferably perpendicular or substantially perpendicular to the formation surface. For example, the angle formed by the formation surface and the side surface is preferably greater than or equal to 60° and less than or equal to 90°.

FIG. 12C illustrates an example where the end portion of the first layer 113 is positioned outward from the end portion of the pixel electrode. Such a structure can increase the aperture ratio of the pixel. Although not illustrated in FIG. 12C, a depressed portion is sometimes formed by the etching treatment in a region of the insulating layer 255*c* not overlapping with the first layer 113.

The first layer 113 covers the top surface and the side surface of the pixel electrode and thus, the subsequent steps can be performed without exposure of the pixel electrode. When the end portion of the pixel electrode is exposed, corrosion might occur in the etching step or the like. A product generated by corrosion of the pixel electrode might be unstable; for example, the product might be dissolved in a solution in wet etching and might be diffused in an atmosphere in dry etching. The product dissolved in a solution or scattered in an atmosphere might be attached to a surface to be processed, the side surface of the first layer 113, and the like, which adversely affects the characteristics of the light-emitting device or forms a leakage path between the light-emitting devices in some cases. In a region where the end portion of the pixel electrode is exposed, adhesion between layers in contact with each other might be lowered, which might be likely to cause peeling of the first layer 113 or the pixel electrode.

Thus, with the structure where the first layer 113 covers the top surfaces and the side surfaces of the pixel electrodes 111*a*, 111*b*, and 111*c*, for example, the yield and characteristics of the light-emitting device can be improved.

In a region corresponding to the connection portion 140, a stacked-layer structure of the mask layer 118*a* and the mask layer 119*a* remains over the conductive layer 123.

As described above, in the cross-sectional view along Y1-Y2 in FIG. 12C, the mask layers 118*a* and 119*a* are provided to cover the end portion of the first layer 113 and the end portion of the conductive layer 123, and the insulating layer 255*c* is not exposed. This can prevent removal of the insulating layers 255*a* to 255*c* and part of the insulating layer included in the layer 101 including transistors, and exposure of the conductive layer included in the layer 101 including transistors. Thus, unintentional electrical connection between the conductive layer and another conductive layer can be inhibited.

The film 113A is preferably processed by anisotropic etching. In particular, anisotropic dry etching is preferable. Alternatively, wet etching may be used.

In the case of using a dry etching method, deterioration of the film 113A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the film 113A can be inhibited. Furthermore, a defect such as attachment of a reaction product generated in the etching can be inhibited.

In the case of using a dry etching method, it is preferable to use a gas containing one or more of $H_2$, $CF_4$, $C_4F_8$, $SF_6$, $CHF_3$, $Cl_2$, $H_2O$, $BCl_3$, and a noble gas such as He and Ar as the etching gas, for example. Alternatively, a gas containing oxygen and one or more of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas. As another example, a gas containing $H_2$ and Ar and a gas containing oxygen can be used as the etching gas.

As described above, in one embodiment of the present invention, the mask layer 119*a* is formed in the following manner: the resist mask 190*a* is formed over the mask film 119A; and part of the mask film 119A is removed using the resist mask 190*a*. After that, part of the film 113A is removed using the mask layer 119*a* as a hard mask, so that the first layer 113 is formed. In other words, the first layer 113 can be formed by processing the film 113A by a photolithography method. Note that part of the film 113A may be removed using the resist mask 190*a*. Then, the resist mask 190*a* may be removed.

In the case of fabricating a display apparatus including both the light-emitting device and the light-receiving device as illustrated in FIG. 11A and FIG. 11B, the second layer 155 included in the light-receiving device is formed in a manner similar to that for the first layer 113. There is no particular limitation on the formation order of the first layer 113 and the second layer 155. For example, when a layer with high adhesion to the pixel electrode is formed earlier, peeling in the process can be inhibited. Specifically, in the case where the first layer 113 has higher adhesion to the pixel electrode than the second layer 155, the first layer 113 is preferably formed first. The thickness of the layer formed first sometimes has an influence on the distance between the substrate and a mask for specifying a film formation area in the subsequent steps of forming the other layers. Forming a thinner layer first can inhibit shadowing (formation of a layer in a shadow portion). Specifically, in the case where a light-emitting device with a tandem structure is formed, the first layer 113 often has a larger thickness than the second layer 155, and thus the second layer 155 is preferably formed first. In the case where a film is formed by a wet method using a high molecular material, it is preferable to form the film first. Specifically, in the case where a high molecular material is used for an active layer, the second layer 155 is preferably formed first. As described above, the formation order is determined depending on the materials and formation methods, whereby the fabrication yield of the display apparatus can be increased.

Figure 13A:
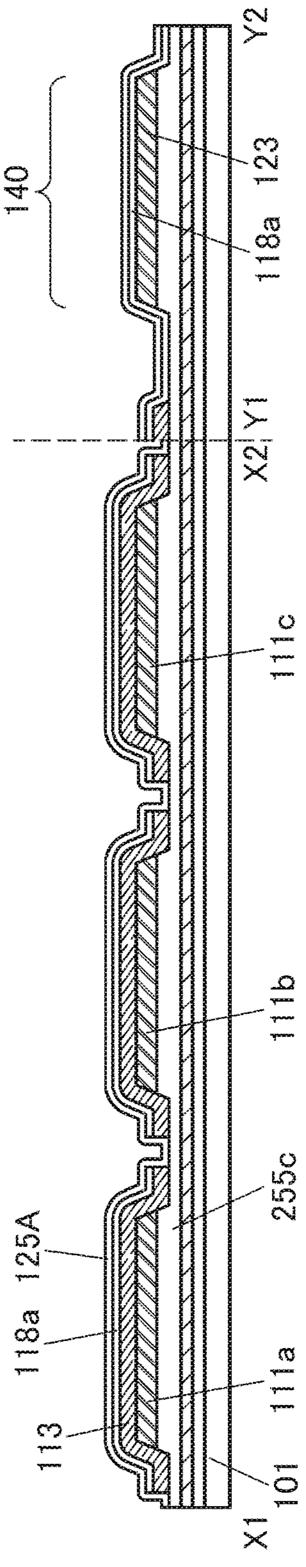
FIG. 13A to FIG. 13C are cross-sectional views illustrating the example of a method for fabricating a display apparatus.

Next, the mask layer is preferably removed (FIG. 13A). The mask layers 118*a* and 119*a* remain in the display apparatus in some cases, depending on the later steps. Removing the mask layer 119*a* at this stage can inhibit the mask layer 119*a* from remaining in the display apparatus. For example, in the case where a conductive material is used for the mask layer 119*a*, removing the mask layer 119*a* in advance can inhibit generation of a leakage current due to the remaining mask layer 119*a*, formation of a capacitor, or the like.

Although this embodiment describes an example where the mask layer 119*a* is removed, the mask layer 119*a* is not necessarily removed. For example, in the case where the mask layer 119*a* contains the aforementioned material having a light-blocking property with respect to ultraviolet light, the process preferably proceeds to the next step without removing the mask layers, in which case the EL layer can be protected from ultraviolet light.

The step of removing the mask layer can be performed by a method similar to that for the step of processing the mask layer. In particular, the use of a wet etching method can reduce damage to the first layer 113 at the time of removing the mask layer, as compared to the case of using a dry etching method.

The mask layer may be removed by being dissolved in a solvent such as water or alcohol. Examples of alcohol include ethyl alcohol, methyl alcohol, isopropyl alcohol (IPA), and glycerin.

After the mask layer is removed, drying treatment may be performed to remove water contained in the first layer 113 and water adsorbed onto the surface of the first layer 113. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

Figure 13B:
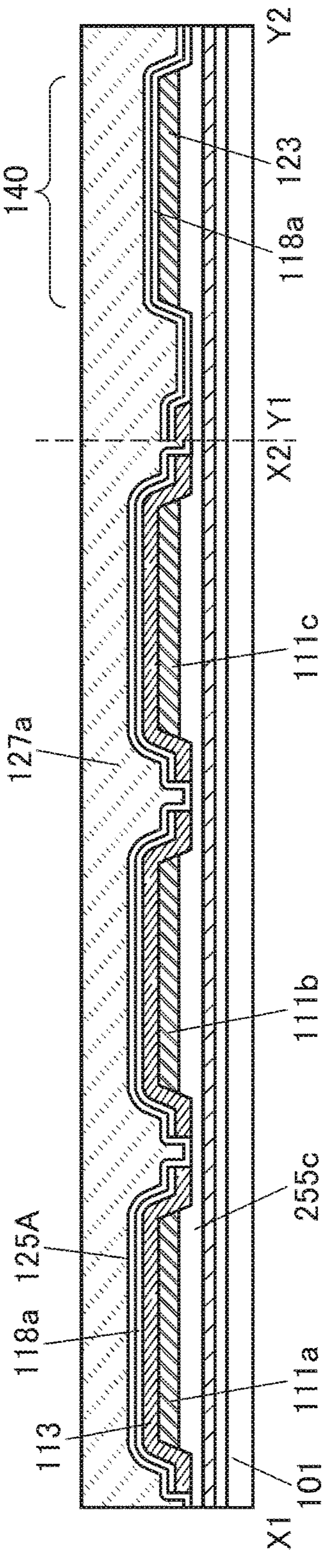

Next, the insulating film 125A to be the insulating layer 125 later is formed to cover the pixel electrode, the first layer 113, the mask layer 118*a* (FIG. 13A). Then, an insulating film 127*a* is formed over the insulating film 125A (FIG. 13B).

The insulating film 125A and the insulating film 127*a* are preferably formed by a formation method that causes less damage to the first layer 113. In particular, the insulating film 125A, which is formed in contact with the side surface of the first layer 113, is preferably formed by a formation method that causes less damage to the first layer 113 than the formation method of the insulating film 127*a*.

In addition, the insulating film 125A and the insulating film 127*a* are each formed at a temperature lower than the upper temperature limit of the first layer 113. When the substrate temperature in forming the insulating film 125A is increased, the formed film, even with a small thickness, can have a low impurity concentration and a high barrier property against at least one of water and oxygen.

The insulating film 125A and the insulating film 127*a* are preferably formed at a substrate temperature higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As the insulating film 125A, an insulating film is preferably formed within the above substrate temperature range to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film 125A is preferably formed by an ALD method, for example. The use of an ALD method is preferable, in which case damage by the deposition is reduced and a film with good coverage can be formed. As the insulating film 125A, an aluminum oxide film is preferably formed by an ALD method, for example.

Alternatively, the insulating film 125A may be formed by a sputtering method, a CVD method, or a PECVD method which has a higher deposition rate than an ALD method. In that case, a highly reliable display apparatus can be fabricated with high productivity.

The insulating film 127*a* is preferably formed by the aforementioned wet film-formation method. For example, the insulating film 127*a* is preferably formed by spin coating using a photosensitive resin, specifically preferably formed using a photosensitive acrylic resin.

Heat treatment (also referred to as pre-baking) is preferably performed after formation of the insulating film 127*a*. The heat treatment is performed at a temperature lower than the upper temperature limit of the first layer 113. The substrate temperature during the heat treatment is preferably higher than or equal to 50° C. and lower than or equal to 200° C., further preferably higher than or equal to 60° C. and lower than or equal to 150° C., and still further preferably higher than or equal to 70° C. and lower than or equal to 120° C. Accordingly, a solvent contained in the insulating film 127*a* can be removed.

Figure 13C:
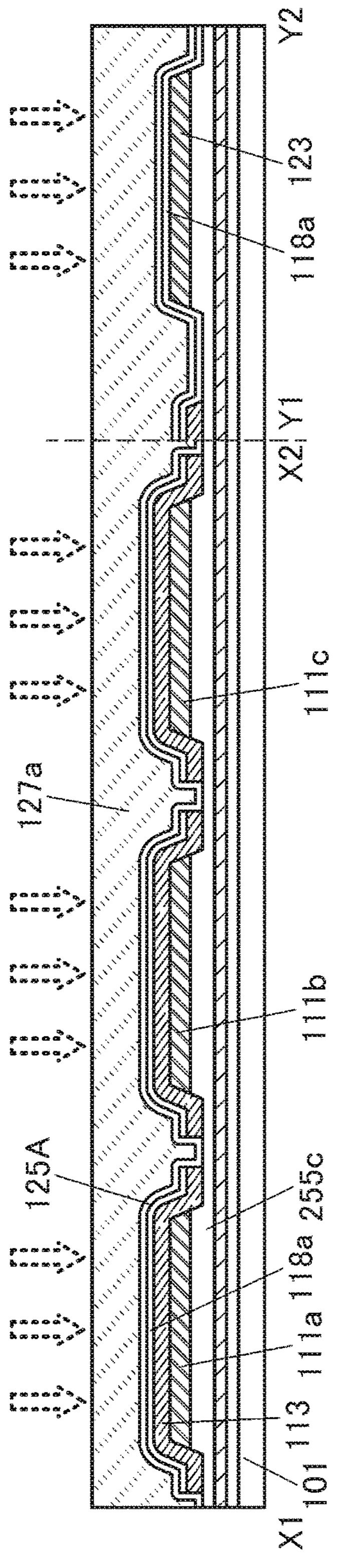

Then, as illustrated in FIG. 13C, light exposure is performed to expose part of the insulating film 127*a* to visible light or ultraviolet rays. In the case where a positive acrylic resin is used for the insulating film 127*a*, a region where the insulating layer 127 is not formed in a later step is irradiated with visible light or ultraviolet rays using a mask. The insulating layer 127 is formed in regions interposed between adjacent two pixel electrodes among the pixel electrodes 111*a*, 111*b*, and 111*c*, and around the conductive layer 123. Thus, as illustrated in FIG. 13C, irradiation with visible light or ultraviolet rays is performed on the pixel electrode 111*a*, the pixel electrode 111*b*, the pixel electrode 111*c*, and the conductive layer 123 using a mask.

Note that the width of the insulating layer 127 to be formed later can be controlled by the region exposed to light here. In this embodiment, processing is performed such that the insulating layer 127 includes a portion overlapping with the top surface of the pixel electrode (FIG. 2A and FIG. 2B). As illustrated in FIG. 6A or FIG. 6B, the insulating layer 127 does not necessarily include a portion overlapping with the top surface of the pixel electrode.

Light used for the exposure preferably includes the i-line (wavelength: 365 nm). Furthermore, light used for the exposure may include at least one of the g-line (wavelength: 436 nm) and the h-line (wavelength: 405 nm).

Although FIG. 13C illustrates an example where a positive photosensitive resin is used for the insulating film 127*a* and a region where the insulating layer 127 is not formed is irradiated with visible light or ultraviolet rays, the present invention is not limited thereto. For example, a negative photosensitive resin may be used for the insulating film 127*a*. In this case, a region where the insulating layer 127 is formed is irradiated with visible light or ultraviolet rays.

Figure 14A:
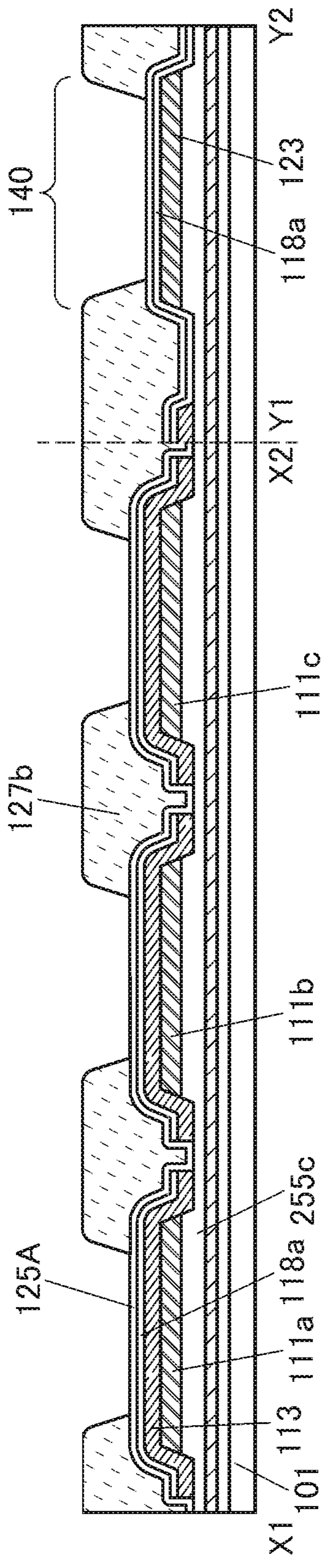
FIG. 14A and FIG. 14B are cross-sectional views illustrating the example of a method for fabricating a display apparatus.
Figure 16A:
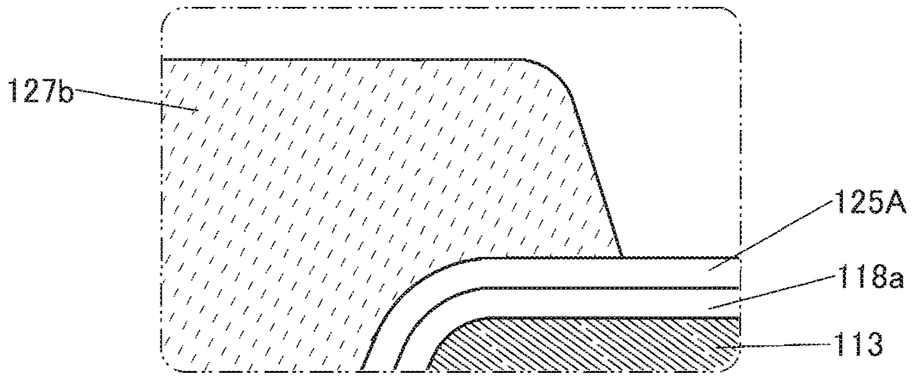
FIG. 16A to FIG. 16D are cross-sectional views illustrating the example of a method for fabricating a display apparatus.

Next, as illustrated in FIG. 14A and FIG. 16A, development is performed to remove the exposed region of the insulating film 127*a*, so that an insulating layer 127*b* is formed. FIG. 16A is an enlarged view of the end portions of the first layer 113 and the insulating layer 127*b* illustrated in FIG. 14A and their vicinities. The insulating layer 127*b* is formed in regions interposed between adjacent two pixel electrodes among the pixel electrodes 111*a*, 111*b*, and 111*c*, and a region surrounding the conductive layer 123. In the case where an acrylic resin is used for the insulating film 127*a*, an alkaline solution is preferably used as a developer, and for example, an aqueous solution of tetramethyl ammonium hydroxide (TMAH) can be used.

Then, a residue (scum) due to the development may be removed. For example, the residue can be removed by ashing using oxygen plasma.

Etching may be performed so that the surface level of the insulating layer 127*b* is adjusted. The insulating layer 127*b* may be processed by ashing using oxygen plasma, for example. In the case where a non-photosensitive material is used for the insulating film 127*a*, the surface level of the insulating film 127*a* can be adjusted by the ashing or the like.

Next, light exposure may be performed on the entire substrate so that the insulating layer 127*b* is irradiated with visible light or ultraviolet light. The energy density for the light exposure is preferably greater than 0 $mJ/cm^2$ and less than or equal to 800 $mJ/cm^2$, further preferably greater than 0 $mJ/cm^2$ and less than or equal to 500 $mJ/cm^2$. Performing such light exposure after development can improve the transparency of the insulating layer 127*b* in some cases. In addition, it is sometimes possible to lower the substrate temperature required for subsequent heat treatment for changing the shape of the insulating layer 127*b* into a tapered shape.

Meanwhile, as described later, when light exposure is not performed on the insulating layer 127*b*, it sometimes becomes easy to change the shape of the insulating layer 127*b* or change the shape of the insulating layer 127 into a tapered shape in a later step. Thus, sometimes it is preferable not to perform light expose on the insulating layer 127*b* or 127 after development.

For example, in the case where a light curable resin is used for the insulating layer 127*b*, light exposure on the insulating layer 127*b* can start polymerization and cure the insulating layer 127*b*. Note that without performing light exposure on the insulating layer 127*b* at this stage, at least one of after-mentioned first etching treatment, post-baking, and second etching treatment may be performed while the insulating layer 127*b* remains in a state where its shape is relatively easily changed. Thus, generation of unevenness in the formation surface of the common layer 114 and the common electrode 115 can be inhibited and accordingly step disconnection of the common layer 114 and the common electrode 115 can be inhibited. Note that light exposure may be performed on the insulating layer 127*b* (or the insulating layer 127) after any of the after-mentioned first etching treatment, post baking, and second etching treatment.

Figure 14B:
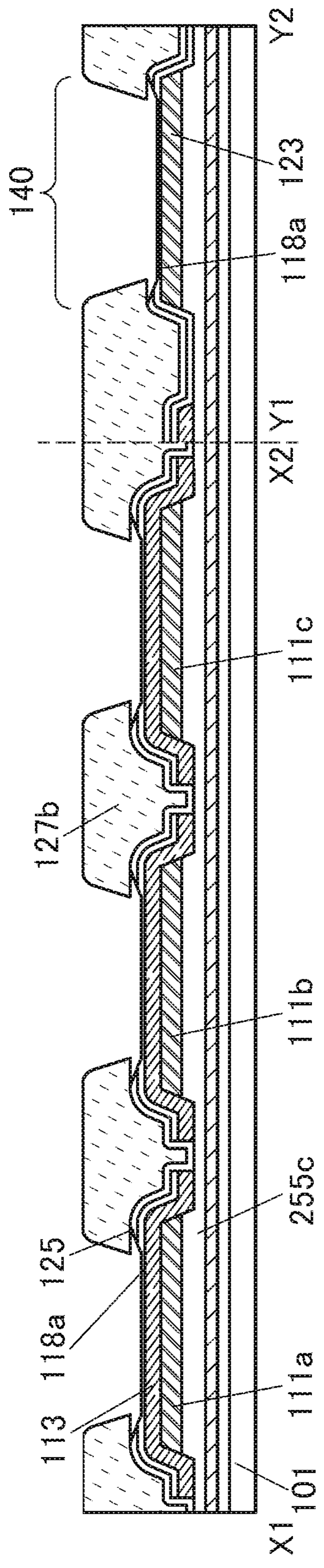
Figure 16B:
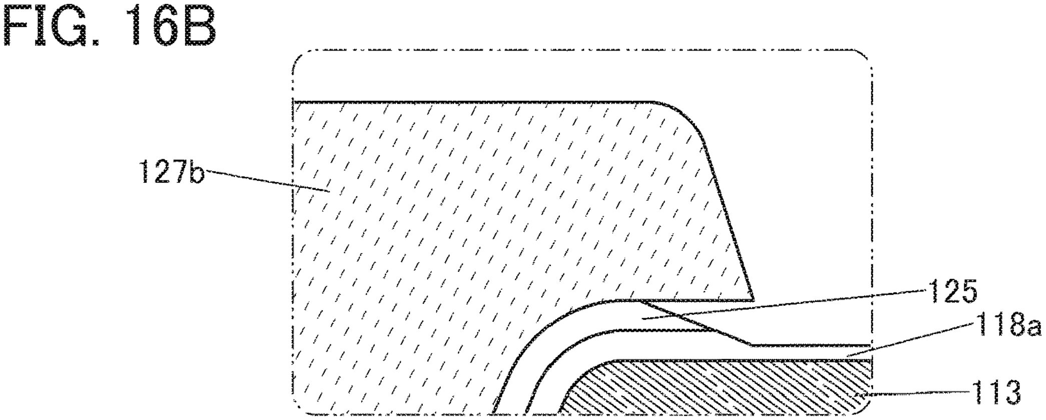

Next, as illustrated in FIGS. 14B and 16B, etching treatment is performed using the insulating layer 127*b* as a mask to remove part of the insulating film 125A and thin the mask layer 118a partly. Accordingly, the insulating layer 125 is formed below the insulating layer 127b. In addition, the surfaces of the thinned portion of the mask layer 118a is exposed. FIG. 16B is an enlarged view of the end portions of the first layer 113 and the insulating layer 127b illustrated in FIG. 14B and their vicinities. Note that the etching treatment using the insulating layer 127b as a mask is referred to as the first etching treatment below in some cases.

The first etching treatment can be performed by dry etching or wet etching. Note that the insulating film 125A is preferably formed using a material similar to that for the mask layer 118a, in which case the first etching treatment can be performed collectively.

As illustrated in FIG. 16B, etching is performed using the insulating layer 127b with a tapered side surface as a mask, so that the side surface of the insulating layer 125 and the upper end portion of the side surface of the mask layer 118a can be tapered relatively easily.

In the case of performing dry etching, a chlorine-based gas is preferably used. As the chlorine-based gas, $Cl_2$, $BCl_3$, $SiCl_4$, $CCl_4$, or the like can be used alone or two or more of the gases can be mixed and used. Moreover, one or more kind of an oxygen gas, a hydrogen gas, a helium gas, an argon gas, and the like can be mixed with the chlorine-based gas as appropriate. By employing dry etching, the thin region of the mask layer 118a can be formed with a favorable in-plane uniformity.

As a dry etching apparatus, a dry etching apparatus including a high-density plasma source can be used. As the dry etching apparatus including a high-density plasma source, an inductively coupled plasma (ICP) etching apparatus or the like can be used, for example. Alternatively, a capacitively coupled plasma (CCP) etching apparatus including parallel plate electrodes can be used. The capacitively coupled plasma etching apparatus including parallel plate electrodes may have a structure where a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes.

In the case of performing dry etching, a by-product generated by the dry etching is sometimes deposited on the top surface and the side surface of the insulating layer 127b, for example. Thus, a component contained in the etching gas, a component contained in the insulating film 125A, a component contained in the mask layer 118a, or the like might be contained in the insulating layer 127 after the display apparatus is completed.

The first etching treatment is preferably performed by wet etching. Using a wet etching method can reduce damage to the first layer 113 as compared with the case of using a dry etching method. The wet etching can be performed using an alkaline solution or the like. For example, wet etching of an aluminum oxide film is preferably performed using an aqueous solution of tetramethyl ammonium hydroxide (TMAH) that is an alkaline solution. In this case, puddle wet etching can be performed. Note that the insulating film 125A is preferably formed using a material similar to that for the mask layer 118a, in which case the etching treatment can be performed collectively.

As illustrated in FIG. 14B and FIG. 16B, in the first etching treatment, the etching treatment is stopped when the mask layer 118a is thinned, before the mask layer is completely removed. In this manner, the mask layer 118a is made to be left over the corresponding first layer 113, whereby the first layer 113 can be prevented from being damaged by treatment in a later step.

Although the mask layer 118a is thinned in FIG. 14B and FIG. 16B, the present invention is not limited thereto. For example, depending on the thickness of the insulating film 125A and the thickness of the mask layer 118a, the first etching treatment might be stopped before the insulating film 125A is processed into the insulating layer 125. Specifically, the first etching treatment might be stopped after only part of the insulating film 125A is thinned. In the case where the insulating film 125A is formed using a material similar to that for the mask layer 118a and accordingly the boundary between the insulating film 125A and the mask layer 118a is unclear, whether the insulating layer 125 is formed or whether the mask layer 118a is thinned cannot be determined in some cases.

Although FIG. 14B and FIG. 16B illustrate an example where the shape of the insulating layer 127b is not changed from that in FIG. 14A and FIG. 16A, the present invention is not limited thereto. For example, the end portion of the insulating layer 127b droops to cover the end portion of the insulating layer 125 in some cases. In another case, the end portion of the insulating layer 127b is in contact with the top surface of the mask layer 118a, for example. As described above, in the case where light exposure is not performed on the insulating layer 127b after development, the shape of the insulating layer 127b is likely to change in some cases.

Figure 15A:
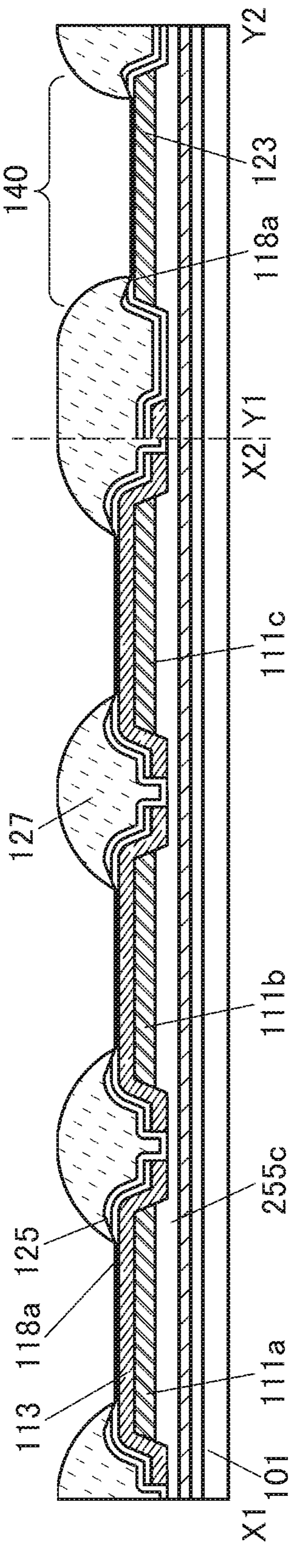
FIG. 15A and FIG. 15B are cross-sectional views illustrating the example of a method for fabricating a display apparatus.
Figure 16C:
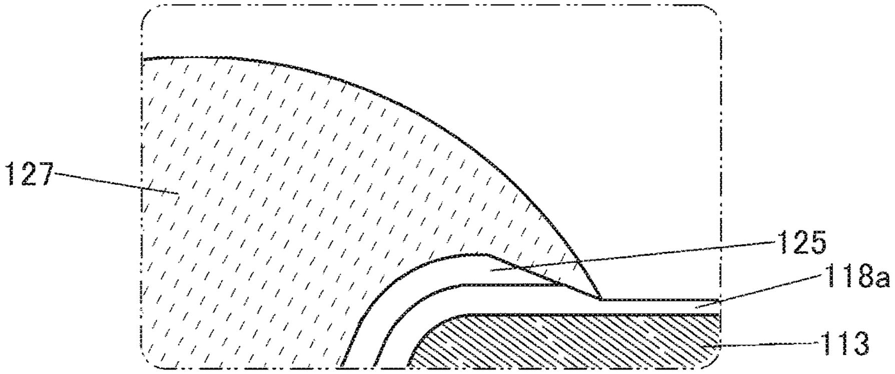

Then, heat treatment (also referred to as post-baking) is performed. As illustrated in FIG. 15A and FIG. 16C, the heat treatment can change the insulating layer 127b into the insulating layer 127 with a tapered side surface. As described above, in some cases, the insulating layer 127b is already changed in shape and has a tapered side surface at the time when the first etching treatment is finished. The heat treatment is performed at a temperature lower than the upper temperature limit of the EL layer. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be an air atmosphere or an inert gas atmosphere. Moreover, the heating atmosphere may be an atmospheric-pressure atmosphere or a reduced-pressure atmosphere. The heat treatment is preferably performed in a reduced-pressure atmosphere, in which case drying at a lower temperature is possible. The heat treatment in this step is preferably performed at a higher substrate temperature than the heat treatment (pre-baking) after formation of the insulating film 127a. Accordingly, adhesion between the insulating layer 127 and the insulating layer 125 can be improved, and corrosion resistance of the insulating layer 127 can be increased. FIG. 16C is an enlarged view of the end portions of the first layer 113 and the insulating layer 127 illustrated in FIG. 15A and their vicinities.

The first etching treatment does not remove the mask layer 118a completely to make the thinned mask layer 118a remain, thereby preventing the first layer 113 from being damaged by the heat treatment and deteriorating. This improves the reliability of the light-emitting device.

As illustrated in FIG. 4A and FIG. 4B, the side surface of the insulating layer 127 might have a concave shape depending on the materials for the insulating layer 127, and the temperature, time, and atmosphere of post-baking. For example, the insulating layer 127 is more likely to be changed in shape to have a concave shape as the post-baking is performed at higher temperature or for a longer time. In addition, as described above, the insulating layer 127 is sometimes likely to be changed in shape at the time of post-baking, in the case where light exposure is not performed on the insulating layer 127*b* after development.

Figure 15B:
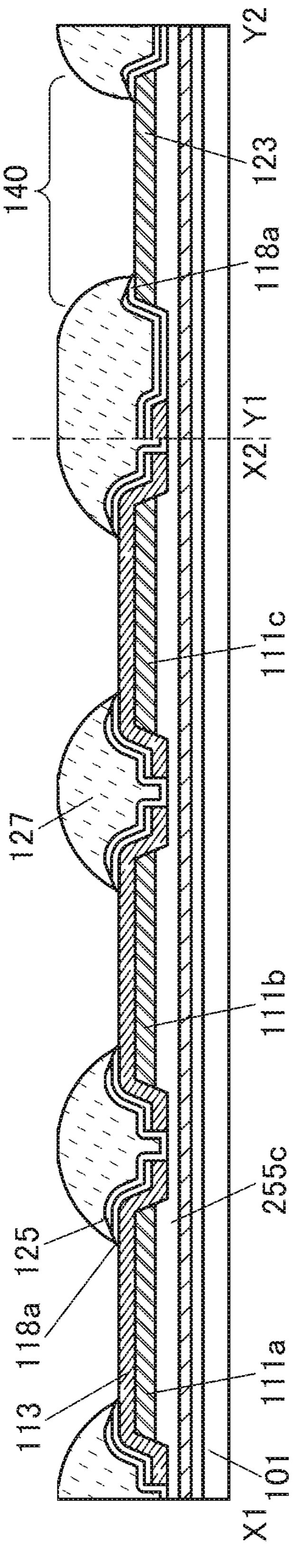
Figure 16D:
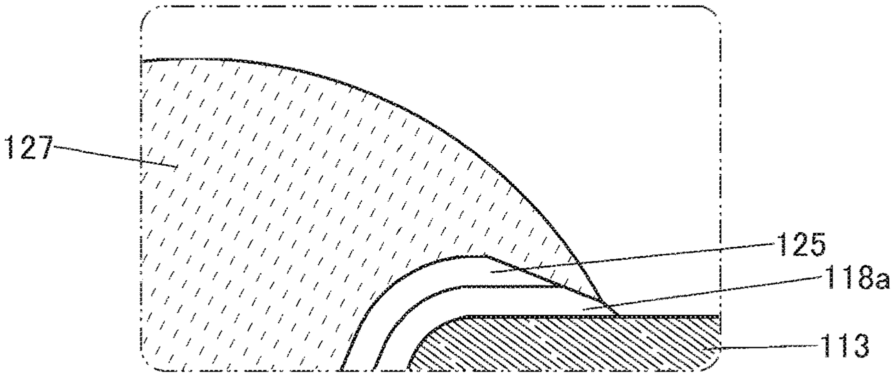

Next, as illustrated in FIG. 15B and FIG. 16D, etching treatment is performed using the insulating layer 127 as a mask to remove part of the mask layer 118*a*. Note that part of the insulating layer 125 is also removed in some cases. Consequently, openings are formed in the mask layer 118*a*, and the top surfaces of the first layer 113 and the conductive layer 123 are exposed. Note that FIG. 16D is an enlarged view of the end portions of the second first layer 113 and the insulating layer 127 illustrated in FIG. 15B and their vicinities. Note that the etching treatment using the insulating layer 127 as a mask may be hereinafter referred to as second etching treatment.

The end portion of the insulating layer 125 is covered with the insulating layer 127. FIG. 15B and FIG. 16D illustrate an example where part of the end portion of the mask layer 118*a* (specifically, a tapered portion formed by the first etching treatment) is covered with the insulating layer 127 and the tapered portion formed by the second etching treatment is exposed. That is, the structure in FIG. 15B and FIG. 16D corresponds to that in FIG. 2A and FIG. 2B.

If the first etching treatment is not performed and the insulating layer 125 and the mask layer are collectively etched after the post-baking, the insulating layer 125 and the mask layer under the end portion of the insulating layer 127 may disappear because of side etching and a cavity may be formed. The cavity causes unevenness in the formation surface of the common layer 114 and the common electrode 115, so that step disconnection is likely to occur in the common layer 114 and the common electrode 115. Even when a cavity is formed owing to side etching of the insulating layer 125 and the mask layer by the first etching treatment, the post-baking performed subsequently can make the insulating layer 127 fill the cavity. After that, the thinned mask layer is etched by the second etching treatment; thus, the amount of side etching decreases, a cavity is less likely to be formed, and even if a cavity is formed, it can be extremely small. Therefore, the formation surface of the common layer 114 and the common electrode 115 can be flatter.

Note that as illustrated in FIG. 3A, FIG. 3B, FIG. 5A, and FIG. 5B, the insulating layer 127 may cover the entire end portion of the mask layer 118*a*. For example, the end portion of the insulating layer 127 droops to cover the end portion of the mask layer 118*a* in some cases. In another case, the end portion of the insulating layer 127 is in contact with the top surface of the first layer 113, for example. As described above, in the case where light exposure is not performed on the insulating layer 127*b* after development, the shape of the insulating layer 127 is likely to change in some cases.

The second etching treatment is preferably performed by wet etching. The use of a wet etching method can reduce damage to the first layer 113 as compared with the case of using a dry etching method. The wet etching can be performed using an alkaline solution or the like.

As described above, by providing the insulating layer 127, the insulating layer 125, and the mask layer 118*a*, a connection defect due to a disconnected portion and an increase in electric resistance due to a locally thinned portion can be prevented from occurring in the common layer 114 and the common electrode 115 between the light-emitting devices. Thus, the display apparatus of one embodiment of the present invention can have improved display quality.

After part of the first layer 113 is exposed, additional heat treatment may be performed. The heat treatment can remove water contained in the EL layer, water adsorbed onto the surface of the EL layer, and the like. The shape of the insulating layer 127 may be changed by the heat treatment. Specifically, the insulating layer 127 may be extended to cover at least one of the end portion of the insulating layer 125, the end portion of the mask layer 118*a*, and the top surface of the first layer 113. For example, the insulating layer 127 may have a shape illustrated in FIG. 3A and FIG. 3B. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case dehydration at a lower temperature is possible. Note that the temperature range of the heat treatment is preferably set as appropriate in consideration of the upper temperature limit of the EL layer. In consideration of the upper temperature limit of the EL layer, temperatures from 70° C. to 120° C. are particularly preferable in the above temperature range.

Next, the common layer 114, the common electrode 115, and the protective layer 131 are formed in this order over the insulating layer 127 and the first layer 113, and the coloring layers 132R, 132G, and 132B are formed over the protective layer 131. In addition, the substrate 120 is attached onto the protective layer 131 and the coloring layers with the resin layer 122, whereby the display apparatus can be fabricated (FIG. 1).

The common layer 114 can be formed by an evaporation method (including a vacuum evaporation method), a transfer method, a printing method, an inkjet method, a coating method, or the like.

The common electrode 115 can be formed by a sputtering method or a vacuum evaporation method, for example. Alternatively, a film formed by an evaporation method and a film formed by a sputtering method may be stacked.

Examples of methods for forming the protective layer 131 include a vacuum evaporation method, a sputtering method, a CVD method, and an ALD method.

Fabrication Method Example 2

Fabrication method example 2 mainly describes a method for fabricating the display apparatus illustrated in FIG. 7. Note that detailed description of portions similar to those in Fabrication method example 1 is omitted. First, steps illustrated in FIG. 12 and FIG. 13 are performed. Specifically, the insulating layer 255*a*, the insulating layer 255*b*, and the insulating layer 255*c* are formed in this order over the layer 101 including transistors. Next, the pixel electrodes 111*a*, 111*b*, and 111*c*, and the conductive layer 123 are formed over the insulating layer 255*c*. Then, a stacked-layer structure of the first layer 113 and the mask layer 118*a* is formed over each of the pixel electrode 111*a*, the pixel electrode 111*b*, and the pixel electrode **1*l*1***c*. Next, an insulating film 125A that is to be the insulating layer 125 later is formed to cover the pixel electrode, the first layer 113, and the mask layer 118*a*. Sequentially, the insulating film 127*a* is formed over the insulating film 125A. Then, light exposure and development are performed, whereby the insulating layer 127*b* is formed as illustrated in FIG. 17A.

Figures 17A, 17B, 17C:
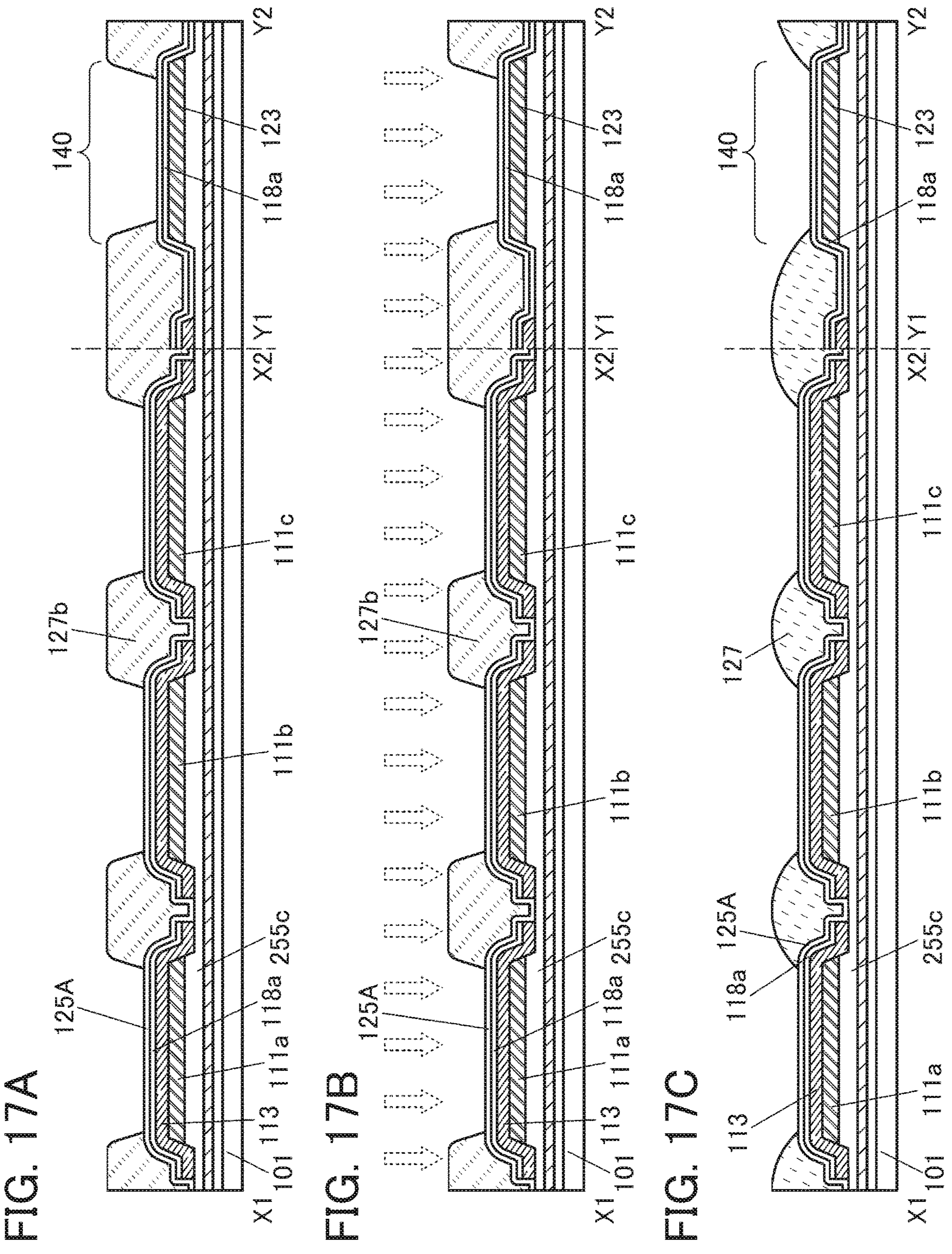
FIG. 17A to FIG. 17C are cross-sectional views illustrating the example of a method for fabricating a display apparatus.

Next, as illustrated in FIG. 17B, light exposure is preferably performed on the entire substrate so that the insulating layer 127*b* is irradiated with visible light or ultraviolet light. The energy density for the light exposure is greater than 0 $mJ/cm^2$ and less than or equal to 800 $mJ/cm^2$, preferably greater than 0 $mJ/cm^2$ and less than or equal to 500 $mJ/cm^2$. Performing such light exposure after development can improve the transparency of the insulating layer 127*b* in some cases. In addition, it is sometimes possible to lower the substrate temperature required for subsequent heat treatment for changing the shape of the insulating layer 127*b* into a tapered shape.

Then, heat treatment (also referred to as post-baking) is performed. As illustrated in FIG. 17C, the heat treatment can change the insulating layer 127*b* into the insulating layer 127 with a tapered side surface. The heat treatment is performed at a temperature lower than the upper temperature limit of the EL layer. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be an air atmosphere or an inert gas atmosphere. Moreover, the heating atmosphere may be an atmospheric-pressure atmosphere or a reduced-pressure atmosphere. The heat treatment is preferably performed in a reduced-pressure atmosphere, in which case drying at a lower temperature is possible. The heat treatment in this step is preferably performed at a higher substrate temperature than pre-baking. Accordingly, adhesion between the insulating layer 127 and the insulating layer 125 can be improved, and corrosion resistance of the insulating layer 127 can be increased.

Note that in the case where the insulating layer 127 can be processed into a tapered shape only by the heat treatment illustrated in FIG. 17C, the light exposure illustrated in FIG. 17B is not necessarily performed.

Heat treatment may be further performed after the insulating layer 127 is processed into a tapered shape. The heat treatment can remove water contained in the EL layer, water adsorbed onto the surface of the EL layer, and the like. The shape of the insulating layer 127 may be changed by the heat treatment. Specifically, the insulating layer 127 may be extended to cover at least one of the end portion of the insulating layer 125, the end portion of the mask layer 118*a*, and the top surface of the first layer 113. For the conditions of the heat treatment, the conditions of the heat treatment having the same effect described in Fabrication method example 1 can be referred to.

Etching may be performed so that the surface level of the insulating layer 127 is adjusted. The insulating layer 127 may be processed by ashing using oxygen plasma, for example.

Figure 18A:
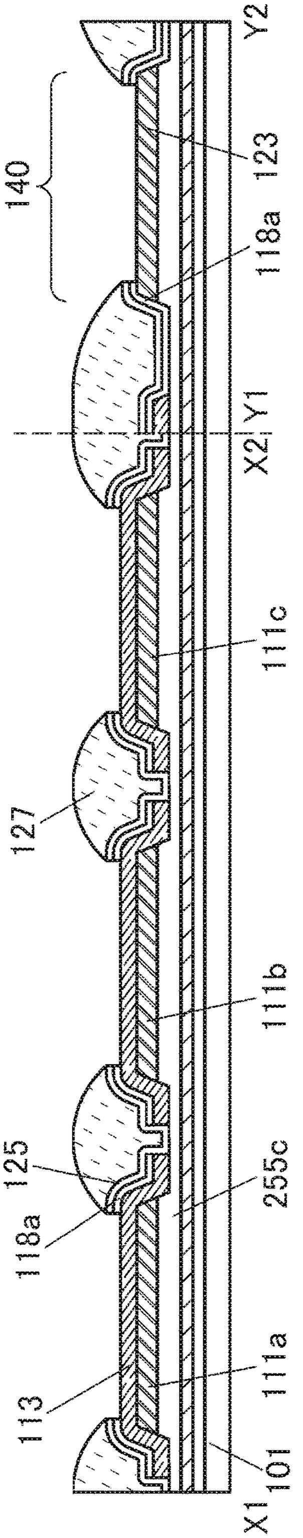
FIG. 18A to FIG. 18C are cross-sectional views illustrating the example of a method for fabricating a display apparatus.

Next, as illustrated in FIG. 18A, part of the insulating film 125A and part of the mask layer 118*a* are removed to expose the first layer 113 and the conductive layer 123.

The mask layer 118*a* and the insulating film 125A may be removed in different steps or the same step. The sacrificial layer 118*a* and the insulating film 125A are preferably films that are formed using the same material, for example, in which case they can be removed in the same step. For the mask layer 118*a* and the insulating film 125A, insulating films are preferably formed by an ALD method, and aluminum oxide films are further preferably formed by an ALD method, for example.

As illustrated in FIG. 18A, a region of the insulating film 125A overlapping with the insulating layer 127 remains as the insulating layer 125. A region of the mask layer 118*a* overlapping with the insulating layer 127 remain.

The insulating layer 125 (furthermore, the insulating layer 127) is provided to cover the side surfaces of the pixel electrodes 111*a*, 111*b*, and 111*c* and the side surface and part of the top surface of the first layer 113. This inhibits the side surfaces of these layers from being in contact with a film to be formed later, thereby inhibiting a short circuit of the light-emitting device. In addition, damage to the first layer 113 in a later step can be inhibited.

Figure 18B:
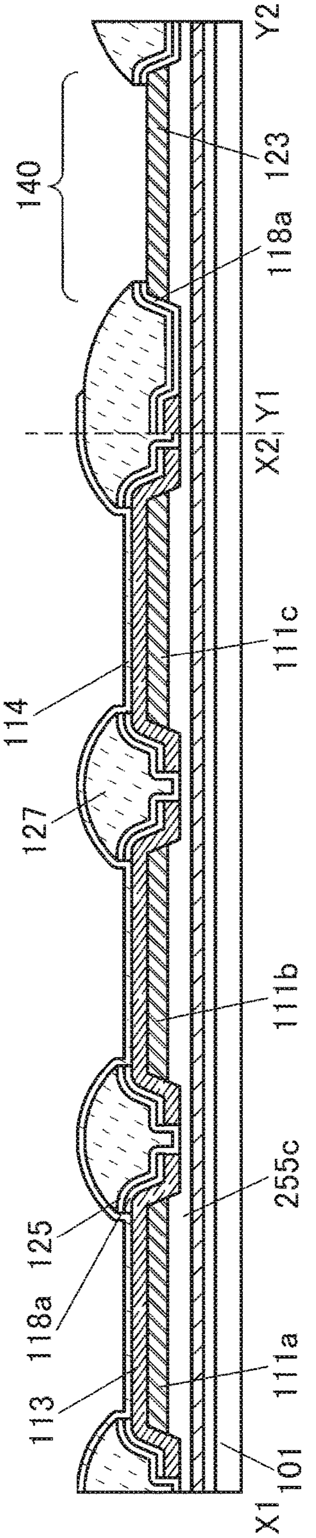

Next, as illustrated in FIG. 18B, the common layer 114 is formed to cover the insulating layer 125, the insulating layer 127, the mask layer 118*a*, and the first layer 113.

Since the gap between adjacent first layers 113 is filled with the insulating layers 125 and 127, the formation surface of the common layer 114 has a small level difference and thus becomes flat as compared to the case where the insulating layers 125 and 127 are not provided. This can improve the coverage with the common layer 114.

Figure 18C:
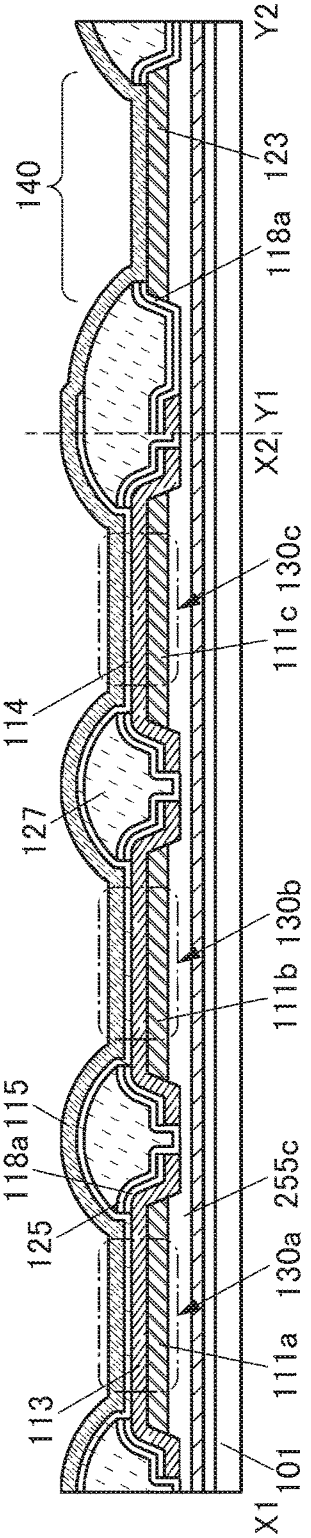

Then, the common electrode 115 is formed over the common layer 114 and the conductive layer 123 as illustrated in FIG. 18C. Next, the protective layer 131 is formed over the common electrode 115, and the coloring layers 132R, 132G, and 132B are formed over the protective layer 131. In addition, the substrate 120 is attached onto the protective layer 131 and the coloring layers with the resin layer 122, whereby the display apparatus can be fabricated.

Fabrication method example 1 includes, after a development step for forming the insulating layer 127*b*, two etching steps and a post-baking step between the two etching steps. In Fabrication method example 2, a post-baking step is performed after the development step, and then one etching step is performed. Either of the methods can make the end portion of the insulating layer 127 have a tapered shape with a taper angle less than 90°. Thus, the common layer 114 and the common electrode 115 that are provided over the insulating layer 127 can be prevented from being disconnected. In Fabrication method example 1, the etching step is divided into two steps, whereby the formation surface the common layer 114 and the common electrode 115 can be flatter. In Fabrication method example 2, the number of steps and the time taken for the steps can be reduced as compared to Fabrication method example 1.

Formation Method Example 3

Figure 19A:
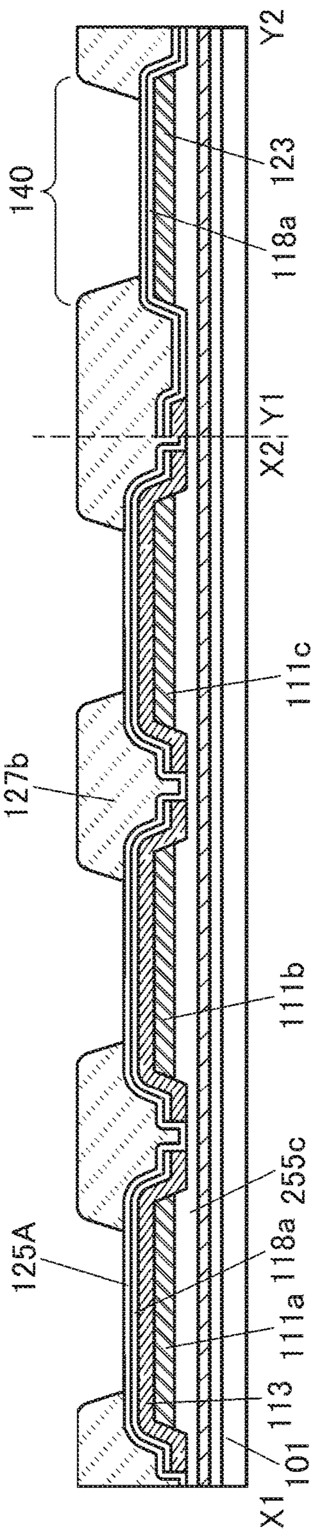
FIG. 19A to FIG. 19C are cross-sectional views illustrating the example of a method for fabricating a display apparatus.

Fabrication method example 3 mainly describes a method for fabricating the display apparatus illustrated in FIG. 8. Note that detailed description of portions similar to those in Fabrication method example 1 is omitted. First, the steps illustrated in FIG. 12 and FIG. 13 are performed. Specifically, the insulating layer 255*a*, the insulating layer 255*b*, and the insulating layer 255*c* are formed in this order over the layer 101 including transistors. Next, the pixel electrodes 111*a*, 111*b*, and 111*c*, and the conductive layer 123 are formed over the insulating layer 255*c*. Then, a stacked-layer structure of the first layer 113 and the mask layer 118*a* is formed over the pixel electrode 111*a*, the pixel electrode 111*b*, and the pixel electrode 111*c*. Next, the insulating film 125A that is to be the insulating layer 125 later is formed to cover the pixel electrode, the first layer 113, and the mask layer 118*a*. Sequentially, the insulating film 127*a* is formed over the insulating film 125A. Then, light exposure and development are performed, whereby the insulating layer 127*b* is formed as illustrated in FIG. 19A.

Figure 19B:
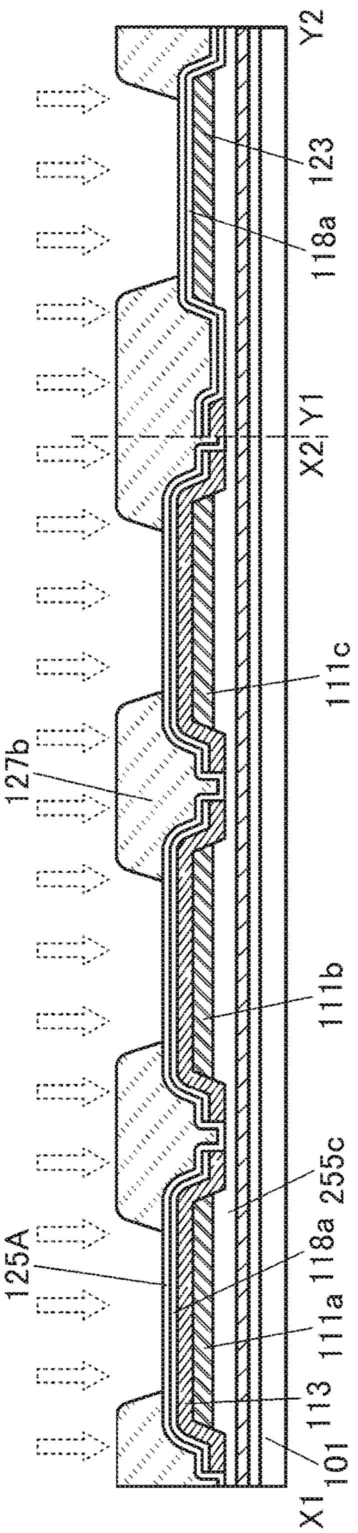
Figure 19C:
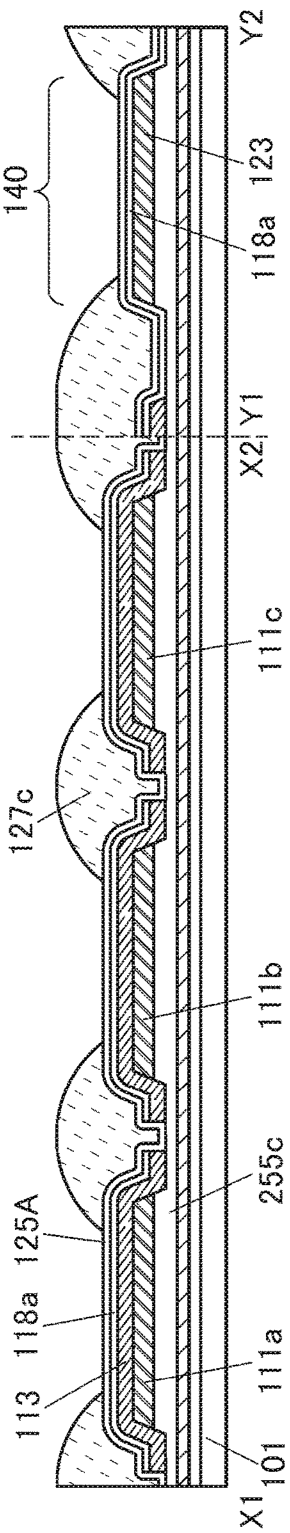

Next, as illustrated in FIG. 19B, light exposure is preferably performed on the entire substrate so that the insulating layer 127*b* is irradiated with visible light or ultraviolet light. Then, heat treatment (also referred to as post-baking) is performed. As illustrated in FIG. 19C, the heat treatment can change the insulating layer 127*b* into an insulating layer 127*c* with a tapered side surface. Since the steps illustrated in FIG. 19B and FIG. 19C are similar to those described with reference to FIG. 17B and FIG. 17C in Fabrication method example 2, the above-described contents can be referred to.

Figures 20A, 20B, 20C:
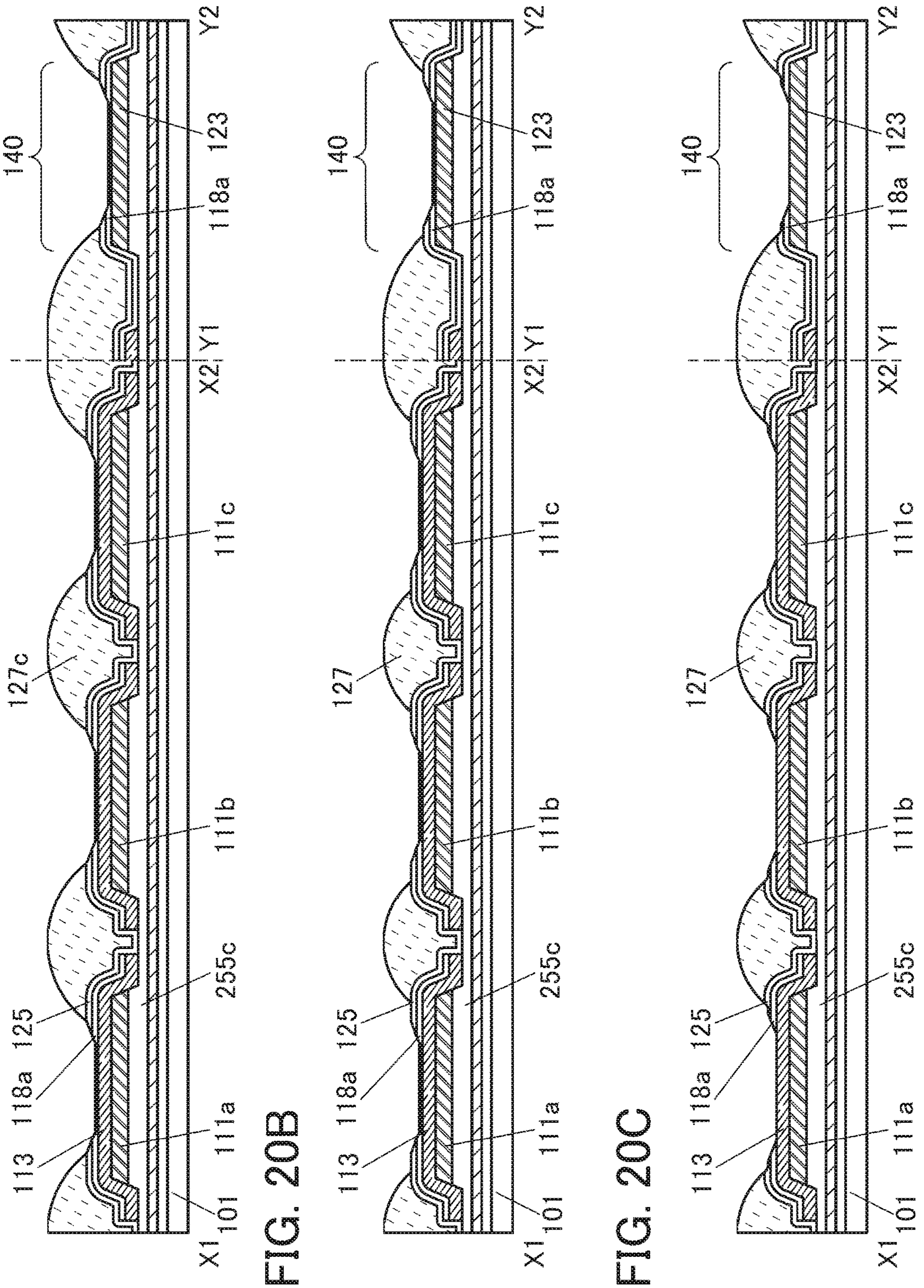
FIG. 20A to FIG. 20C are cross-sectional views illustrating the example of a method for fabricating a display apparatus.
Figure 21A:
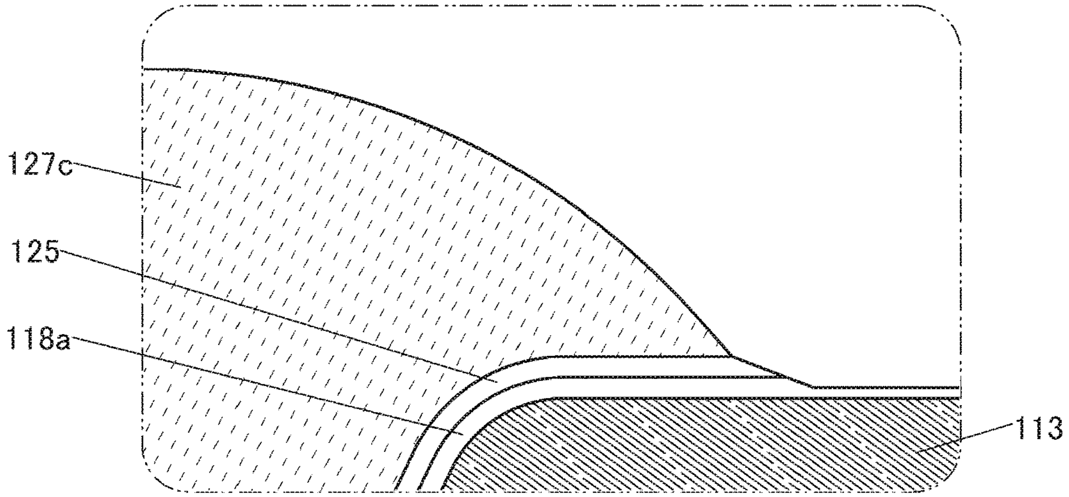
FIG. 21A to FIG. 21C are cross-sectional views illustrating the example of a method for fabricating a display apparatus.

Next, as illustrated in FIG. 20A and FIG. 21A, etching treatment is performed using the insulating layer 127*c* as a mask to remove part of the insulating film 125A, so that the mask layer 118*a* is partly thinned. Note that FIG. 21A is an enlarged view of the end portions of the first layer 113 and the insulating layer 127*c* illustrated in FIG. 20A and their vicinities. Accordingly, the insulating layer 125 is formed below the insulating layer 127*c*. In addition, the surface of the thinned portion of the mask layer 118*a* is exposed. Note that the etching treatment performed using the insulating layer 127*c* as a mask can be regarded as being similar to the first etching treatment described in Fabrication method example 1 except that it is performed after the post baking. Thus, the description of the first etching treatment can be referred to for the details. In addition, the etching treatment using the insulating layer 127*c* as a mask is referred to as the first etching treatment below in some cases.

As illustrated in FIG. 20A and FIG. 21A, etching is performed using the insulating layer 127*c* with a tapered side surface as a mask, so that the side surface of the insulating layer 125, the upper end portion of the side surface of the mask layer 118*a* can be tapered relatively easily.

The first etching treatment is preferably performed by wet etching. The use of a wet etching method can reduce damage to the first layer 113 as compared with the case of using a dry etching method.

As illustrated in FIG. 20A and FIG. 21A, in the first etching treatment, the etching treatment is stopped when the mask layer 118*a* is thinned, before the mask layer is completely removed. In this manner, the mask layer 118*a* is made to remain over the corresponding first layer 113, whereby the first layer 113 can be prevented from being damaged by treatment in a later step.

Although the mask layer 118*a* is thinned in FIG. 20A and FIG. 21A, the present invention is not limited thereto. For example, depending on the thickness of the insulating film 125A and the thickness of the mask layer 118*a*, the first etching treatment might be stopped before the insulating film 125A is processed into the insulating layer 125. Specifically, the first etching treatment might be stopped after only part of the insulating film 125A is thinned. In the case where the insulating film 125A is formed using a material similar to that for the mask layer 118*a* and accordingly the boundary between the insulating film 125A and the mask layer 118*a* is unclear, whether the insulating layer 125 is formed or whether the mask layer 118*a* is thinned cannot be determined in some cases.

Although FIG. 20A illustrates an example where the shape of the insulating layer 127*c* is not changed from that in FIG. 19C, the present invention is not limited thereto. For example, the end portion of the insulating layer 127*c* droops to cover the end portion of the insulating layer 125 in some cases. In another case, the end portion of the insulating layer 127*c* is in contact with the top surface of the mask layer 118*a*, for example. As described above, in the case where light exposure is not performed on the insulating layer 127*c* after development, the shape of the insulating layer 127*c* is likely to change in some cases.

Figure 21B:
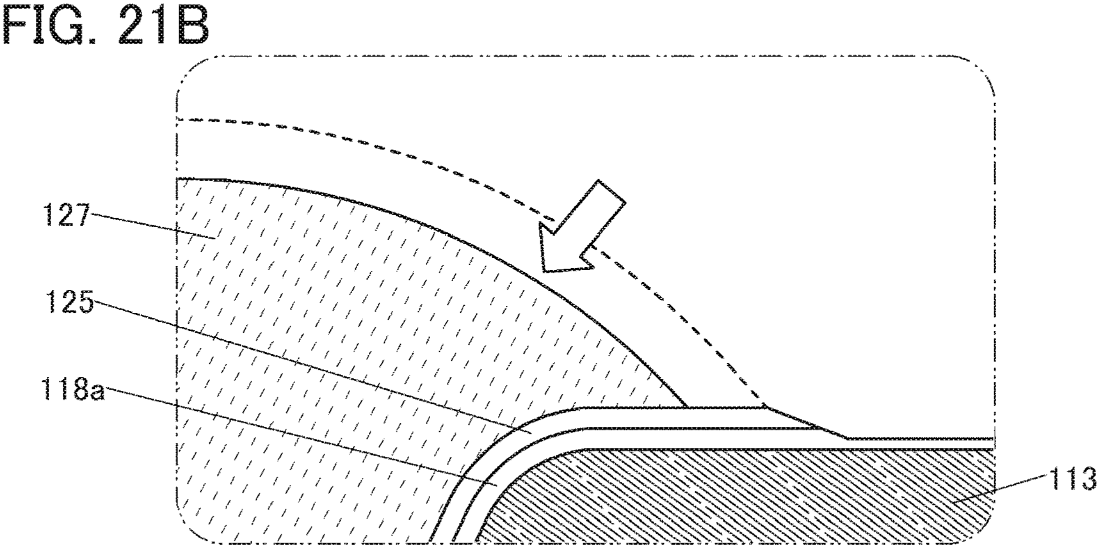

Next, plasma treatment is performed as illustrated in FIG. 20B and FIG. 21B to shrink the insulating layer 127*c*, so that the insulating layer 127 is formed. FIG. 21B is an enlarged view of the end portions of the first layer 113 and the insulating layer 127 illustrated in FIG. 20B and their vicinities. The plasma treatment can be performed with the aforementioned dry etching apparatus. In this case, the plasma treatment is preferably performed in an oxygen atmosphere without application of a bias voltage.

As illustrated in FIG. 21B, the end portion of the insulating layer 127 is recessed by the plasma treatment, so that the top surface of the insulating layer 125 is exposed. When the insulating layer 125 is provided to have a portion exposed from the insulating layer 127 in this manner, it is possible to inhibit the side etching from proceeding deeply under the insulating layer 127 in the following wet etching step.

Furthermore, the level of the insulating layer 127 can be adjusted by shrinking the insulating layer 127*c* by the plasma treatment.

The insulating layer 127 is shrunk keeping a shape substantially similar to that of the insulating layer 127*c*; thus, as illustrated in FIG. 8B, the end portion of the insulating layer 127 has a tapered shape with the taper angle θ1 and the top surface of the insulating layer 127 has a convex shape in a cross-sectional view of the display apparatus. When the insulating layer 127 has such a shape, the common layer 114 and the common electrode 115 can be formed with favorable coverage over the whole the insulating layer 127.

Figure 21C:
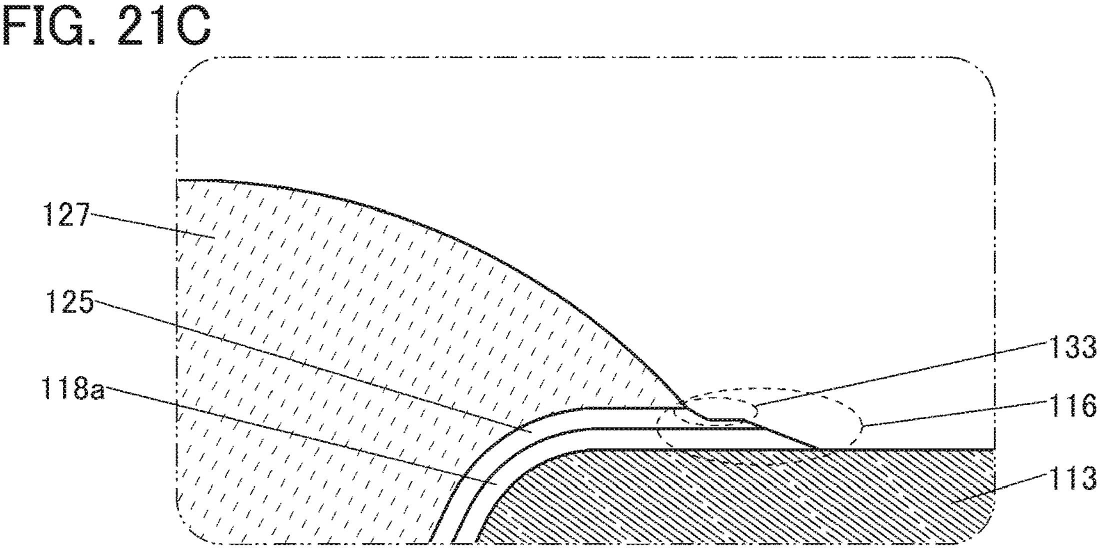

Next, as illustrated in FIG. 20C and FIG. 21C, etching treatment is performed using the insulating layer 127 as a mask to remove part of the insulating layer 125 and part of the mask layer 118*a*. Consequently, openings are formed in the mask layers 118*a*, and the top surfaces of the first layers 113 and the conductive layer 123 are exposed. Note that FIG. 21C is an enlarged view of the end portions of the first layer 113 and the insulating layer 127 illustrated in FIG. 20C and their vicinities. Note that the etching treatment performed using the insulating layer 127 as a mask can be regarded as being similar to the second etching treatment described in Fabrication method example 1 except that it is performed after the step of shrinking the insulating layer 127*c*. Thus, the description of the second etching treatment can be referred to for the details. In addition, the etching treatment using the insulating layer 127 as a mask is hereinafter referred to as second etching treatment in some cases.

The second etching treatment is preferably performed by wet etching. The use of a wet etching method can reduce damage to the first layer 113 as compared with the case of using a dry etching method.

By the second etching treatment, the protruding portion 116 of the mask layer 118*a* and the insulating layer 125 is formed over the first layer 113 and the pixel electrode as illustrated in FIG. 20C and FIG. 21C. The protruding portion 116 is positioned outward from the insulating layer 127 in a cross-sectional view.

The protruding portion 116 preferably has a tapered shape with the taper angle θ3 as illustrated in FIG. 8B. When the protruding portion 116 has such a forward tapered shape, coverage with the common layer 114 and the common electrode 115 that are provided over the protruding portion 116 can be improved.

As illustrated in FIG. 8B, the insulating layer 125 in the protruding portion 116 includes a portion with a thickness smaller than a portion of the insulating layer 125 overlapping with the insulating layer 127, i.e., the depression portion 135.

If the first etching treatment is not performed and the insulating layer 125 and the mask layer 118*a* are collectively etched after the post-baking, the insulating layer 125 and the mask layer 118*a* under the end portion of the insulating layer 127*c* may disappear because of side etching and a cavity may be formed. The cavity causes unevenness in the formation surface of the common layer 114 and the common electrode 115, so that step disconnection is likely to occur in the common layer 114 and the common electrode 115. Even when a cavity is formed due to side etching of the insulating layer 125 and the mask layer 118*a* by the first etching treatment, the cavity can be canceled by shrinking the insulating layer 127*c* after that. After that, the thinned mask layer is etched by the second etching treatment; thus, the amount of side etching decreases, a cavity is less likely to be formed, and even if a cavity is formed, it can be extremely small. Thus, the formation surface of the common layer 114 and the common electrode 115 can be flatter and accordingly step disconnection of the common layer 114 and the common electrode 115 can be inhibited.

As described above, by providing the insulating layer 127, the insulating layer 125, and the mask layer 118*a*, a connection defect due to a disconnected portion and an increase in electric resistance due to a locally thinned portion can be prevented from occurring in the common layer 114 and the common electrode 115 between the light-emitting devices. Thus, the display apparatus of one embodiment of the present invention can have improved display quality.

Next, the common layer 114, the common electrode 115, and the protective layer 131 are formed in this order over the insulating layer 127 and the first layer 113, and the coloring layers 132R, 132G, and 132B are formed over the protective layer 131. In addition, the substrate 120 is attached onto the protective layer 131 and the coloring layers with the resin layer 122, whereby the display apparatus can be fabricated.

Fabrication method example 1 includes, after a development step for forming the insulating layer 127*b*, two etching steps and a post-baking step between the two etching steps. In Fabrication method example 3, a post-baking step is performed after the development step, and then two etching steps and a step of shrinking the insulating layer 127*c* between the two etching steps are performed. Either of the methods can make the end portion of the insulating layer 127 have a tapered shape with a taper angle less than 90°. In addition, by dividing the etching into two steps, the formation surface of the common layer 114 and the common electrode 115 can be flatter. Thus, the common layer 114 and the common electrode 115 that are provided over the insulating layer 127, can be prevented from being disconnected. The shape stability of the insulating layer 127 is changed by the post-baking step. As described in Fabrication method example 1 and Fabrication method example 3, examples of a means for forming the insulating layer 127 into a desired shape include not only selection of materials and processing conditions but also timing control of post-baking.

As described above, in the method for fabricating a display apparatus of this embodiment, the island-shaped EL layers are formed not by using a fine metal mask but by processing an EL layer formed over the entire surface. Thus, the size of the EL layer can be made smaller than the size of the layer formed using a fine metal mask. Accordingly, a high-resolution display apparatus or a display apparatus with a high aperture ratio, which has been difficult to achieve, can be achieved. Furthermore, even when the resolution or the aperture ratio is high owing to an extremely short distance between subpixels, contact between the island-shaped EL layers of the adjacent subpixels can be inhibited. As a result, generation of a leakage current between the subpixels can be inhibited. Accordingly, degradation of the display quality of the display apparatus can be inhibited. In addition, both the higher resolution and higher display quality of the display apparatus can be achieved.

The insulating layer 127 having a tapered end portion and being provided between adjacent island-shaped EL layers can inhibit occurrence of step disconnection and prevent formation of a locally thinned portion in the common electrode 115 at the time of forming the common electrode 115. Thus, a connection defect due to a disconnected portion and an increase in electric resistance due to a locally thinned portion can be inhibited from occurring in the common layer 114 and the common electrode 115.

This embodiment can be combined with the other embodiments as appropriate.

Embodiment 3

In this embodiment, display apparatuses of one embodiment of the present invention are described with reference to FIG. 22 and FIG. 23.

[Pixel Layout]

In this embodiment, pixel layouts different from the layout in FIG. 1A will be mainly described. There is no particular limitation on the arrangement of subpixels, and any of a variety of methods can be employed. Examples of the arrangement of subpixels include stripe arrangement, S-stripe arrangement, matrix arrangement, delta arrangement, Bayer arrangement, and PenTile arrangement.

The top surface shape of the subpixel illustrated in a diagram in this embodiment corresponds to the top surface shape of a light-emitting region (or a light-receiving region).

Examples of a top surface shape of the subpixel include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in a diagram and circuits may be placed outside the subpixels. The arrangement of the circuits and the arrangement of the light-emitting devices are not necessarily the same, and different arrangement methods may be employed. For example, the arrangement of the circuits may be stripe arrangement, and the arrangement of the light-emitting devices may be S-stripe arrangement.

Figure 22A:
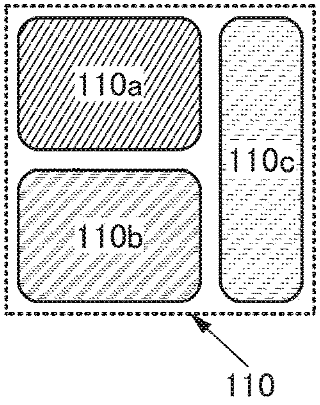
FIG. 22A to FIG. 22F are diagrams illustrating examples of a pixel.

The pixel 110 illustrated in FIG. 22A employs S-stripe arrangement. The pixel 110 illustrated in FIG. 22A is composed of three subpixels: the subpixels 110*a*, 110*b*, and 110*c*.

Figure 22B:
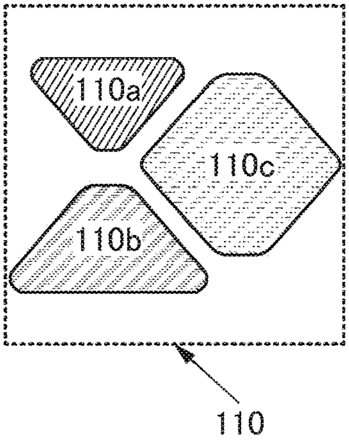

The pixel 110 illustrated in FIG. 22B includes the subpixel 110*a* whose top surface has a rough triangle or rough trapezoidal shape with rounded corners, the subpixel 110*b* whose top surface has a rough triangle or rough trapezoidal shape with rounded corners, and the subpixel 110*c* whose top surface has a rough tetragonal or rough hexagonal shape with rounded corners. The subpixel 110*b* has a larger light-emitting area than the subpixel 110*a*. In this manner, the shapes and sizes of the subpixels can be determined independently. For example, the size of a subpixel including a light-emitting device with higher reliability can be smaller.

Figure 22C:
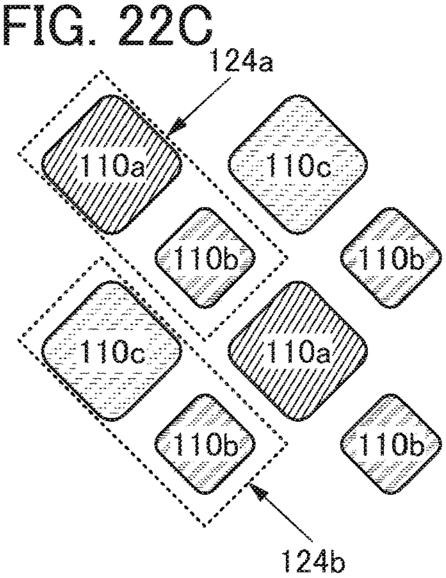

Pixels 124*a* and 124*b* illustrated in FIG. 22C employ PenTile arrangement. FIG. 22C illustrates an example where the pixels 124*a* including the subpixel 110*a* and the subpixel 110*b* and the pixels 124*b* including the subpixel 110*b* and the subpixel 110*c* are alternately arranged.

Figure 22D:
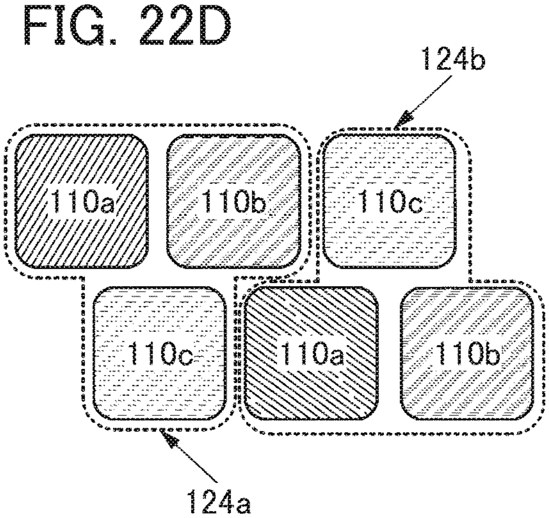
Figure 22E:
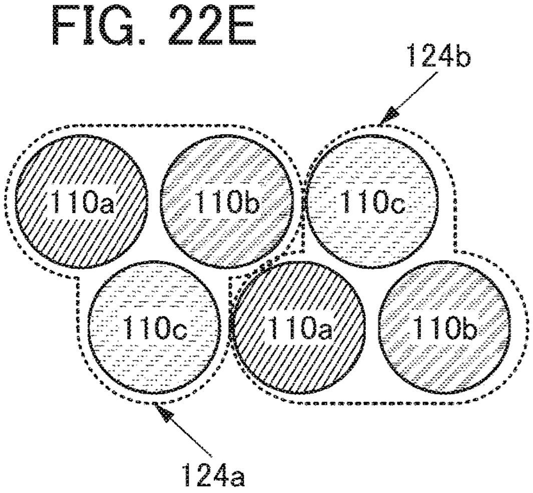

The pixels 124*a* and 124*b* illustrated in FIG. 22D and FIG. 22E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row).

FIG. 22D illustrates an example where a top surface of each subpixel has a rough tetragonal shape with rounded corners, and FIG. 22E illustrates an example where a top surface of each subpixel has a circular shape.

Figure 22F:
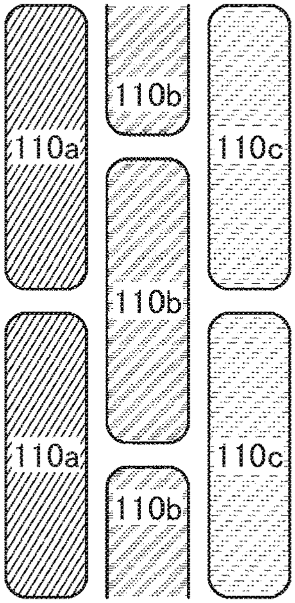

FIG. 22F illustrates an example where subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in a top view.

For example, in each pixel illustrated in FIG. 22A to FIG. 22F, it is preferable that the subpixel 110*a* be a subpixel R emitting red light, the subpixel 110*b* be a subpixel G emitting green light, and the subpixel 110*c* be a subpixel B emitting blue light. Note that the structure of the subpixels is not limited to this, and the colors and arrangement order of the subpixels can be determined as appropriate. For example, the subpixel 110*b* may be the subpixel R emitting red light and the subpixel 110*a* may be the subpixel G emitting green light.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, a top surface of a subpixel has a polygonal shape with rounded corners, an elliptical shape, a circular shape, or the like, in some cases.

Furthermore, in the method for fabricating the display apparatus of one embodiment of the present invention, the EL layer is processed into an island shape using a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape after being processed. As a result, the top surface of the EL layer may have a polygonal shape with rounded corners, an elliptical shape, a circular shape, or the like. For example, when a resist mask whose top surface has a square shape is intended to be formed, a resist mask whose top surface has a circular shape may be formed, and the top surface of the EL layer may have a circular shape.

Note that to obtain a desired top surface shape of the EL layer, a technique of correcting a mask pattern in advance so that a transferred pattern agrees with a design pattern (OPC (Optical Proximity Correction) technique) may be used. Specifically, with the OPC technique, a pattern for correction is added to a corner portion or the like of a figure on a mask pattern.

As illustrated in FIG. 23A to FIG. 23I, the pixel can include four types of subpixels.

Figure 23A:
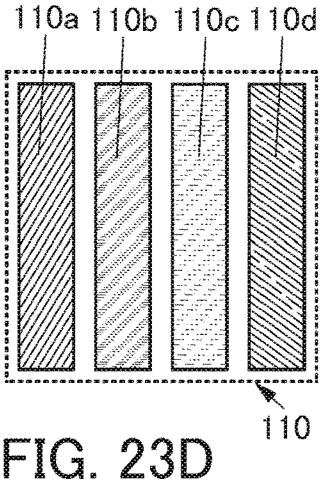
FIG. 23A to FIG. 23K are diagrams illustrating examples of a pixel.
Figure 23B:
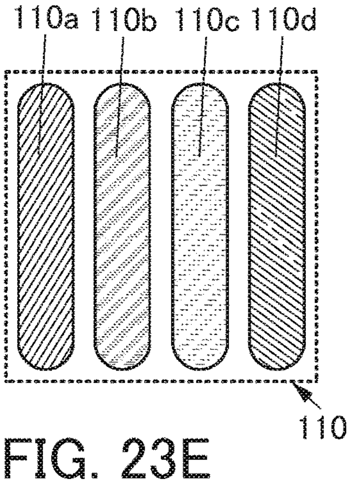
Figure 23C:
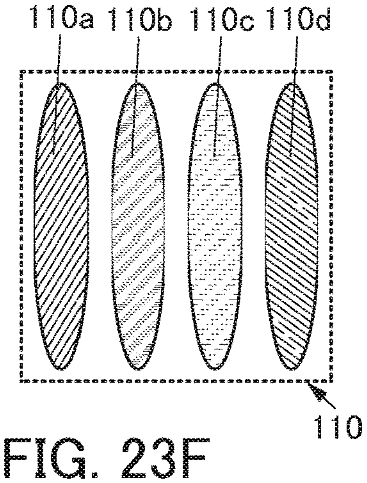

The pixels 110 illustrated in FIG. 23A to FIG. 23C employ stripe arrangement.

FIG. 23A illustrates an example where each subpixel has a rectangular top surface shape, FIG. 23B illustrates an example where each subpixel has a top surface shape formed by combining two half circles and a rectangle, and FIG. 23C illustrates an example where each subpixel has an elliptical top surface shape.

Figure 23D:
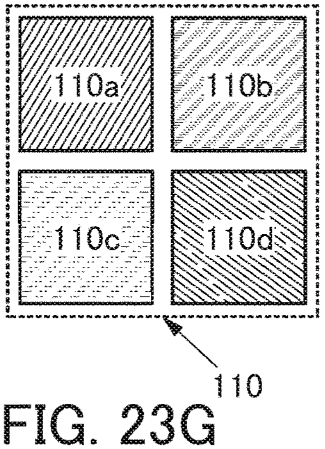
Figure 23E:
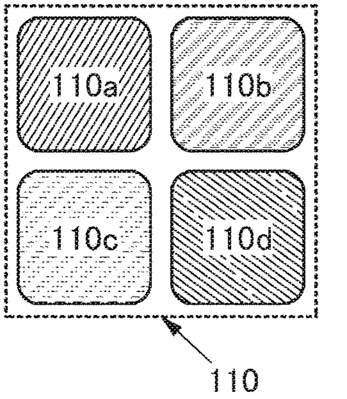
Figure 23F:
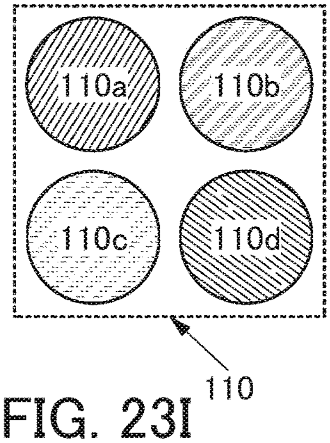

The pixels 110 illustrated in FIG. 23D to FIG. 23F employ matrix arrangement.

FIG. 23D illustrates an example where each subpixel has a square top surface shape, FIG. 23E illustrates an example where each subpixel has a rough square top surface shape with rounded corners, and FIG. 23F illustrates an example where each subpixel has a circular top surface shape.

Figure 23G:
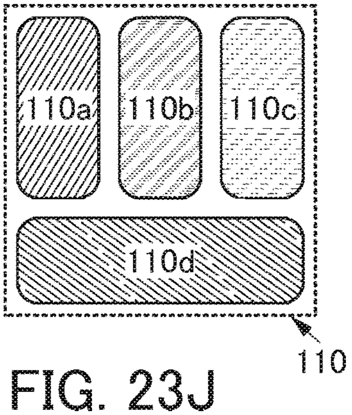
Figure 23H:
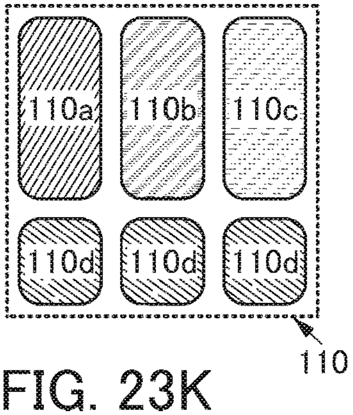

FIG. 23G and FIG. 23H each illustrate an example where one pixel 110 is composed of two rows and three columns.

The pixel 110 illustrated in FIG. 23G includes three subpixels (the subpixels 110*a*, 110*b*, and 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 23H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and the subpixel 110*d* in the center column (second column), and the subpixel 110*c* and the subpixel 110*d* in the right column (third column). Matching the positions of the subpixels in the upper row and the lower row as illustrated in FIG. 23H enables efficient removal of dust and the like that would be produced in the manufacturing process. Thus, a display apparatus with high display quality can be provided.

Figure 23I:
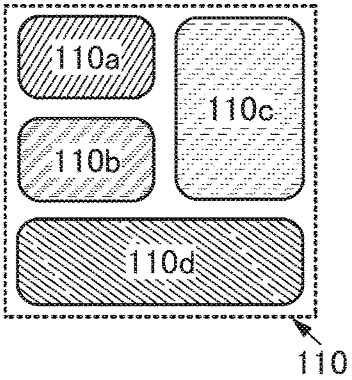

FIG. 23I illustrates an example where one pixel 110 is composed of three rows and two columns.

The pixel 110 illustrated in FIG. 23I includes the subpixel 110*a* in the upper row (first row), the subpixel 110*b* in the center row (second row), the subpixel 110*c* across the first and second rows, and one subpixel (the subpixel 110*d*) in the lower row (third row). In other words, the pixel 110 includes the subpixels 110*a* and 110*b* in the left column (first column), the subpixel 110*c* in the right column (second column), and the subpixel 110*d* across these two columns.

The pixels 110 illustrated in FIG. 23A to FIG. 23I are each composed of four subpixels: the subpixels 110*a*, 110*b*, 110*c*, and 110*d*.

The subpixels 110*a*, 110*b*, 110*c*, and 110*d* can include light-emitting devices emitting light of different colors. The subpixels 110*a*, 110*b*, 110*c*, and 110*d* can be subpixels of four colors of R, G, B, and white (W), subpixels of four colors of R, G, B, and Y, or subpixels of R, G, B, and infrared light (IR), for example.

In the pixels 110 illustrated in FIG. 23A to FIG. 23I, it is preferable that the subpixel 110*a* be the subpixel R emitting red light, the subpixel 110*b* be the subpixel G emitting green light, the subpixel 110*c* be the subpixel B emitting blue light, and the subpixel 110*d* be any of a subpixel W emitting white light, a subpixel Y emitting yellow light, and a subpixel IR emitting near-infrared light, for example. In the case of such a structure, stripe arrangement is employed as the layout of R, G, and B in the pixels 110 illustrated in FIG. 23G and FIG. 23H, leading to higher display quality. In addition, what is called S-stripe arrangement is employed as the layout of R, G, and B in the pixel 110 illustrated in FIG. 23I, leading to higher display quality.

The pixel 110 may include a subpixel including a light-receiving device.

In the pixels 110 illustrated in FIG. 23A to FIG. 23I, any one of the subpixel 110*a* to the subpixel 110*d* may be a subpixel including a light-receiving device.

In the pixels 110 illustrated in FIG. 23A to FIG. 23I, for example, it is preferable that the subpixel 110*a* be the subpixel R emitting red light, the subpixel 110*b* be the subpixel G emitting green light, the subpixel 110*c* be the subpixel B emitting blue light, and the subpixel 110*d* be a subpixel S including a light-receiving device. In the case of such a structure, stripe arrangement is employed as the layout of R, G, and B in the pixels 110 illustrated in FIG. 23G and FIG. 23H, leading to higher display quality. In addition, what is called S-stripe arrangement is employed as the layout of R, G, and B in the pixel 110 illustrated in FIG. 23I, leading to higher display quality.

There is no particular limitation on the wavelength of light detected by the subpixel S including a light-receiving device. The subpixel S can have a structure where one or both of visible light and infrared light are detected.

Figure 23J:
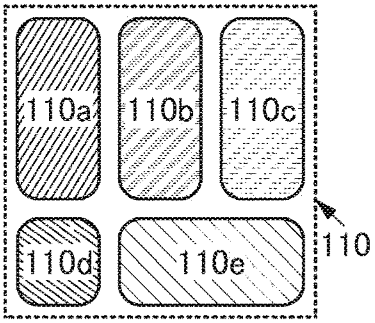
Figure 23K:
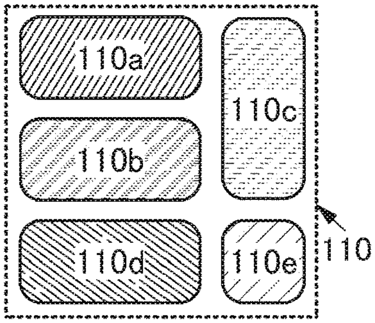

As illustrated in FIG. 23J and FIG. 23K, the pixel can include five types of subpixels.

FIG. 23J illustrates an example where one pixel 110 is composed of two rows and three columns.

The pixel 110 illustrated in FIG. 23J includes three subpixels (the subpixels 110*a*, 110*b*, and 110*c*) in the upper row (first row) and two subpixels (the subpixels 110*d* and 110*e*) in the lower row (second row). In other words, the pixel 110 includes the subpixels 110*a* and 110*d* in the left column (first column), the subpixel 110*b* in the center column (second column), the subpixel 110*c* in the right column (third column), and the subpixel 110*e* across the second and third columns.

FIG. 23K illustrates an example where one pixel 110 is composed of three rows and two columns.

The pixel 110 illustrated in FIG. 23K includes the subpixel 110*a* in the upper row (first row), the subpixel 110*b* in the center row (second row), the subpixel 110*c* across the first and second rows, and two subpixels (the subpixels 110*d* and 110*e*) in the lower row (third row). In other words, the pixel 110 includes the subpixels 110*a*, 110*b*, and 110*d* in the left column (first column), and the subpixels 110*c* and 110*e* in the right column (second column).

In the pixels 110 illustrated in FIG. 23J and FIG. 23K, for example, it is preferable that the subpixel 110*a* be the subpixel R emitting red light, the subpixel 110*b* be the subpixel G emitting green light, and the subpixel 110*c* be the subpixel B emitting blue light. In the case of such a structure, stripe arrangement is employed as the layout of R, G, and B in the pixel 110 illustrated in FIG. 23J, leading to higher display quality. In addition, what is called S-stripe arrangement is employed as the layout of R, G, and B in the pixel 110 illustrated in FIG. 23K, leading to higher display quality.

In the pixels 110 illustrated in FIG. 23J and FIG. 23K, for example, it is preferable to use the subpixel S including a light-receiving device as at least one of the subpixel 110*d* and the subpixel 110*e*. In the case where light-receiving devices are used in both the subpixel 110*d* and the subpixel 110*e*, the light-receiving devices may have different structures. For example, the wavelength ranges of detected light may be different at least partly. Specifically, one of the subpixel 110*d* and the subpixel 110*e* may include a light-receiving device mainly detecting visible light and the other may include a light-receiving device mainly detecting infrared light.

In the pixels 110 illustrated in FIG. 23J and FIG. 23K, for example, it is preferable that the subpixel S including a light-receiving device be used as one of the subpixel 110*d* and the subpixel 110*e* and a subpixel including a light-emitting device that can be used as a light source be used as the other. For example, it is preferable that one of the subpixel 110*d* and the subpixel 110*e* be the subpixel IR emitting infrared light and the other be the subpixel S including a light-receiving device detecting infrared light.

In a pixel including the subpixels R, G, B, IR, and S, while an image is displayed using the subpixels R, G, and B, reflected light of infrared light emitted by the subpixel IR that is used as a light source can be detected by the subpixel S.

As described above, the pixel composed of the subpixels each including the light-emitting device can employ any of a variety of layouts in the display apparatus of one embodiment of the present invention. The display apparatus of one embodiment of the present invention can have a structure where the pixel includes both a light-emitting device and a light-receiving device. Also in this case, any of a variety of layouts can be employed.

This embodiment can be combined with the other embodiments as appropriate.

Embodiment 4

In this embodiment, display apparatuses of one embodiment of the present invention are described with reference to FIG. 24 to FIG. 34.

The display apparatus of this embodiment can be a high-resolution display apparatus. Accordingly, the display apparatus of this embodiment can be used for display portions of information terminals (wearable devices) such as watch-type and bracelet-type information terminals and display portions of wearable devices that can be worn on the head, such as a VR device like a head-mounted display (HMD) and a glasses-type AR device.

The display apparatus of this embodiment can be a high-definition display apparatus or a large-sized display apparatus. Accordingly, the display apparatus of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Module]

Figure 24A:
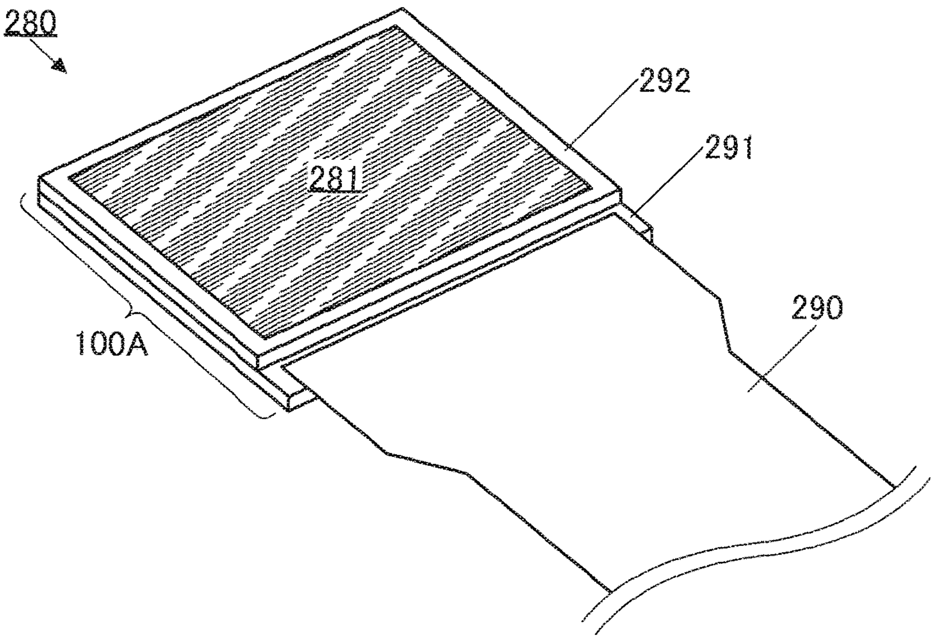
FIG. 24A and FIG. 24B are perspective views illustrating an example of a display apparatus.

FIG. 24A shows a perspective view of a display module 280. The display module 280 includes a display apparatus 100A and an FPC 290. Note that the display apparatus included in the display module 280 is not limited to the display apparatus 100A and may be any of a display apparatus 100B to a display apparatus 100F described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 24B:
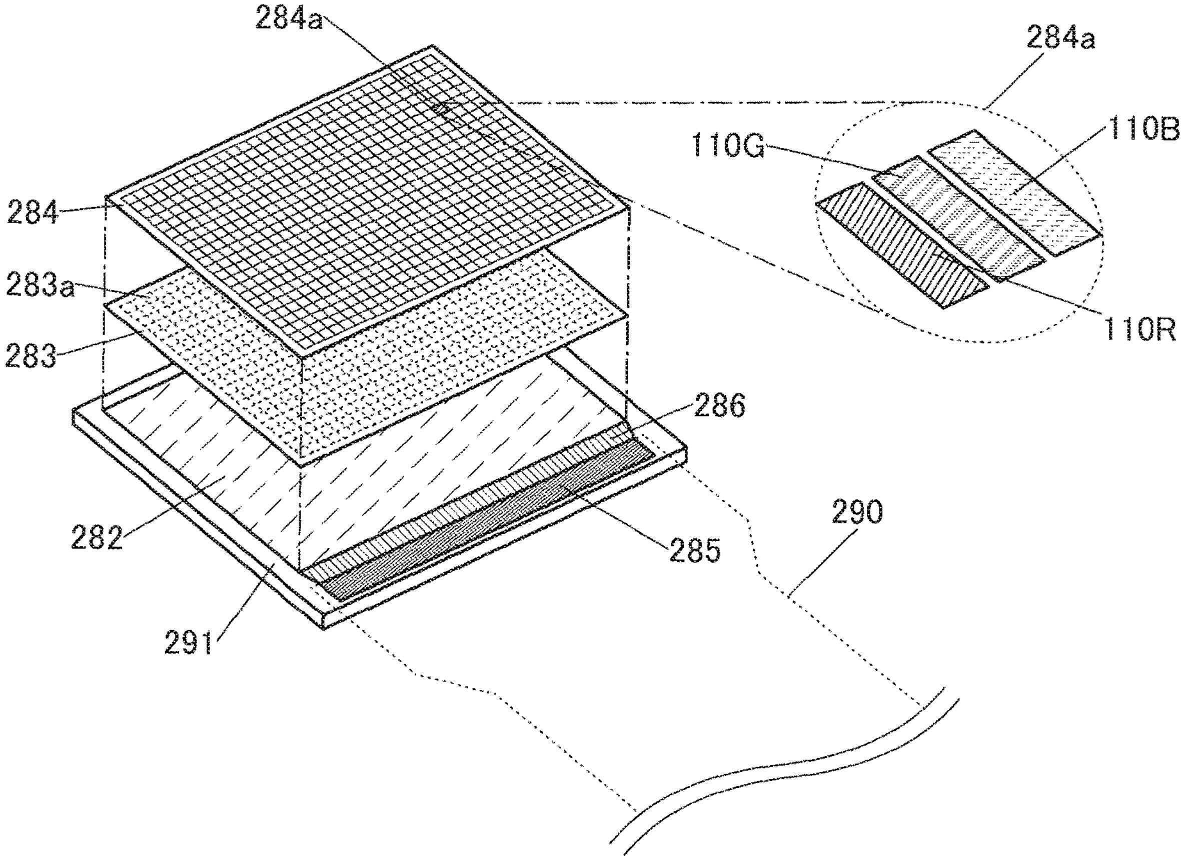

FIG. 24B shows a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 24B. The pixel 284*a* can employ any of the structures described in the above embodiments. FIG. 24B illustrates an example where a structure similar to that of the pixel 110 illustrated in FIG. 1A is employed.

The pixel circuit portion 283 includes a plurality of pixel circuits 283*a* arranged periodically.

One pixel circuit 283*a* is a circuit that controls driving of a plurality of elements included in one pixel 284*a*. One pixel circuit 283*a* can be provided with three circuits each controlling light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display apparatus is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure where one or both of the pixel circuit portion 283 and the circuit portion 282 are stacked below the pixel portion 284; hence, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a VR device such as an HMID or a glasses-type AR device. For example, even with a structure where the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used for a display portion of a wearable electronic device, such as a wrist watch.

[Display Apparatus 100A]

Figure 25A:
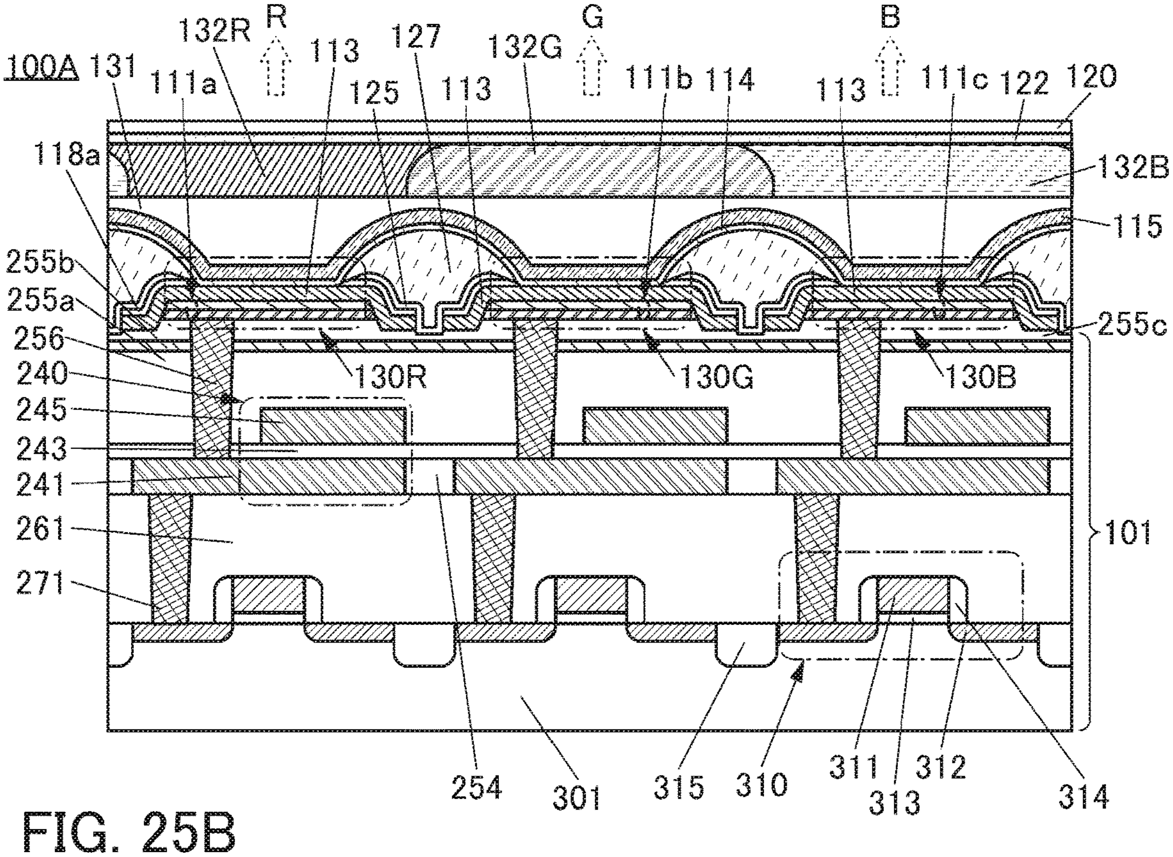
FIG. 25A and FIG. 25B are cross-sectional views illustrating examples of a display apparatus.

The display apparatus 100A illustrated in FIG. 25A includes a substrate 301, a light-emitting device 130R, a light-emitting device 130G, a light-emitting device 130B, the coloring layer 132R, the coloring layer 132G, the coloring layer 132B, a capacitor 240, and a transistor 310.

The subpixel 110R illustrated in FIG. 24B includes the light-emitting device 130R and the coloring layer 132R, the subpixel 110G includes the light-emitting device 130G and the coloring layer 132G, and the subpixel 110B includes the light-emitting device 130B and the coloring layer 132B. In the subpixel 110R, light emitted from the light-emitting device 130R is extracted as red light to the outside of the display apparatus 100A through the coloring layer 132R. Similarly, in the subpixel 110G, light emitted from the light-emitting device 130G is extracted as green light to the outside of the display apparatus 100A through the coloring layer 132G. In the subpixel 110B, light emitted from the light-emitting device 130B is extracted as blue light to the outside of the display apparatus 100A through the coloring layer 132B.

The substrate 301 corresponds to the substrate 291 in FIG. 24A and FIG. 24B. A stacked-layer structure from the substrate 301 to the insulating layer 255*c* corresponds to the layer 101 including transistors in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned between these conductive layers. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255*a* is provided to cover the capacitor 240, the insulating layer 255*b* is provided over the insulating layer 255*a*, and the insulating layer 255*c* is provided over the insulating layer 255*b*. The light-emitting device 130R, the light-emitting device 130G, and the light-emitting device 130B are provided over the insulating layer 255*c*. FIG. 25A illustrates an example where the light-emitting device 130R, the light-emitting device 130G, and the light-emitting device 130B each have a structure similar to the stacked-layer structure illustrated in FIG. 1B. An insulator is provided in a region between adjacent light-emitting devices. In FIG. 25A and the like, the insulating layer 125 and the insulating layer 127 over the insulating layer 125 are provided in this region.

The mask layers 118*a* are positioned over the first layers 113 included in the light-emitting device 130R, the light-emitting device 130G, and the light-emitting device 130B.

The pixel electrode 111*a*, the pixel electrode 111*b*, and the pixel electrode 111*c* are each electrically connected to one of the source and the drain of the transistor 310 through a plug 256 embedded in the insulating layer 243, the insulating layer 255*a*, the insulating layer 255*b*, and the insulating layer 255*c*, the conductive layer 241 embedded in the insulating layer 254, and the plug 271 embedded in the insulating layer 261. The top surface of the insulating layer 255*c* and the top surface of the plug 256 are level or substantially level with each other. A variety of conductive materials can be used for the plugs. FIG. 25A and the like illustrate an example where the pixel electrode has a two-layer structure of a reflective electrode and a transparent electrode over the reflective electrode.

The protective layer 131 is provided over the light-emitting device 130R, the light-emitting device 130G, and the light-emitting device 130B. The coloring layers 132R, 132G, and 132B are provided over the protective layer 131. The substrate 120 is attached onto the protective layer 131 and the coloring layers 132R, 132G, and 132B with the resin layer 122. Embodiment 1 can be referred to for the details of the light-emitting devices and the components thereover up to the substrate 120. The substrate 120 corresponds to the substrate 292 in FIG. 24A.

Figure 25B:
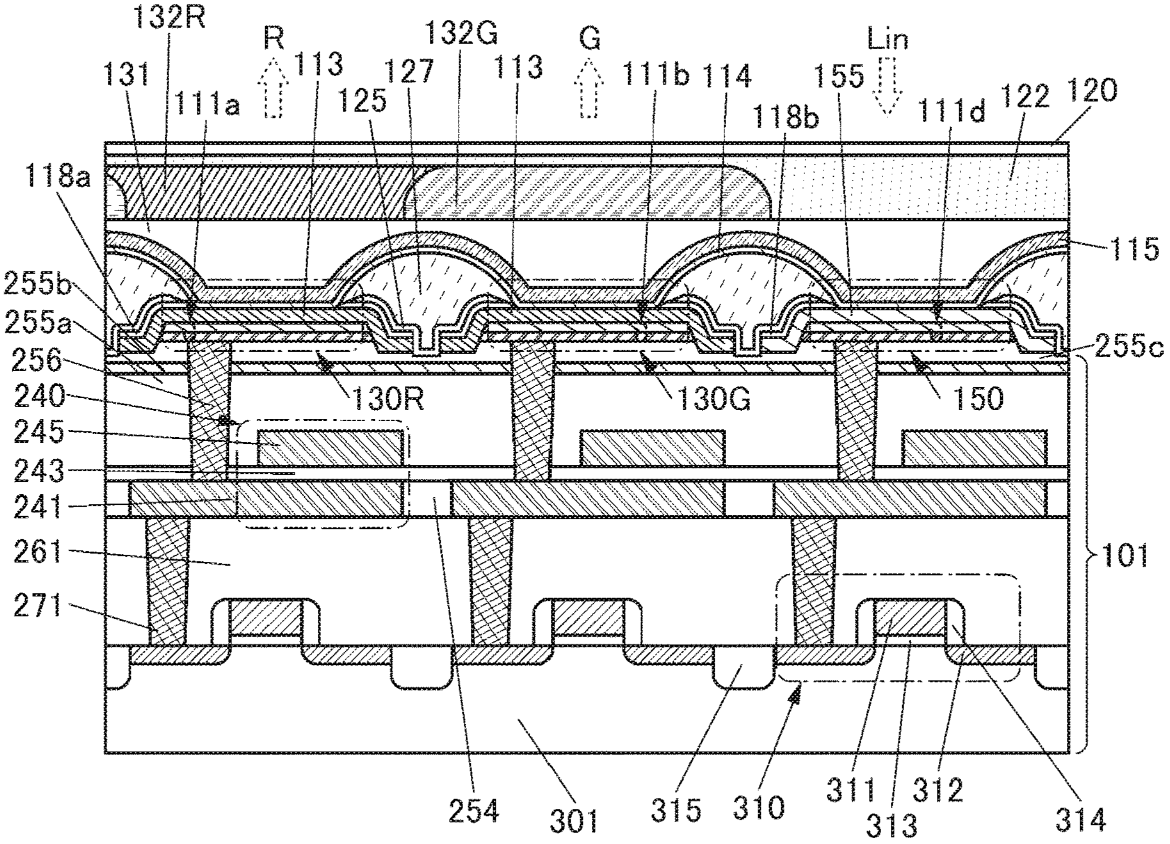

The display apparatus illustrated in FIG. 25B includes the light-emitting devices 130R and 130G and the light-receiving device 150. The light-receiving device 150 includes the pixel electrode 111*d*, the second layer 155, the common layer 114, and the common electrode 115 which are stacked. Embodiment 1 and Embodiment 6 can be referred to for the details of the display apparatus including the light-receiving device.

[Display Apparatus 100B]

Figure 26:
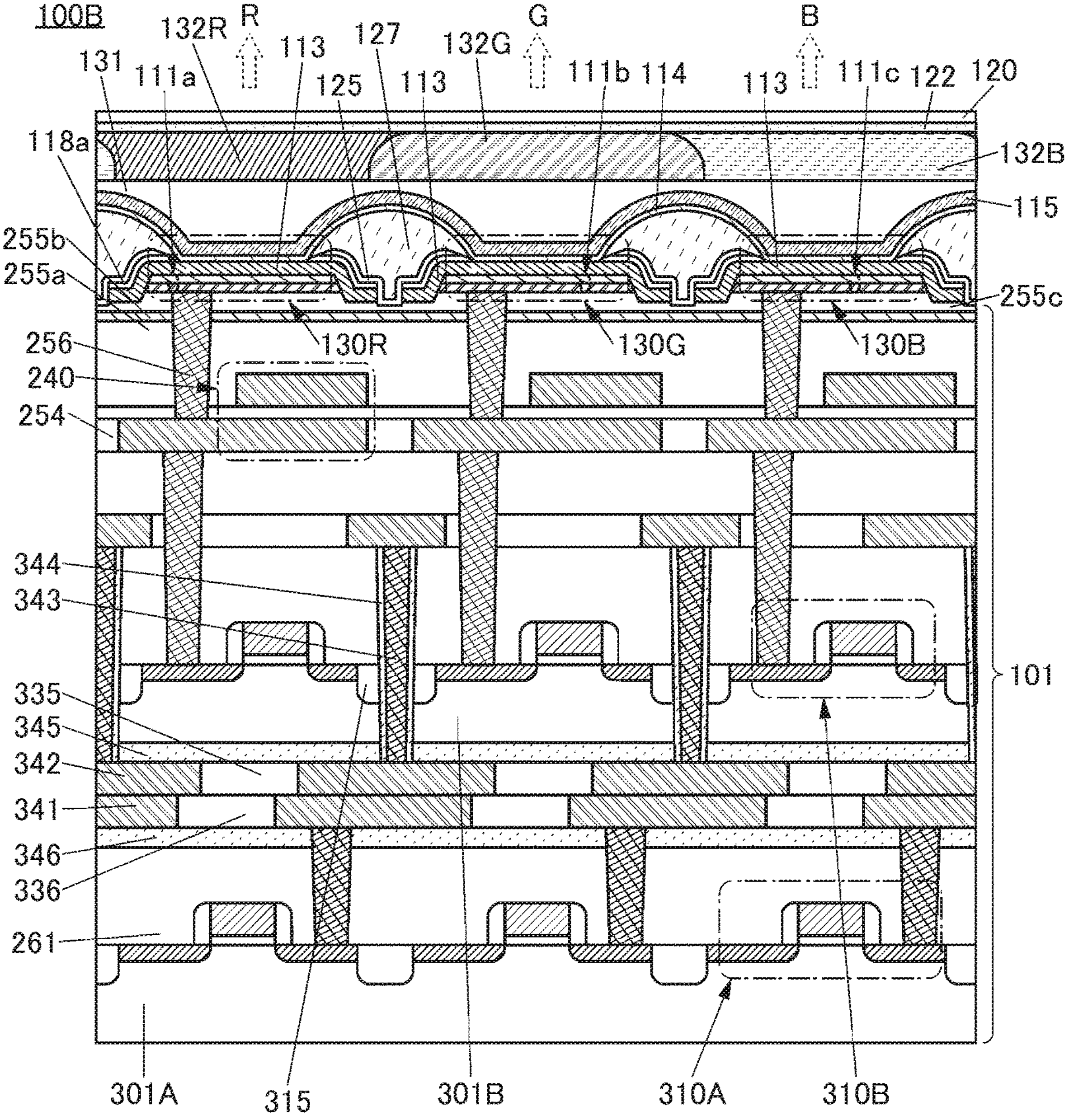
FIG. 26 is a cross-sectional view illustrating an example of a display apparatus.

The display apparatus 100B illustrated in FIG. 26 has a structure where a transistor 310A and a transistor 310B in each of which a channel is formed in a semiconductor substrate are stacked. Note that in the description of the display apparatus below, portions similar to those of the above-described display apparatus are not described in some cases.

In the display apparatus 100B, a substrate 301B provided with the transistor 310B, the capacitor 240, and the light-emitting devices is attached to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 function as protective layers and can inhibit diffusion of impurities into the substrate 301B and the substrate 301A. For the insulating layers 345 and 346, an inorganic insulating film that can be used for the protective layer 131 or an insulating layer 332 described later can be used.

The substrate 301B is provided with a plug 343 that penetrates the substrate 301B and the insulating layer 345. An insulating layer 344 is preferably provided to cover the side surface of the plug 343. The insulating layer 344 functions as a protective layer and can inhibit diffusion of impurities into the substrate 301B. As the insulating layer 344, an inorganic insulating film that can be used as the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be attached to each other favorably.

The conductive layer 341 and the conductive layer 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layer 341 and the conductive layer 342. In that case, it is possible to employ Cu—Cu (copper-to-copper) direct bonding (a technique for achieving electrical continuity by connecting Cu (copper) pads).

[Display Apparatus 100C]

Figure 27:
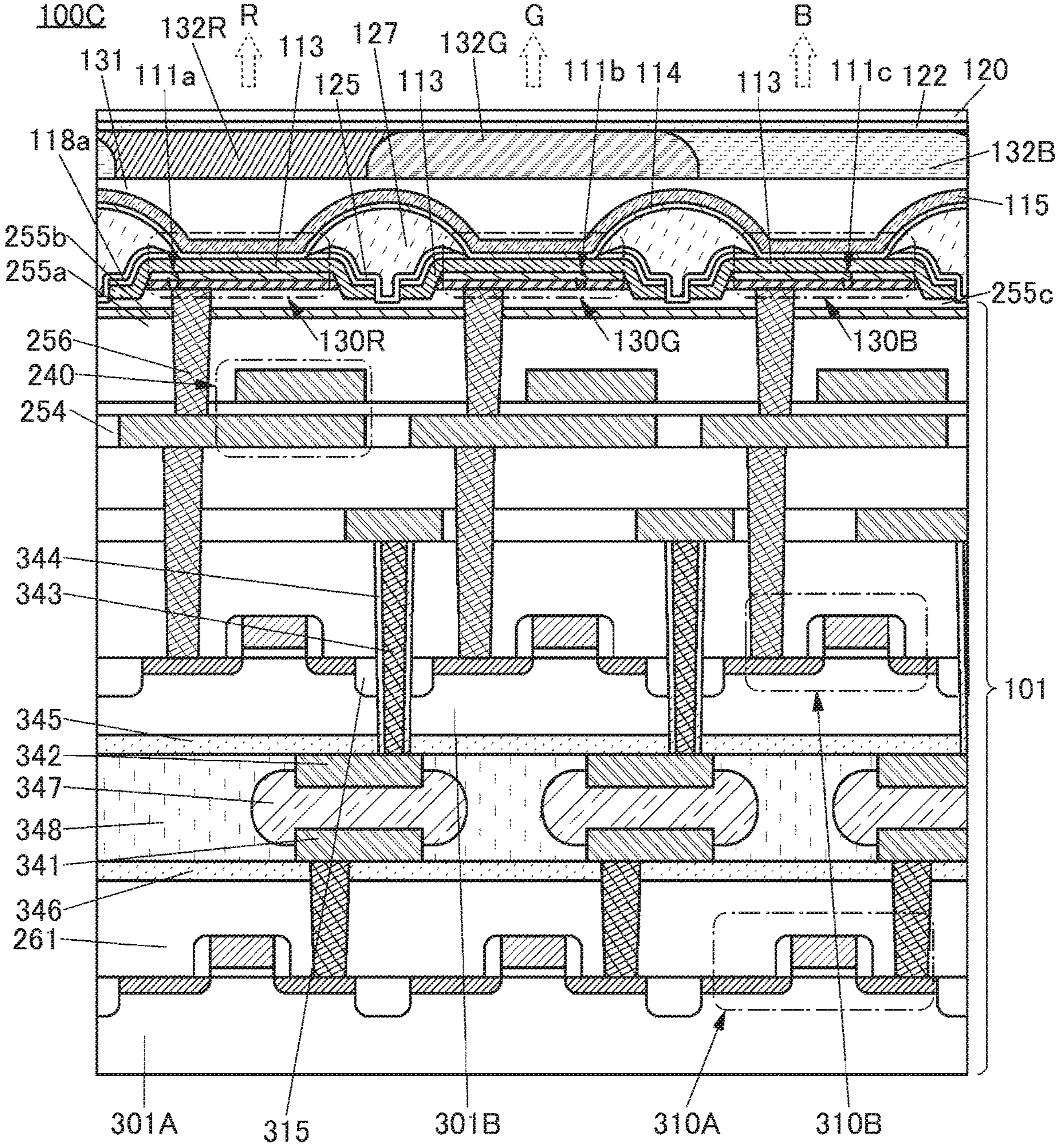
FIG. 27 is a cross-sectional view illustrating an example of a display apparatus.

The display apparatus 100C illustrated in FIG. 27 has a structure where the conductive layer 341 and the conductive layer 342 are bonded to each other through a bump 347.

As illustrated in FIG. 27, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. For another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Apparatus 100D]

Figure 28:
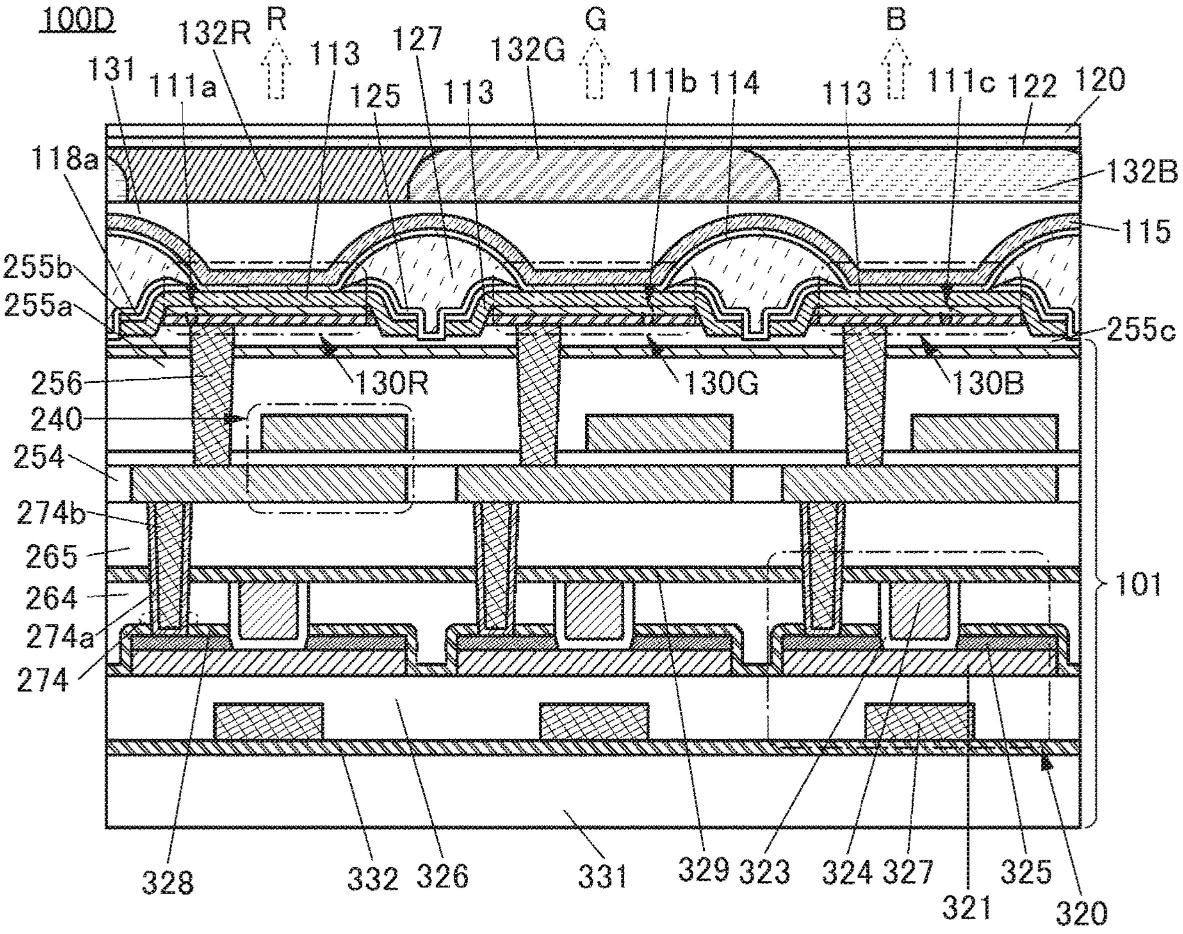
FIG. 28 is a cross-sectional view illustrating an example of a display apparatus.

The display apparatus 100D illustrated in FIG. 28 differs from the display apparatus 100A mainly in a structure of a transistor.

A transistor 320 is a transistor (OS transistor) that includes a metal oxide (also referred to as an oxide semiconductor) in its semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 24A and FIG. 24B. A stacked-layer structure from the substrate 331 to the insulating layer 255*c* corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide film having semiconductor characteristics (also referred to as an oxide semiconductor). The pair of conductive layers 325 is provided over and in contact with the semiconductor layer 321 and functions as a source electrode and a drain electrode.

An insulating layer 328 is provided to cover the top surfaces and the side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so as to be level or substantially level with each other, and an insulating layer 329 and an insulating layer 265 are provided to cover these layers.

The insulating layer 264 and the insulating layer 265 function as interlayer insulating layers. The insulating layer 329 functions as a barrier layer that prevents diffusion of impurities such as water and hydrogen from the insulating layer 265 or the like into the transistor 320. For the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* covering the side surface of an opening formed in the insulating layer 265, the insulating layer 329, the insulating layer 264, and the insulating layer 328 and part of the top surface of the conductive layer 325, and a conductive layer 274*b* in contact with the top surface of the conductive layer 274*a*. For the conductive layer 274*a*, a conductive material that does not easily allow diffusion of hydrogen and oxygen is preferably used.

[Display Apparatus 100E]

Figure 29:
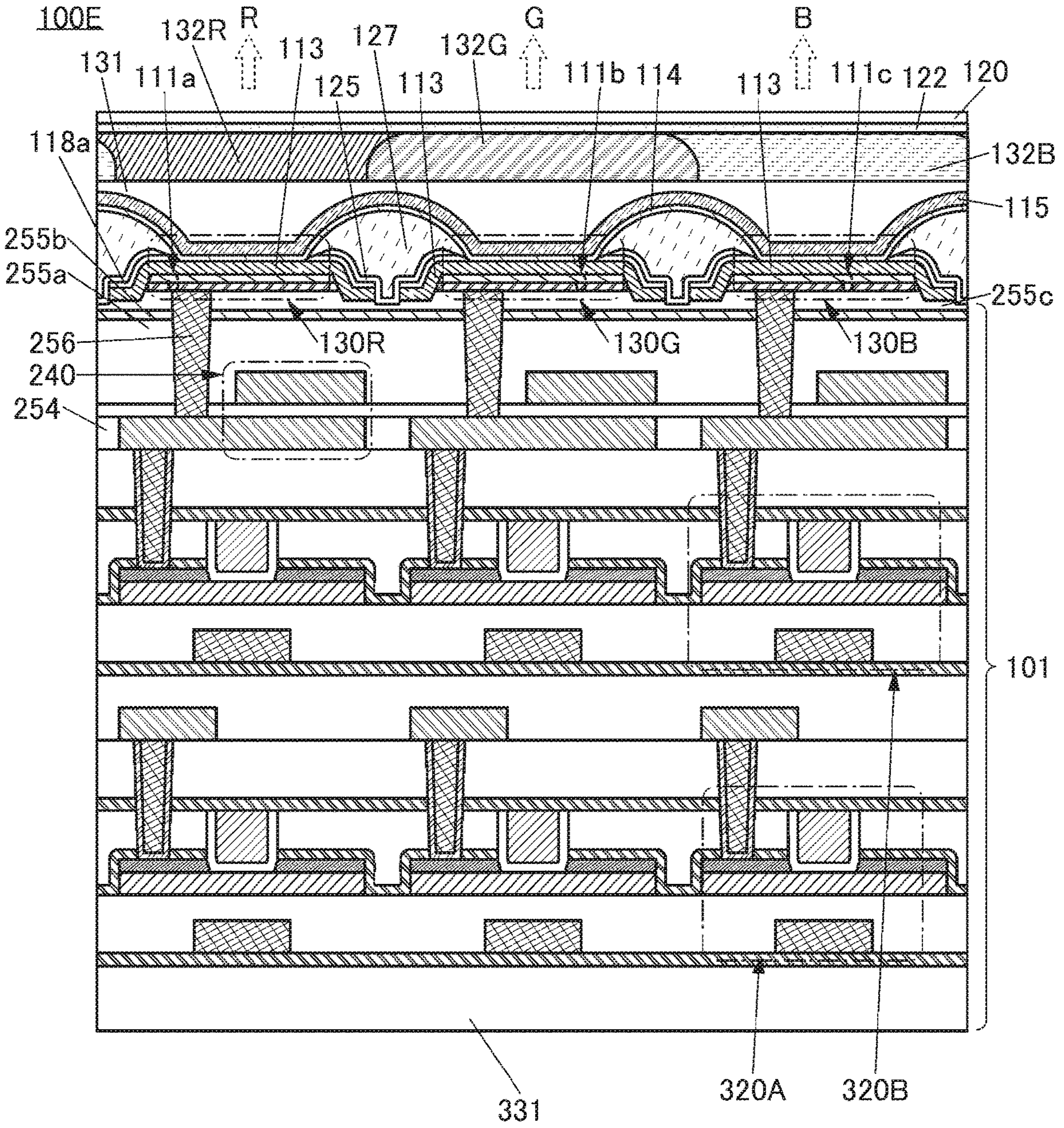
FIG. 29 is a cross-sectional view illustrating an example of a display apparatus.

The display apparatus 100E illustrated in FIG. 29 has a structure where a transistor 320A and a transistor 320B each including an oxide semiconductor in a semiconductor where a channel is formed are stacked.

The display apparatus 100D can be referred to for the transistor 320A, the transistor 320B, and the components around them.

Although the structure where two transistors including an oxide semiconductor are stacked is described, the present invention is not limited thereto. For example, three or more transistors may be stacked.

[Display Apparatus 100F]

Figure 30:
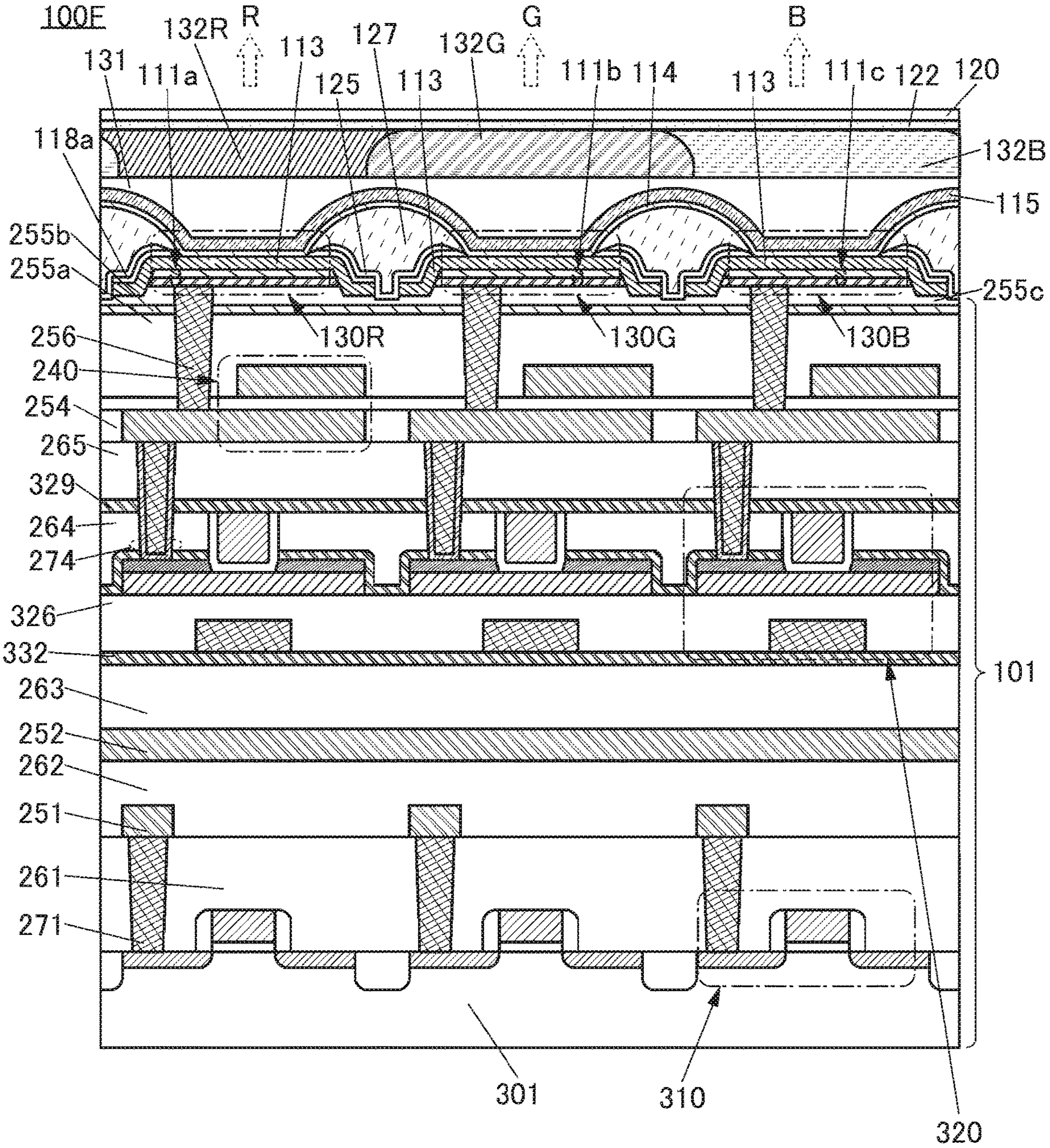
FIG. 30 is a cross-sectional view illustrating an example of a display apparatus.

The display apparatus 100F illustrated in FIG. 30 has a structure where the transistor 310 having a channel formed in the substrate 301 and the transistor 320 including a metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting device; thus, the display apparatus can be downsized as compared to the case where the driver circuit is provided around a display region.

[Display Apparatus 100G]

Figure 31:
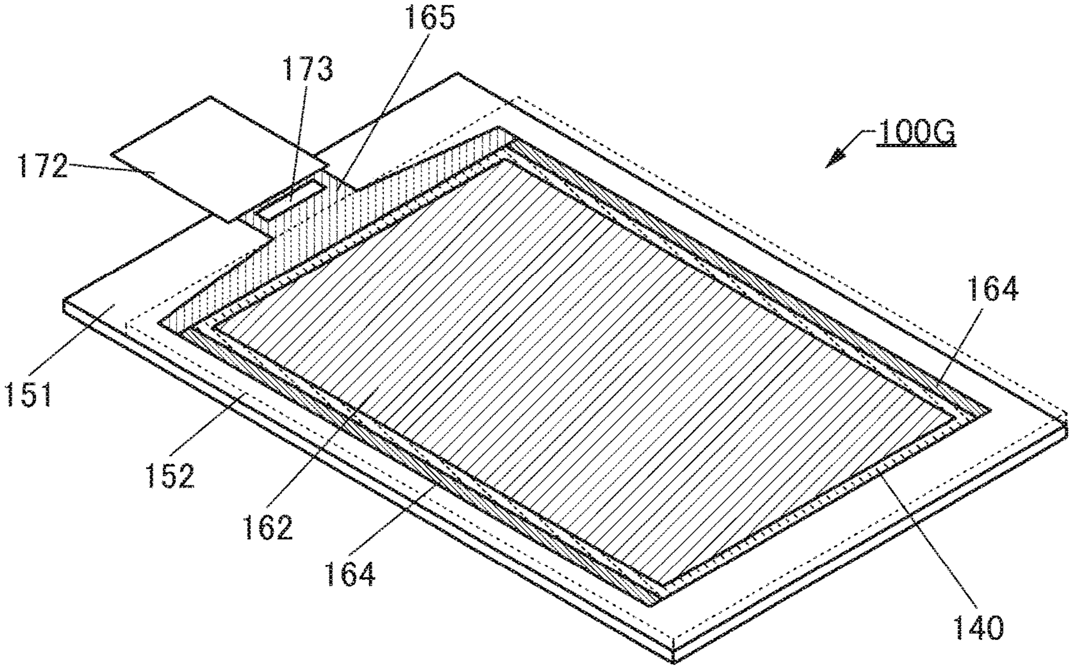
FIG. 31 is a perspective view illustrating an example of a display apparatus.
Figure 32A:
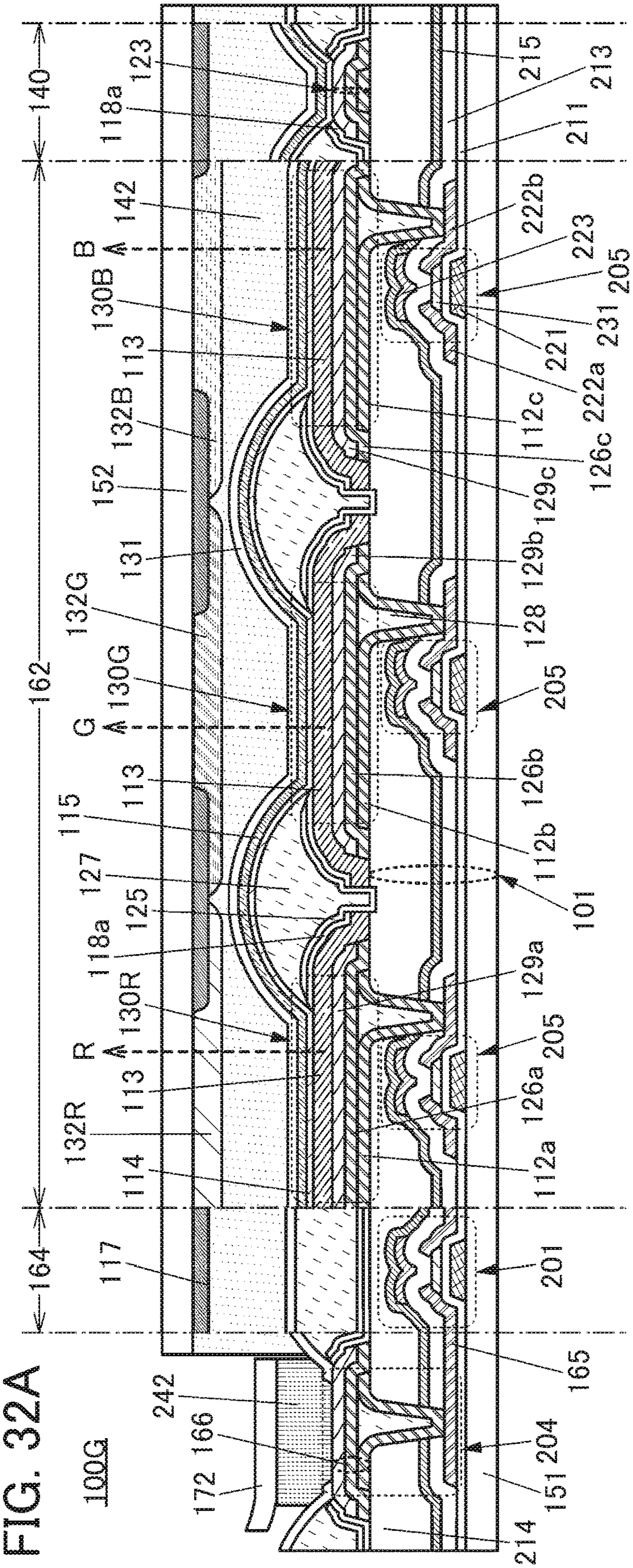
FIG. 32A is a cross-sectional view illustrating an example of a display apparatus.

FIG. 31 is a perspective view of a display apparatus 100G, and FIG. 32A is a cross-sectional view of the display apparatus 100G.

In the display apparatus 100G, a substrate 152 and a substrate 151 are attached to each other. In FIG. 31, the substrate 152 is denoted by a dashed line.

The display apparatus 100G includes a display portion 162, the connection portion 140, a circuit 164, a wiring 165, and the like. FIG. 31 illustrates an example where an IC 173 and an FPC 172 are mounted on the display apparatus 100G. Thus, the structure illustrated in FIG. 31 can be regarded as a display module including the display apparatus 100G, the IC (integrated circuit), and the FPC.

The connection portion 140 is provided outside the display portion 162. The connection portion 140 can be provided along one or more sides of the display portion 162. The number of the connection portions 140 may be one or more. FIG. 31 illustrates an example where the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 31 illustrates an example where the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100G and the display module are not necessarily provided with an IC. The IC may be mounted on the FPC by a COF method or the like.

FIG. 32A illustrates an example of cross sections of part of a region including the FPC 172, part of the circuit 164, part of the display portion 162, part of the connection portion 140, and part of a region including an end portion of the display apparatus 100G.

The display apparatus 100G illustrated in FIG. 32A includes a transistor 201, a transistor 205, the light-emitting device 130R, the light-emitting device 130G, the light-emitting device 130B, the coloring layer 132R transmitting red light, the coloring layer 132G transmitting green light, the coloring layer 132B transmitting blue light, and the like between the substrate 151 and the substrate 152.

The light-emitting devices 130R, 130G, and 130B each have the same structure as the stacked-layer structure illustrated in FIG. 1B except the structure of the pixel electrode. Embodiment 1 can be referred to for the details of the light-emitting devices.

The light-emitting device 130R includes a conductive layer 112*a*, a conductive layer 126*a* over the conductive layer 112*a*, and a conductive layer 129*a* over the conductive layer 126*a*. All of the conductive layers 112*a*, 126*a*, and 129*a* can be referred to as pixel electrodes, or one or two of them can be referred to as pixel electrodes.

The light-emitting device 130G includes a conductive layer 112*b*, a conductive layer 126*b* over the conductive layer 112*b*, and a conductive layer 129*b* over the conductive layer 126*b*.

The light-emitting device 130B includes a conductive layer 112*c*, a conductive layer 126*c* over the conductive layer 112*c*, and a conductive layer 129*c* over the conductive layer 126*c*.

The conductive layer 112*a* is connected to the conductive layer 222*b* included in the transistor 205 through an opening provided in the insulating layer 214. The end portion of the conductive layer 126*a* is positioned outward from the end portion of the conductive layer 112*a*. The end portion of the conductive layer 126*a* and the end portion of the conductive layer 129*a* are aligned or substantially aligned with each other. For example, a conductive layer functioning as a reflective electrode can be used as the conductive layer 112*a* and the conductive layer 126*a*, and a conductive layer functioning as a transparent electrode can be used as the conductive layer 129*a*.

Detailed description of the conductive layers 112*b*, 126*b*, and 129*b* of the light-emitting device 130G and the conductive layers 112*c*, 126*c*, and 129*c* of the light-emitting device 130B is omitted because these conductive layers are similar to the conductive layers 112*a*, 126*a*, and 129*a* of the light-emitting device 130R.

The conductive layers 112*a*, 112*b*, and 112*c* are formed to cover the openings provided in the insulating layer 214. A layer 128 is embedded in each of the depressed portions of the conductive layers 112*a*, 112*b*, and 112*c*.

The layer 128 has a planarization function for the depressed portions of the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depressed portions of the conductive layers 112*a*, 112*b*, and 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. For the layer 128, an organic insulating material that can be used for the insulating layer 127 can be used, for example.

The top and side surfaces of the conductive layers 126*a*, 126*b*, 126*c*, 129*a*, 129*b*, and 129*c* are covered with the first layer 113. Accordingly, regions provided with the conductive layers 126*a*, 126*b*, and 126*c* can be entirely used as the light-emitting regions of the light-emitting devices 130R, 130G, and 130B, increasing the aperture ratio of the pixels.

The side surface and part of the top surface of the first layer 113 are covered with the insulating layers 125 and 127. The mask layer 118*a* is positioned between the first layer 113 and the insulating layer 125. The common layer 114 is provided over the first layer 113 and the insulating layers 125 and 127, and the common electrode 115 is provided over the common layer 114. The common layer 114 and the common electrode 115 are each a continuous film provided to be shared by a plurality of light-emitting devices.

The protective layer 131 is provided over the light-emitting devices 130R, 130G, and 130B. The protective layer 131 and the substrate 152 are bonded to each other with an adhesive layer 142. The substrate 152 is provided with a light-blocking layer 117 and the coloring layers 132R, 132G, and 132B. A solid sealing structure, a hollow sealing structure, or the like can be employed to seal the light-emitting devices. In FIG. 32A, a solid sealing structure is employed in which a space between the substrate 152 and the substrate 151 is filled with the adhesive layer 142. Alternatively, a hollow sealing structure may be employed, in which the space is filled with an inert gas (e.g., nitrogen or argon). Here, the adhesive layer 142 may be provided not to overlap with the light-emitting device. The space may be filled with a resin different from that of the frame-like adhesive layer 142.

The conductive layer 123 is provided over the insulating layer 214 in the connection portion 140. An example is described in which the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. An end portion of the conductive layer 123 is covered with the mask layer 118*a*, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are in direct contact with each other to be electrically connected to each other.

The display apparatus 100G has a top-emission structure. Light emitted by the light-emitting device is emitted toward the substrate 152 side. For the substrate 152, a material having a high visible-light-transmitting property is preferably used. The pixel electrode contains a material reflecting visible light, and the counter electrode (the common electrode 115) contains a material transmitting visible light.

A stacked-layer structure from the substrate 151 to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material that does not easily allow diffusion of impurities such as water and hydrogen is preferably used for at least one of the insulating layers that cover the transistors. This is because such an insulating layer can function as a barrier layer. Such a structure can effectively inhibit diffusion of impurities into the transistors from the outside and improve the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The uppermost layer of the insulating layer 214 preferably has a function of an etching protective layer. Accordingly, a depressed portion can be prevented from being formed in the insulating layer 214 in processing the conductive layer 112*a*, the conductive layer 126*a*, the conductive layer 129*a*, or the like. Alternatively, a depressed portion may be provided in the insulating layer 214 in processing the conductive layer 112*a*, the conductive layer 126*a*, the conductive layer 129*a*, or the like.

Each of the transistor 201 and the transistor 205 includes a conductive layer 221 functioning as a gate, the insulating layer 211 functioning as a gate insulating layer, a conductive layer 222*a* and a conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, an inverted staggered transistor, or the like can be used. A top-gate or bottom-gate transistor structure may be employed. Alternatively, gates may be provided above and below the semiconductor layer where a channel is formed.

The transistor 201 and the transistor 205 employ a structure where the semiconductor layer where a channel is formed is provided between two gates. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

As the oxide semiconductor having crystallinity, a CAAC (c-axis aligned crystalline)-OS, an nc (nanocrystalline)-OS, and the like are given.

Alternatively, a transistor using silicon in a channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of a Si transistor such as an LTPS transistor, a circuit required to be driven at a high frequency (e.g., a source driver circuit) can be formed on the same substrate as the display portion. This allows simplification of an external circuit mounted on the display apparatus and a reduction in component cost and mounting cost.

An OS transistor has much higher field-effect mobility than a transistor using amorphous silicon. In addition, an OS transistor has an extremely low leakage current between a source and a drain in an off state (hereinafter, also referred to as off-state current), and charge accumulated in a capacitor that is connected in series to the transistor can be retained for a long period. Furthermore, the power consumption of the display apparatus can be reduced with the OS transistor.

To increase the emission luminance of the light-emitting device included in a pixel circuit, it is necessary to increase the amount of current flowing through the light-emitting device. For that purpose, the source-drain voltage of the driving transistor included in the pixel circuit needs to be increased. Since an OS transistor has a higher withstand voltage between the source and the drain than a Si transistor, a high voltage can be applied between the source and the drain of the OS transistor. Thus, with use of an OS transistor as a driving transistor included in the pixel circuit, the amount of current flowing through the light-emitting device can be increased, resulting in an increase in emission luminance of the light-emitting device.

When a transistor operates in a saturation region, a change in source-drain current relative to a change in gate-source voltage can be smaller in an OS transistor than in a Si transistor. Accordingly, when an OS transistor is used as the driving transistor included in the pixel circuit, current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of current flowing when a transistor operates in a saturation region, even in the case where the source-drain voltage of an OS transistor increases gradually, more stable current (saturation current) can be made flow through an OS transistor than through a Si transistor. Thus, with use of an OS transistor as a driving transistor, current can be made flow stably through the light-emitting device, for example, even when a variation in current-voltage characteristics of the EL device occurs. In other words, when the OS transistor operates in the saturation region, the source-drain current hardly changes with an increase in the source-drain voltage; hence, the emission luminance of the light-emitting device can be stable.

As described above, with use of an OS transistor as the driving transistor included in the pixel circuit, it is possible to achieve “inhibition of black floating”, “increase in emission luminance”, “increase in the number of gray levels”, “inhibition of variation in light-emitting devices”, and the like.

a metal oxide used for the semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

In the case where the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, in the case where the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. In addition, in the case where the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. Furthermore, in the case where the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistors included in the circuit 164 and the transistors included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display apparatus can have low power consumption and high drive capability. A structure where an LTPS transistor and an OS transistor are used in combination is referred to as LTPO in some cases. As a more suitable example, a structure where the OS transistor is used as a transistor or the like functioning as a switch for controlling continuity and discontinuity between wirings, and the LTPS transistor is used as a transistor or the like for controlling current, can be given.

For example, one transistor included in the display portion 162 functions as a transistor for controlling current flowing through the light-emitting device and can also be referred to as a driving transistor. One of a source and a drain of the driving transistor is electrically connected to the pixel electrode of the light-emitting device. An LTPS transistor is preferably used as the driving transistor. Thus, current flowing through the light-emitting device in the pixel circuit can be increased.

In contrast, another transistor included in the display portion 162 functions as a switch for controlling selection and non-selection of a pixel and can also be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having an MIL (metal maskless) structure. This structure can significantly reduce the leakage current that might flow through a transistor, and the leakage current that might flow between adjacent light-emitting devices (also referred to as a lateral leakage current, a side leakage current, or the like). With the structure, a viewer can observe any one or more of the image crispness, the image sharpness, a high chroma, and a high contrast ratio in an image displayed on the display apparatus. Note that when the leakage current that might flow through a transistor and the lateral leakage current between light-emitting devices are extremely low, light leakage or the like (what is called black blurring) that might occur in black display can be reduced as much as possible.

Figure 32B:
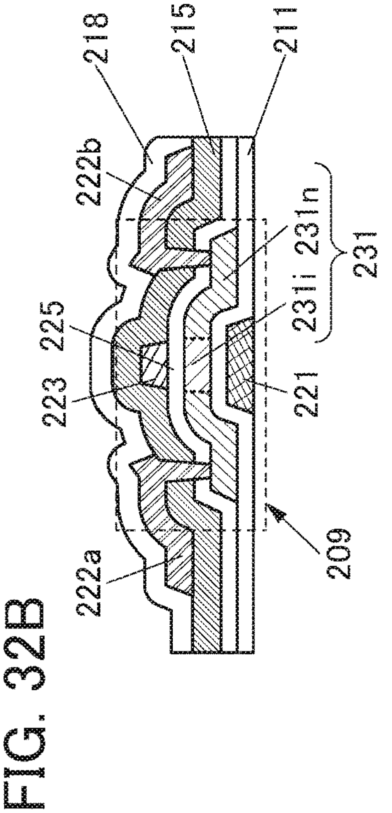
FIG. 32B and FIG. 32C are cross-sectional views illustrating examples of transistors.
Figure 32C:
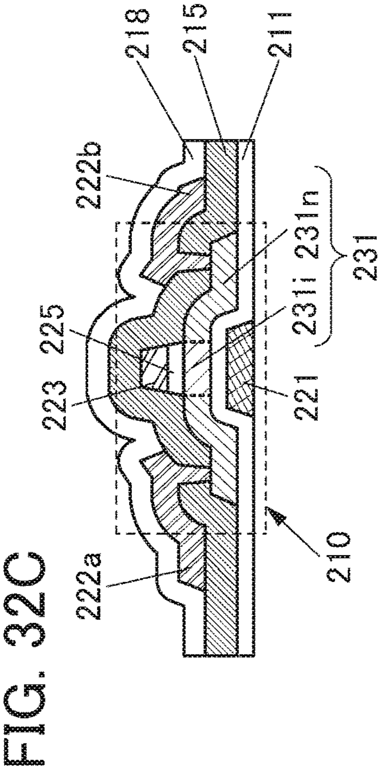

FIG. 32B and FIG. 32C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between at least the conductive layer 223 and the channel formation region 231*i*. Furthermore, an insulating layer 218 covering the transistor may be provided.

FIG. 32B illustrates an example of the transistor 209 in which the insulating layer 225 covers the top and side surfaces of the semiconductor layer 231. The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 32C, the insulating layer 225 overlaps with the channel formation region 231*i* of the semiconductor layer 231 and does not overlap with the low-resistance regions 231*n*. The structure illustrated in FIG. 32C can be formed by processing the insulating layer 225 using the conductive layer 223 as a mask, for example. In FIG. 32C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 151 not overlapping with the substrate 152. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 112*a*, 112*b*, and 112*c*, a conductive film obtained by processing the same conductive film as the conductive layers 126*a*, 126*b*, and 126*c*, and a conductive film obtained by processing the same conductive film as the conductive layers 129*a*, 129*b*, and 129*c*. On the top surface of the connection portion 204, the conductive layer 166 is exposed. Thus, the connection portion 204 and the FPC 172 can be electrically connected to each other through the connection layer 242.

The light-blocking layer 117 is preferably provided on the surface of the substrate 152 on the substrate 151 side. The light-blocking layer 117 can be provided between adjacent light-emitting devices, in the connection portion 140, and in the circuit 164, for example. A variety of optical members can be arranged on the outer surface of the substrate 152.

The material that can be used for the substrate 120 can be used for each of the substrate 151 and the substrate 152.

The material that can be used for the resin layer 122 can be used for the adhesive layer 142.

As the connection layer 242, an anisotropic conductive film (ACF), an anisotropic conductive paste (ACP), or the like can be used.

[Display Apparatus 100H]

Figures 33A, 33B, 33C, 33D:
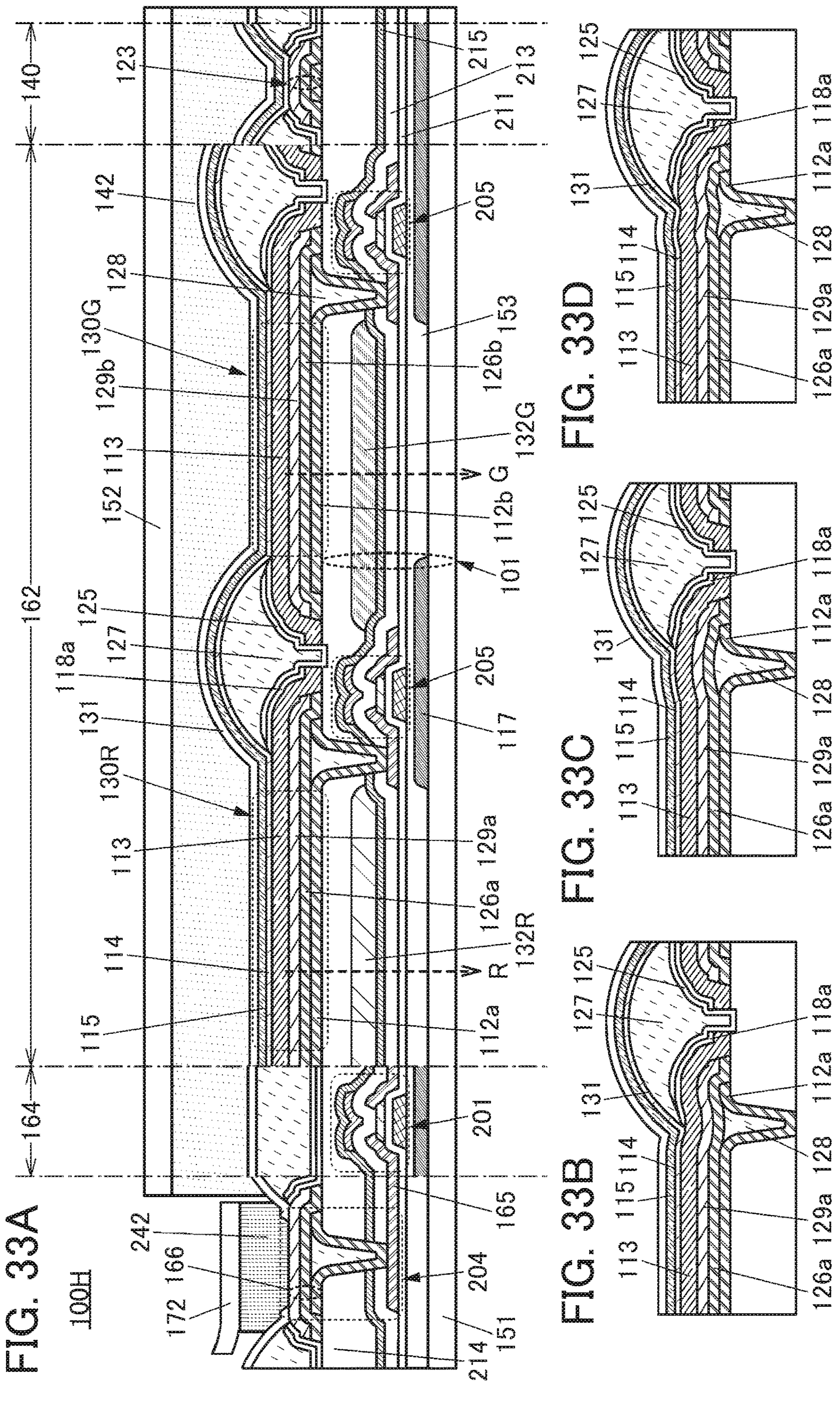
FIG. 33A to 33D are cross-sectional views illustrating examples of a display apparatus.

A display apparatus 100H illustrated in FIG. 33A is different from the display apparatus 100G mainly in being a bottom-emission display apparatus.

Light emitted by the light-emitting device is emitted toward the substrate 151 side. For the substrate 151, a material having a high visible-light-transmitting property is preferably used. In contrast, there is no limitation on the light-transmitting property of a material used for the substrate 152.

The light-blocking layer 117 is preferably formed between the substrate 151 and the transistor 201 and between the substrate 151 and the transistor 205. FIG. 33A illustrates an example where the light-blocking layer 117 is provided over the substrate 151, an insulating layer 153 is provided over the light-blocking layer 117, and the transistors 201 and 205 and the like are provided over the insulating layer 153.

The light-emitting device 130R includes the conductive layer 112*a*, the conductive layer 126*a* over the conductive layer 112*a*, and the conductive layer 129*a* over the conductive layer 126*a*.

The light-emitting device 130G includes the conductive layer 112*b*, the conductive layer 126*b* over the conductive layer 112*b*, and the conductive layer 129*b* over the conductive layer 126*b*.

A material having a high visible-light-transmitting property is used for each of the conductive layers 112*a*, 112*b*, 126*a*, 126*b*, 129*a*, and 129*b*. A material reflecting visible light is preferably used for the common electrode 115.

Although FIG. 32A, FIG. 33A, and the like illustrate an example where the top surface of the layer 128 includes a flat portion, the shape of the layer 128 is not particularly limited. FIG. 33B to FIG. 33D illustrate variation examples of the layer 128.

As illustrated in FIG. 33B and FIG. 33D, the top surface of the layer 128 can have a shape such that its center and the vicinity thereof are recessed, i.e., a shape including a concave surface, in a cross-sectional view.

As illustrated in FIG. 33C, the top surface of the layer 128 can have a shape such that its center and the vicinity thereof bulge, i.e., a shape including a convex surface, in a cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 112*a* may be equal to or substantially equal to each other, or may be different from each other. For example, the level of the top surface of the layer 128 may be either lower or higher than the level of the top surface of the conductive layer 112*a*.

FIG. 33B can be regarded as illustrating an example where the layer 128 fits in the depressed portion of the conductive layer 112*a*. By contrast, as illustrated in FIG. 33D, the layer 128 may exist also outside the depression portion of the conductive layer 112*a*, that is, the layer 128 may be formed to have a top surface wider than the depression portion.

Figure 34:
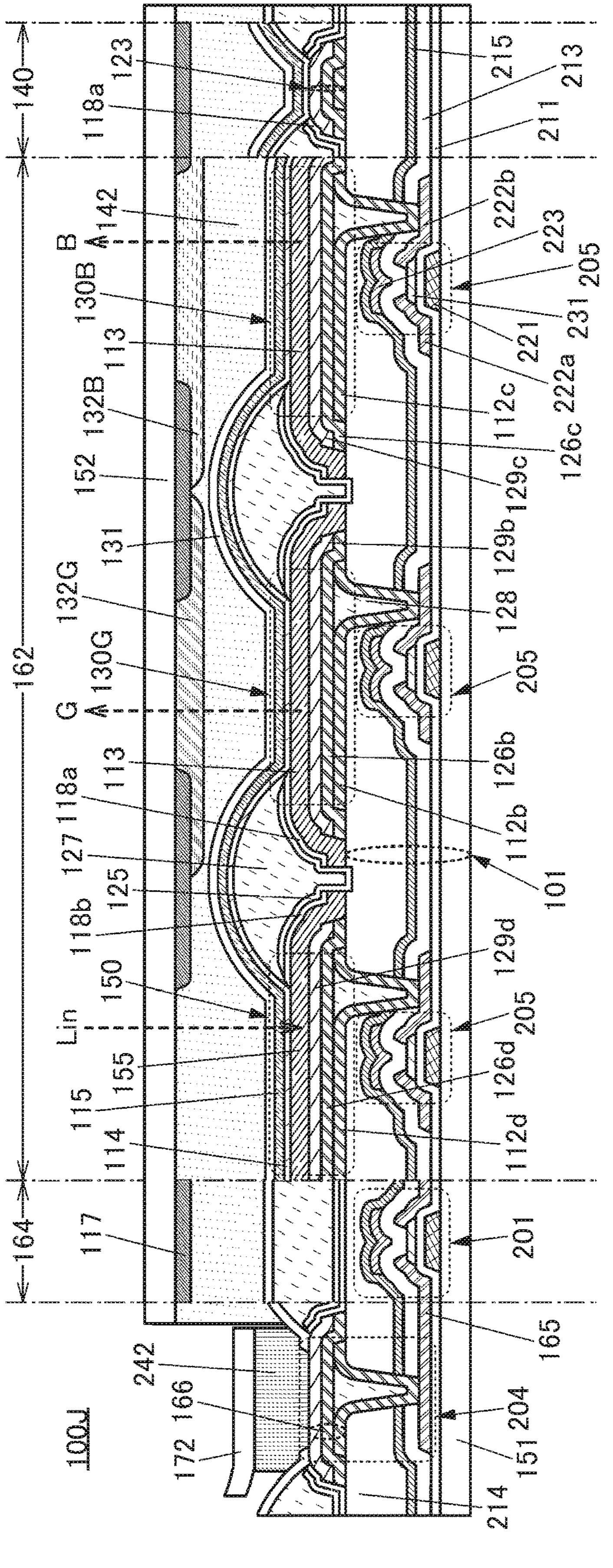
FIG. 34 is a cross-sectional view illustrating an example of a display apparatus.

[Display apparatus 100J]A display apparatus 100J illustrated in FIG. 34 is different from the display apparatus 100G mainly in including the light-receiving device 150.

The light-receiving device 150 includes a conductive layer 112*d*, a conductive layer 126*d* over the conductive layer 112*d*, and a conductive layer 129*d* over the conductive layer 126*d*.

The conductive layer 112*d* is connected to the conductive layer 222*b* included in the transistor 205 through an opening provided in the insulating layer 214.

The top and side surfaces of the conductive layer 126*d* and the top and side surfaces of the conductive layer 129*d* are covered with the second layer 155. The second layer 155 includes at least an active layer.

The side surface and part of the top surface of the second layer 155 are covered with the insulating layers 125 and 127. The mask layer 118*b* is positioned between the second layer 155 and the insulating layer 125. The common layer 114 is provided over the second layer 155 and the insulating layers 125 and 127, and the common electrode 115 is provided over the common layer 114. The common layer 114 is a continuous film provided to be shared by the light-receiving device and the light-emitting devices.

The display apparatus 100J can employ any of the pixel layouts that are described in Embodiment 3 with reference to FIG. 23A to FIG. 23K, for example. Embodiment 1 and Embodiment 6 can be referred to for the details of the display apparatus including the light-receiving device.

This embodiment can be combined with the other embodiments as appropriate.

Embodiment 5

In this embodiment, light-emitting devices that can be used for the display apparatus of one embodiment of the present invention will be described.

In this specification and the like, a structure where light-emitting devices of different emission colors (e.g., blue (B), green (G), and red (R)) are separately formed is referred to as an SBS (Side By Side) structure in some cases.

The emission color of the light-emitting device can be red, green, blue, cyan, magenta, yellow, white, or the like. Furthermore, the color purity can be further increased when the light-emitting device has a microcavity structure.

[Light-Emitting Device]

Figure 35A:
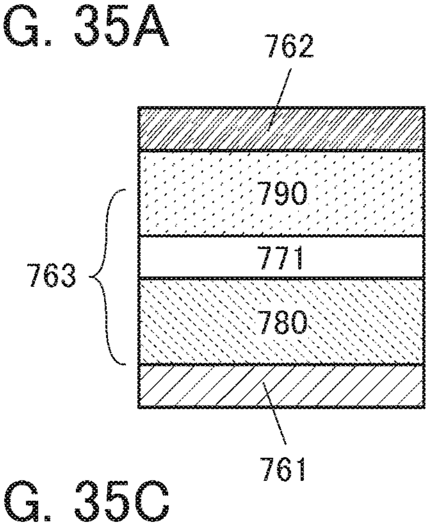
FIG. 35A to FIG. 35F are diagrams illustrating structure examples of a light-emitting device.

As illustrated in FIG. 35A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790.

The light-emitting layer 771 contains at least a light-emitting substance.

In the case where the lower electrode 761 is an anode and the upper electrode 762 is a cathode, the layer 780 includes one or more of a layer containing a substance with a high hole-injection property (a hole-injection layer), a layer containing a substance with a high hole-transport property (a hole-transport layer), and a layer containing a substance with a high electron-blocking property (an electron-blocking layer). Furthermore, the layer 790 includes one or more of a layer containing a substance with a high electron-injection property (an electron-injection layer), a layer containing a substance with a high electron-transport property (an electron-transport layer), and a layer containing a substance with a high hole-blocking property (a hole-blocking layer). In the case where the lower electrode 761 is a cathode and the upper electrode 762 is an anode, the structures of the layer 780 and the layer 790 are replaced with each other.

The structure including the layer 780, the light-emitting layer 771, and the layer 790, which is provided between a pair of electrodes, can function as a single light-emitting unit, and the structure in FIG. 35A is referred to as a single structure in this specification.

Figure 35B:
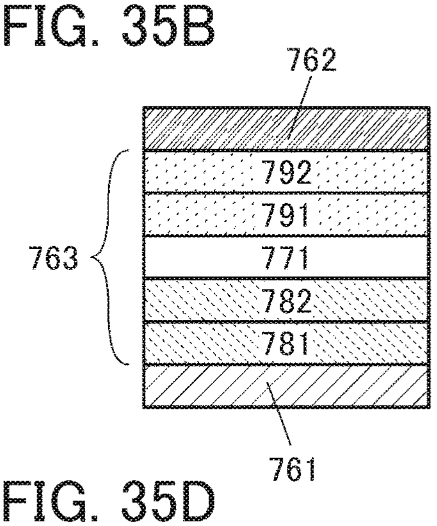

FIG. 35B is a variation example of the EL layer 763 included in the light-emitting device illustrated in FIG. 35A. Specifically, the light-emitting device illustrated in FIG. 35B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layer structure, carriers can be efficiently injected to the light-emitting layer 771, and the efficiency of the recombination of carriers in the light-emitting layer 771 can be enhanced.

Figure 35C:
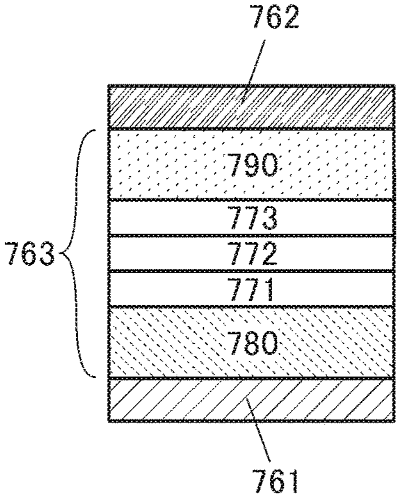
Figure 35D:
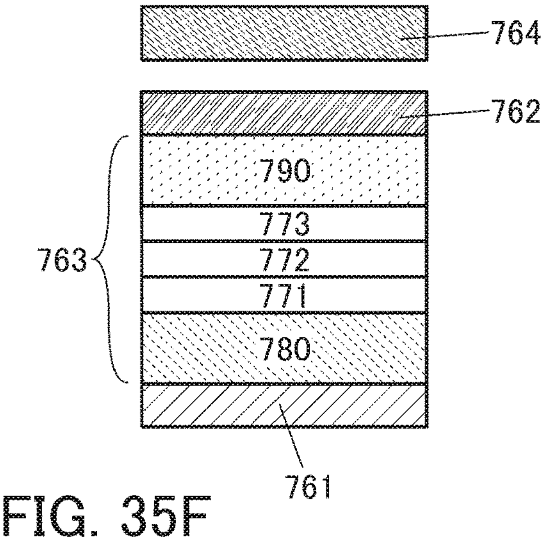

Note that structures in which a plurality of light-emitting layers (light-emitting layers 771, 772, and 773) are provided between the layer 780 and the layer 790 as illustrated in FIG. 35C and FIG. 35D are variations of the single structure.

Figure 35E:
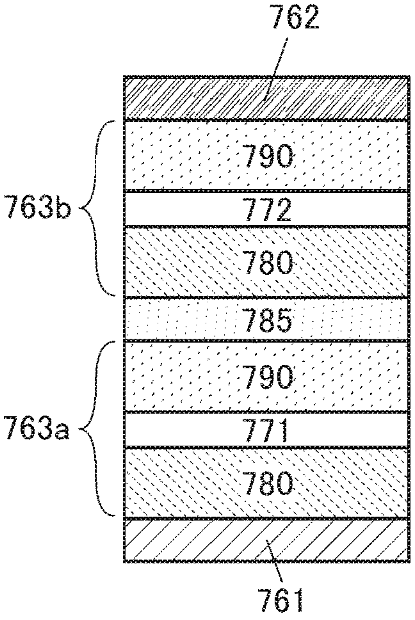
Figure 35F:
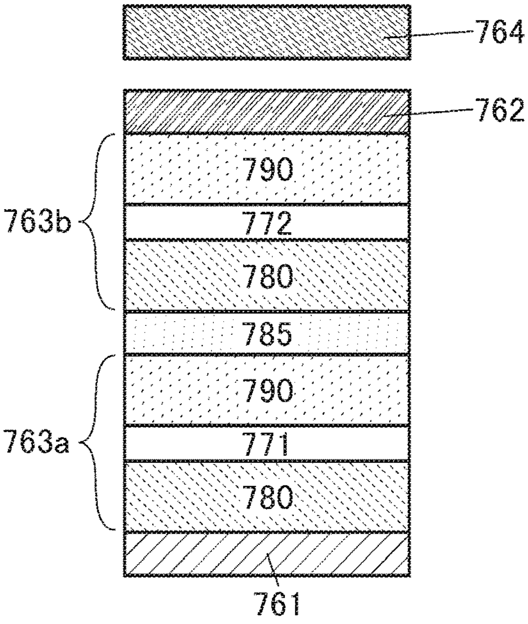

A structure where a plurality of light-emitting units (an EL layer 763*a* and an EL layer 763*b*) are connected in series with a charge-generation layer 785 therebetween as illustrated in FIG. 35E and FIG. 35F is referred to as a tandem structure in this specification. Note that the tandem structure may be referred to as a stack structure. The tandem structure enables a light-emitting device capable of high-luminance light emission.

In FIG. 35C and FIG. 35D, light-emitting substances that emit light of the same color, or moreover, the same light-emitting substance may be used for the light-emitting layer 771, the light-emitting layer 772, and the light-emitting layer 773. For example, a light-emitting substance emitting blue light may be used for the light-emitting layer 771, the light-emitting layer 772, and the light-emitting layer 773. A color conversion layer may be provided as a layer 764 illustrated in FIG. 35D.

Alternatively, light-emitting substances emitting light of different colors may be used for the light-emitting layer 771, the light-emitting layer 772, and the light-emitting layer 773. White light emission can be obtained when the light-emitting layer 771, the light-emitting layer 772, and the light-emitting layer 773 emit light of complementary colors. A color filter (also referred to as a coloring layer) may be provided as the layer 764 illustrated in FIG. 35D. When white light passes through the color filter, light of a desired color can be obtained.

The light-emitting device emitting white light preferably contains two or more kinds of light-emitting substances. To obtain white light emission, two or more kinds of light-emitting substances are selected such that their emission colors are complementary. For example, when an emission color of a first light-emitting layer and an emission color of a second light-emitting layer are complementary colors, the light-emitting device can be configured to emit white light as a whole. The same applies to a light-emitting device including three or more light-emitting layers.

In FIG. 35E and FIG. 35F, light-emitting substances emitting light of the same color, or moreover, the same light-emitting substance may be used for the light-emitting layer 771 and the light-emitting layer 772. Alternatively, light-emitting substances emitting light of different colors may be used for the light-emitting layer 771 and the light-emitting layer 772. White light emission can be obtained when the light-emitting layer 771 and the light-emitting layer 772 emit light of complementary colors. FIG. 35F illustrates an example where the layer 764 is further provided. One or both of a color conversion layer and a color filter (coloring layer) can be used as the layer 764. In FIG. 35D and FIG. 35F, a conductive film transmitting visible light is used for the upper electrode 762 to extract light to the upper electrode 762 side.

In FIG. 35C, FIG. 35D, FIG. 35E, and FIG. 35F, each of the layer 780 and the layer 790 may independently have a stacked-layer structure of two or more layers as illustrated in FIG. 35B.

Next, materials that can be used for the light-emitting device will be described.

A conductive film transmitting visible light is used as the electrode through which light is extracted, which is either the lower electrode 761 or the upper electrode 762. A conductive film reflecting visible light is preferably used as the electrode through which light is not extracted. In the case where a display apparatus includes a light-emitting device emitting infrared light, a conductive film transmitting visible light and infrared light is used as the electrode through which light is extracted, and a conductive film reflecting visible light and infrared light is preferably used as the electrode through which light is not extracted.

A conductive film transmitting visible light may be used as an electrode through which light is not extracted. In that case, the electrode is preferably placed between a reflective layer and the EL layer 763. In other words, light emitted from the EL layer 763 may be reflected by the reflective layer to be extracted from the display apparatus.

As a material that forms the pair of electrodes of the light-emitting device, a metal, an alloy, an electrically conductive compound, a mixture thereof, and the like can be used as appropriate. Specific examples include an indium tin oxide (In—Sn oxide, also referred to as ITO), an In—Si—Sn oxide (also referred to as ITSO), an indium zinc oxide (In—Zn oxide), an In—W—Zn oxide, an alloy containing aluminum (an aluminum alloy) such as an alloy of aluminum, nickel, and lanthanum (Al—Ni—La), and an alloy containing silver such as an alloy of silver and magnesium and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting devices preferably employ a microcavity structure. Therefore, one of the pair of electrodes of the light-emitting device preferably includes an electrode having properties of transmitting and reflecting visible light (a semi-transmissive and semi-reflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified.

Note that the semi-transmissive and semi-reflective electrode can have a stacked-layer structure of a reflective electrode and an electrode having a visible-light-transmitting property (also referred to as a transparent electrode).

The light transmittance of the transparent electrode is higher than or equal to 40%. For example, an electrode having a visible light (light at wavelengths greater than or equal to 400 nm and less than 750 nm) transmittance higher than or equal to 40% is preferably used in the light-emitting device. The semi-transmissive and semi-reflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity less than or equal to $1\times10^{-2}$ Ωcm.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

The light-emitting layer can contain one or more kinds of light-emitting substances. As the light-emitting substance, a substance exhibiting an emission color of blue, violet, bluish violet, green, yellowish green, yellow, orange, red, or the like is used as appropriate. Alternatively, as the light-emitting substance, a substance emitting near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of a substance with a high hole-transport property (a hole-transport material) and a substance with a high electron-transport property (an electron-transport material) can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. Such a structure makes it possible to efficiently obtain light emission using ExTET (Exciplex-Triplet Energy Transfer), which is energy transfer from an exciplex to a light-emitting substance (a phosphorescent material). When a combination is selected to form an exciplex that exhibits light emission whose wavelength overlaps with the wavelength of the lowest-energy-side absorption band of the light-emitting substance, energy can be transferred smoothly and light emission can be obtained efficiently. With this structure, high efficiency, low-voltage driving, and a long lifetime of a light-emitting device can be achieved at the same time.

In addition to the light-emitting layer, the EL layer 763 may further include layers containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

The hole-injection layer is a layer injecting holes from an anode to a hole-transport layer and containing a substance with a high hole-injection property. Examples of a substance with a high hole-injection property include an aromatic amine compound and a composite material containing a hole-transport material and an acceptor material (electron-accepting material).

A hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1\times10^{-6}$ cm²/Vs is preferable. Note that other substances can also be used as long as they have a property of transporting more holes than electrons. As the hole-transport material, a substance with a high hole-transport property, such as a Tc-electron rich heteroaromatic compound (e.g., a carbazole derivative, a thiophene derivative, or a furan derivative) or an aromatic amine (a compound having an aromatic amine skeleton), is preferable.

An electron-transport layer is a layer transporting electrons, which are injected from a cathode by an electron-injection layer, to a light-emitting layer. The electron-transport layer is a layer containing an electron-transport material. As the electron-transport material, a substance having an electron mobility greater than or equal to $1\times10^{-6}$ cm²/Vs is preferable. Note that other substances can also be used as long as they have a property of transporting more electrons than holes. As the electron-transport material, any of the following substances with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a Tc-electron deficient heteroaromatic compound such as a nitrogen-containing heteroaromatic compound.

An electron-injection layer is a layer injecting electrons from a cathode to an electron-transport layer and containing a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

The difference between the LUMO level of the substance with a high electron-injection property and the work function value of the material used for the cathode is preferably small (specifically, smaller than or equal to 0.5 eV).

The electron-injection layer can be formed using, for example, an alkali metal, an alkaline earth metal, or a compound thereof, such as lithium, cesium, ytterbium, lithium fluoride (LiF), cesium fluoride (CsF), calcium fluoride (CaFx, where X is a given number), 8-(quinolinolato) lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiOx), or cesium carbonate. The electron-injection layer may have a stacked-layer structure of two or more layers. The stacked-layer structure can be, for example, a structure where lithium fluoride is used for the first layer and ytterbium is used for the second layer.

The electron-injection layer may contain an electron-transport material. For example, a compound having an unshared electron pair and an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound having an unshared electron pair. Note that NBPhen has a higher glass transition temperature (Tg) than BPhen and thus has high heat resistance.

In the case of fabricating a tandem light-emitting device, a charge-generation layer (also referred to as an intermediate layer) is provided between two light-emitting units. The intermediate layer has a function of injecting electrons into one of the two light-emitting units and injecting holes to the other when voltage is applied between the pair of electrodes.

For the charge-generation layer, for example, a material that can be used for the electron-injection layer, such as lithium, can be suitably used. For the charge-generation layer, for example, a material that can be used for the hole-injection layer can be suitably used. As the charge-generation layer, a layer containing a hole-transport material and an acceptor material (electron-accepting material) can be used. As the charge-generation layer, a layer containing an electron-transport material and a donor material can be used. Forming such a charge-generation layer can inhibit an increase in the driving voltage that would be caused by stacking light-emitting units.

This embodiment can be combined with the other embodiments as appropriate.

Embodiment 6

In this embodiment, a light-receiving device that can be used for the display apparatus of one embodiment of the present invention and a display apparatus having a light-emitting and light-receiving function will be described.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

It is particularly preferable to use an organic photodiode including a layer containing an organic compound, as the light-receiving device. An organic photodiode, which is easily made thin, lightweight, and large in area and has a high degree of freedom for shape and design, can be used for a variety of display apparatuses.

[Light-Receiving Device]

Figure 36A:
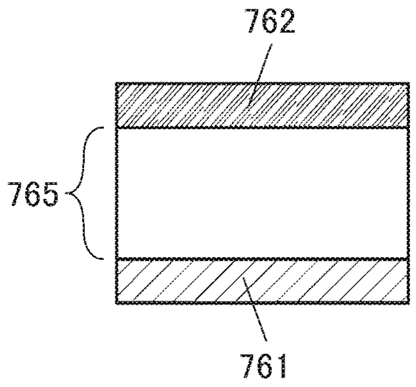
FIG. 36A and FIG. 36B are diagrams illustrating structure examples of a light-receiving device.

As illustrated in FIG. 36A, the light-receiving device includes a layer 765 between a pair of electrodes (the lower electrode 761 and the upper electrode 762). The layer 765 includes at least one active layer, and may further include another layer.

Figure 36B:
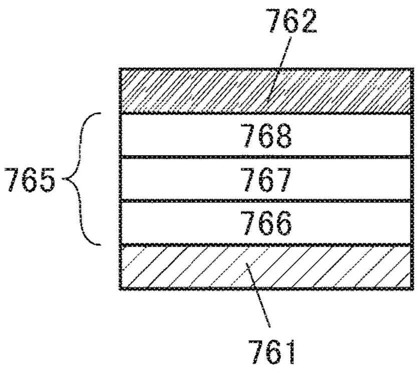

FIG. 36B is a variation example of the EL layer 765 included in the light-receiving device illustrated in FIG. 36A. Specifically, the light-receiving device illustrated in FIG. 36B includes a layer 766 over the lower electrode 761, an active layer 767 over the layer 766, a layer 768 over the active layer 767, and the upper electrode 762 over the layer 768.

The active layer 767 functions as a photoelectric conversion layer.

In the case where the lower electrode 761 is an anode and the upper electrode 762 is a cathode, the layer 766 includes one or both of a hole-transport layer and an electron-blocking layer. The layer 768 includes one or both of an electron-transport layer and a hole-blocking layer. In the case where the lower electrode 761 is a cathode and the upper electrode 762 is an anode, the structures of the layer 766 and the layer 768 are replaced with each other.

Here, the display apparatus of one embodiment of the present invention may include a layer used in common to the light-receiving device and the light-emitting device (also referred to as a continuous layer shared by the light-receiving device and the light-emitting device). Such a layer may have different functions in the light-emitting device and the light-receiving device in some cases. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer used in common to the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

Next, materials that can be used for the light-receiving device will be described.

Either a low molecular compound or a high molecular compound can be used for the light-receiving device, and an inorganic compound may also be contained. Each layer included in the light-receiving device can be formed by an evaporation method (including a vacuum evaporation method), a transfer method, a printing method, an inkjet method, a coating method, or the like.

The active layer included in the light-receiving device includes a semiconductor.

Examples of the semiconductor include an inorganic semiconductor such as silicon and an organic semiconductor including an organic compound. This embodiment describes an example where an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer include electron-accepting organic semiconductor materials such as fullerene (e.g., Co and $C_{70}$) and fullerene derivatives. Examples of the fullerene derivative include [6,6]-Phenyl-$C_{71}$-butyric acid methyl ester (abbreviation: $PC_{70}BM$), [6,6]-Phenyl-$C_{61}$-butyric acid methyl ester (abbreviation: $PC_{60}BM$), and 1',1",4',4"-Tetrahydro-di [1,4]methanonaphthaleno[1,2:2',3',56,60:2",3" ][5,6]fullerene-$C_{60}$ (abbreviation: ICBA).

Other examples of an n-type semiconductor material include perylenetetracarboxylic acid derivatives such as N,N-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene)di malononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For the active layer, a high molecular compound such as poly[[4,8-bis[5-(2-ethylhexyl)-2-thienyl]benzo[1,2-b:4,5-b']dithiophene-2,6-diyl]-2,5-thiophened iyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

For example, the active layer is preferably formed by co-evaporation of an n-type semiconductor and a p-type semiconductor. Alternatively, the active layer may be formed by stacking an n-type semiconductor and a p-type semiconductor.

Three or more kinds of materials may be used for the active layer. For example, a third material may be mixed with an n-type semiconductor material and a p-type semiconductor material in order to extend the absorption wavelength range. The third material may be a low molecular compound or a high molecular compound.

In addition to the active layer, the light-receiving device may further include a layer containing a substance with a high hole-transport property, a substance with a high electron-transport property, a substance with a bipolar property (a substance with a high electron-transport property and a high hole-transport property), or the like. Without limitation to the above, the light-receiving device may further include a layer containing a substance with a high hole-injection property, a hole-blocking material, a substance with a high electron-injection property, an electron-blocking material, or the like. Layers other than the active layer included in the light-receiving device can be formed using a material that can be used for the light-emitting device.

As the hole-transport material or the electron-blocking material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

[Display Apparatus Having Light Detection Function]

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or the approach or contact of a target (e.g., a finger, a hand, or a pen) can be detected.

Furthermore, in the display apparatus of one embodiment of the present invention, the light-emitting devices can be used as a light source of the sensor. In the display apparatus of one embodiment of the present invention, when an object reflects (or scatters) light emitted by the light-emitting device included in the display portion, the light-receiving device can detect reflected light (or scattered light); thus, image capturing or touch detection is possible even in a dark place.

Accordingly, a light-receiving portion and a light source do not need to be provided separately from the display apparatus; hence, the number of components of an electronic device can be reduced. For example, a biometric authentication device, a capacitive touch panel for scroll operation, or the like is not necessarily provided separately from the electronic device. Thus, with the use of the display apparatus of one embodiment of the present invention, the electronic device can be provided with reduced manufacturing cost.

Specifically, the display apparatus of one embodiment of the present invention includes a light-emitting device and a light-receiving device in a pixel. In the display apparatus of one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display apparatus using the organic EL device.

In the display apparatus including a light-emitting device and a light-receiving device in each pixel, the pixel has a light-receiving function; thus, the display apparatus can detect a contact or approach of an object while displaying an image. For example, all the subpixels included in the display apparatus can display an image; alternatively, some of the subpixels can emit light as a light source, some of the rest of materials can detect light, and the other subpixels can display an image.

In the case where the light-receiving device is used as an image sensor, the display apparatus can capture an image with the use of the light-receiving device. For example, the display apparatus of this embodiment can be used as a scanner.

For example, image capturing for personal authentication with the use of a fingerprint, a palm print, the iris, the shape of a blood vessel (including the shape of a vein and the shape of an artery), a face, or the like can be performed using the image sensor.

For example, an image of the periphery, surface, or inside (e.g., fundus) of an eye of a user of a wearable device can be captured using the image sensor. Therefore, the wearable device can have a function of detecting one or more selected from blinking, movement of an iris, and movement of an eyelid of the user.

The light-receiving device can be used for a touch sensor (also referred to as a direct touch sensor), a near touch sensor (also referred to as a hover sensor, a hover touch sensor, a contactless sensor, or a touchless sensor), or the like.

Here, the touch sensor or the near touch sensor can detect the approach or contact of an object (e.g., a finger, a hand, or a pen).

The touch sensor can detect an object when the display apparatus and the object come in direct contact with each other. The near touch sensor can detect an object even when the object is not in contact with the display apparatus. For example, the display apparatus is preferably capable of detecting an object when the distance between the display apparatus and the object is greater than or equal to 0.1 mm and less than or equal to 300 mm, preferably greater than or equal to 3 mm and less than or equal to 50 mm. With this structure, the display apparatus can be controlled without an object directly contacting with the display apparatus. In other words, the display apparatus can be controlled in a contactless (touchless) manner. With the above structure, the display apparatus can have a reduced risk of being dirty or damaged, or can be operated without the object directly contacting with a dirt (e.g., dust or a virus) attached to the display apparatus.

The refresh rate can be variable in the display apparatus of one embodiment of the present invention. For example, the refresh rate is adjusted (adjusted in the range from 1 Hz to 240 Hz, for example) in accordance with contents displayed on the display apparatus, whereby power consumption can be reduced. The driving frequency of the touch sensor or the near touch sensor may be changed in accordance with the refresh rate. For example, when the refresh rate of the display apparatus is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

Figure 36C:
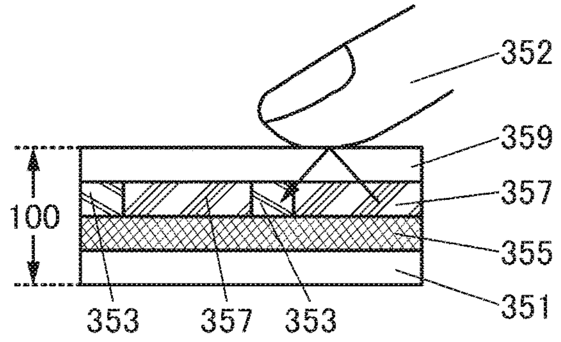
FIG. 36C to FIG. 36E are diagrams illustrating structure examples of a display apparatus.
Figure 36D:
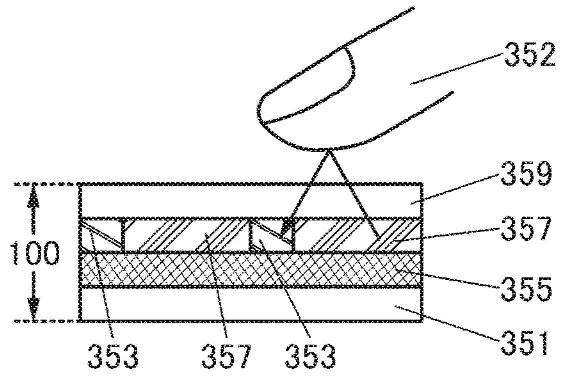
Figure 36E:
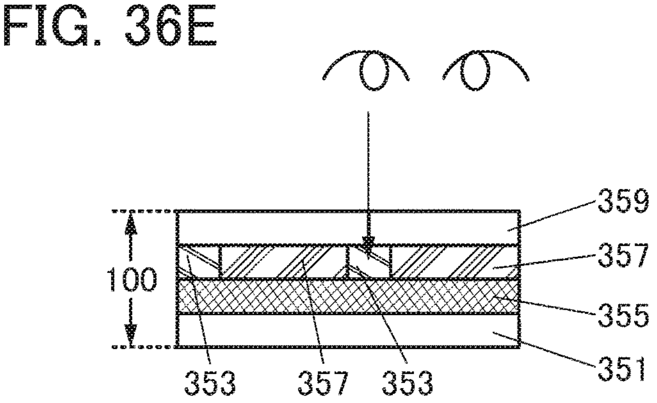

The display apparatus 100 illustrated in FIG. 36C to FIG. 36E includes a layer 353 including a light-receiving device, a functional layer 355, and a layer 357 including a light-emitting device, between a substrate 351 and a substrate 359.

The functional layer 355 includes a circuit for driving a light-receiving device and a circuit for driving a light-emitting device. One or more of a switch, a transistor, a capacitor, a resistor, a wiring, a terminal, and the like can be provided in the functional layer 355. Note that in the case where the light-emitting device and the light-receiving device are driven by a passive-matrix method, a structure including neither a switch nor a transistor may be employed.

For example, after light emitted by the light-emitting device in the layer 357 including the light-emitting device is reflected by a finger 352 in contact with the display apparatus 100 as illustrated in FIG. 36C, the light-receiving device in the layer 353 including the light-receiving device detects the reflected light. Thus, the contact of the finger 352 with the display apparatus 100 can be detected.

Alternatively, the display apparatus may have a function of detecting an object that is approaching (but is not in contact with) the display apparatus as illustrated in FIG. 36D and FIG. 36E or capturing an image of such an object. FIG. 36D illustrates an example where a human finger is detected, and FIG. 36E illustrates an example where information on the periphery, surface, or inside of the human eye (e.g., the number of blinks, movement of an eyeball, and movement of an eyelid) is detected.

This embodiment can be combined with the other embodiments as appropriate.

Embodiment 7

In this embodiment, electronic devices of one embodiment of the present invention will be described with reference to FIG. 37 to FIG. 39.

Electronic devices of this embodiment each include the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor of a computer or the like, digital signage, and a large game machine such as a pachinko machine.

In particular, the display apparatus of one embodiment of the present invention can have high resolution, and thus can be suitably used for an electronic device including a relatively small display portion. Examples of such an electronic device include watch-type and bracelet-type information terminal devices (wearable devices) and wearable devices that can be worn on a head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. The use of the display apparatus having one or both of such high definition and high resolution can further increase realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device that can be worn on a head are described with reference to FIG. 37A to FIG. 37D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher sense of immersion.

Figure 37A:
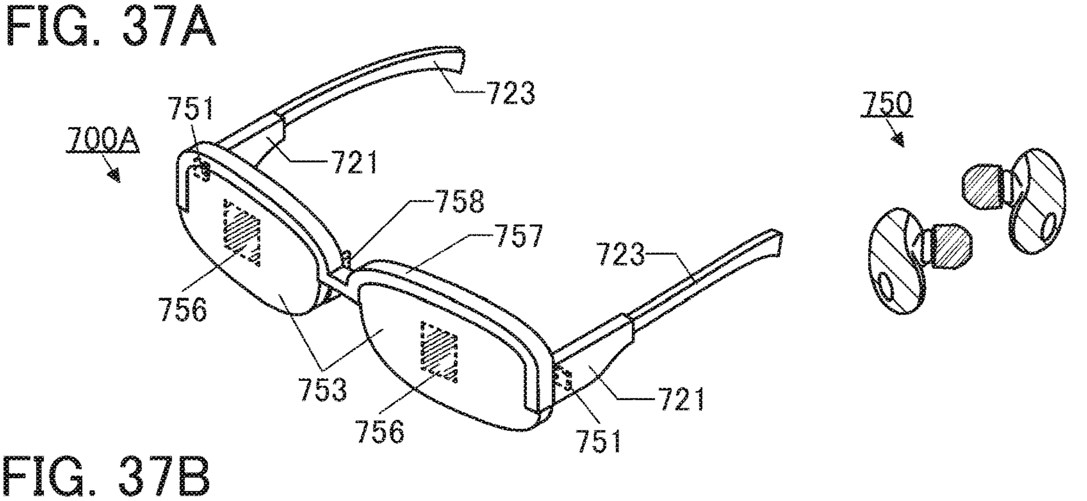
FIG. 37A to FIG. 37D are diagrams illustrating examples of electronic devices.
Figure 37B:
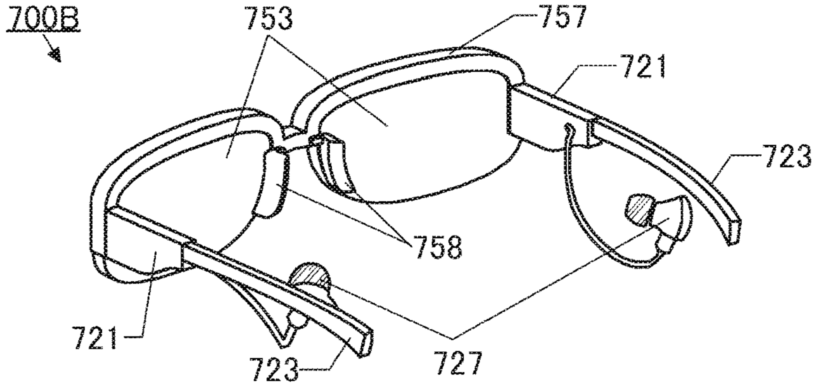

An electronic device 700A illustrated in FIG. 37A and an electronic device 700B illustrated in FIG. 37B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, the electronic device can perform display with extremely high resolution.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Note that instead of the wireless communication device or in addition to the wireless communication device, a connector to which a cable for supplying a video signal and a power supply potential can be connected may be provided.

The electronic device 700A and the electronic device 700B are provided with a battery so that they can be charged wirelessly and/or by wire.

A touch sensor module may be provided in the housing 721. The touch sensor module has a function of detecting touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be used for the touch sensor module. For example, any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device. One or both of an inorganic semiconductor and an organic semiconductor can be used for an active layer of the photoelectric conversion device.

Figure 37C:
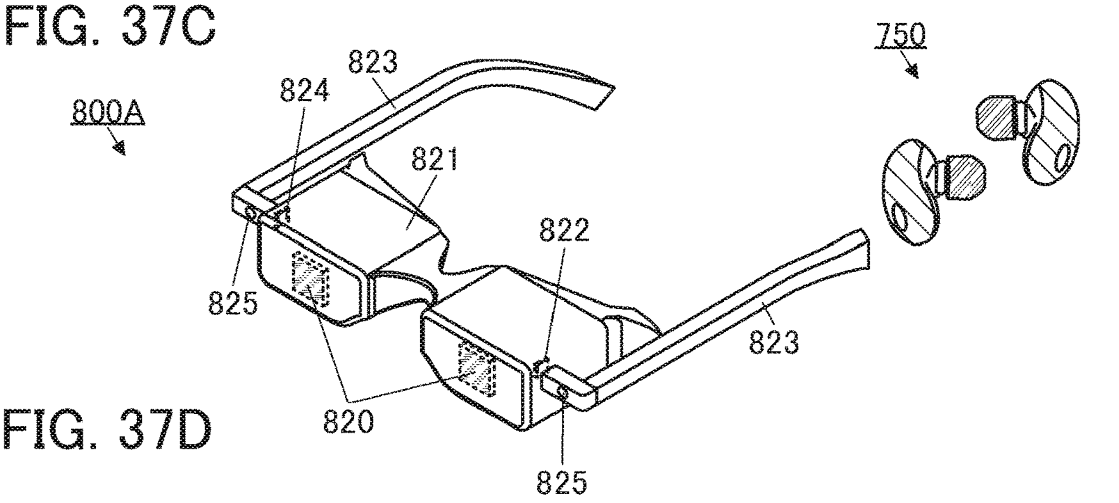
Figure 37D:
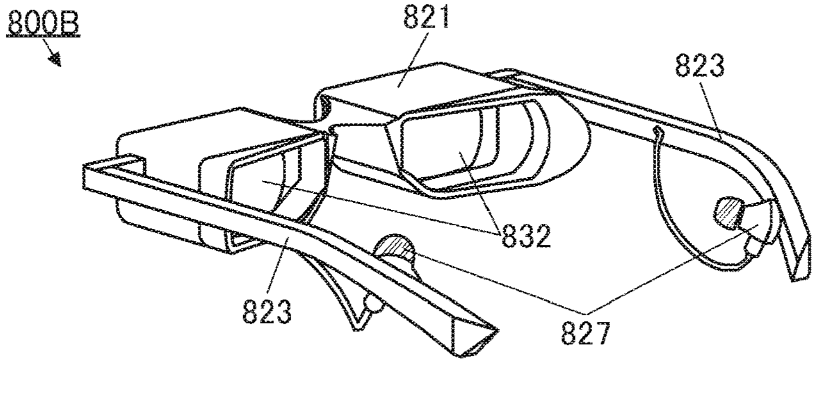

An electronic device 800A illustrated in FIG. 37C and an electronic device 800B illustrated in FIG. 37D each include a pair of display portions 820, a housing 821, a communication portion 822, a pair of wearing portions 823, a control portion 824, a pair of image capturing portions 825, and a pair of lenses 832.

The display apparatus of one embodiment of the present invention can be used for the display portions 820. Thus, the electronic device can perform display with extremely high resolution. This enables a user to feel high sense of immersion.

The display portions 820 are provided at a position inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 37C and the like illustrate examples where the wearing portion 823 has a shape like a temple of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be employed for any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A illustrated in FIG. 37A has a function of transmitting information to the earphones 750 with the wireless communication function. As another example, the electronic device 800A in FIG. 37C has a function of transmitting information to the earphones 750 with the wireless communication function.

The electronic device may include an earphone portion. The electronic device 700B illustrated in FIG. 37B includes earphone portions 727. For example, the earphone portion 727 and the control portion can be connected to each other by wire. Part of a wiring that connects the earphone portion 727 and the control portion may be positioned inside the housing 721 or the wearing portion 723.

Similarly, the electronic device 800B illustrated in FIG. 37D includes earphone portions 827. For example, the earphone portion 827 and the control portion 824 can be connected to each other by wire. Part of a wiring that connects the earphone portion 827 and the control portion 824 may be positioned inside the housing 821 or the wearing portion 823. Alternatively, the earphone portions 827 and the wearing portions 823 may include magnets. This is preferred because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 38A:
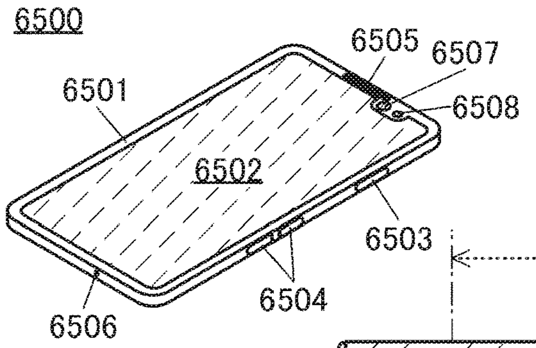
FIG. 38A to FIG. 38F are diagrams illustrating examples of electronic devices.

An electronic device 6500 illustrated in FIG. 38A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used for the display portion 6502.

Figure 38B:
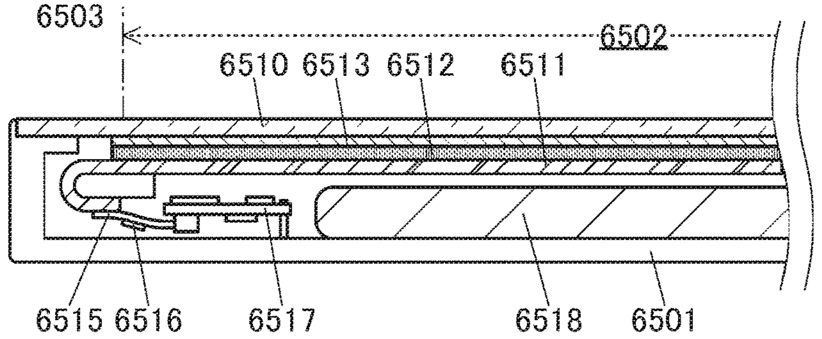

FIG. 38B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are placed in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be obtained. Since the display panel 6511 is extremely thin, the battery 6518 with high capacity can be mounted while an increase in thickness of the electronic device is suppressed. Moreover, part of the display panel 6511 is folded back so that a connection portion with the FPC 6515 is provided on the back side of the pixel portion, whereby an electronic device with a narrow bezel can be obtained.

Figure 38C:
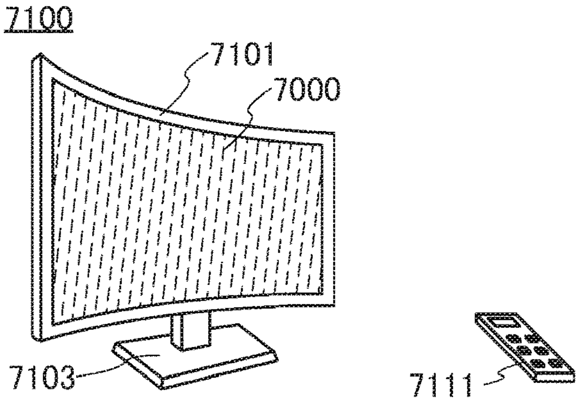

FIG. 38C illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 38C can be performed with an operation switch provided in the housing 7101 and a separate remote control 7111. Alternatively, the display portion 7000 may include a touch sensor, and the television device 7100 may be operated by touch on the display portion 7000 with a finger or the like. The remote control 7111 may include a display portion for displaying information output from the remote control 7111. With operation keys or a touch panel provided in the remote control 7111, channels and volume can be controlled and videos displayed on the display portion 7000 can be controlled.

Note that the television device 7100 has a structure where a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

Figure 38D:
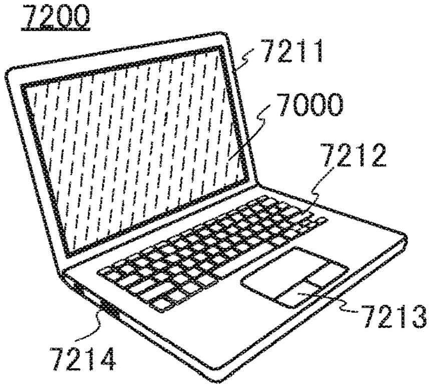

FIG. 38D illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

Figure 38E:
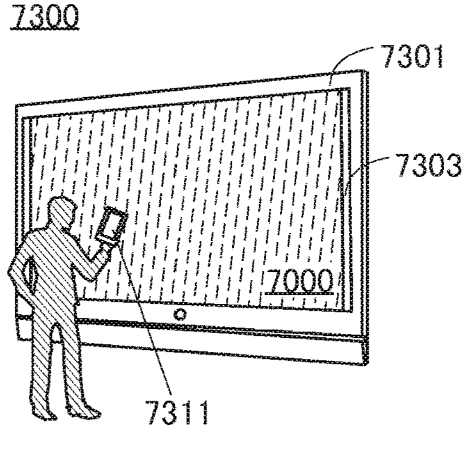
Figure 38F:
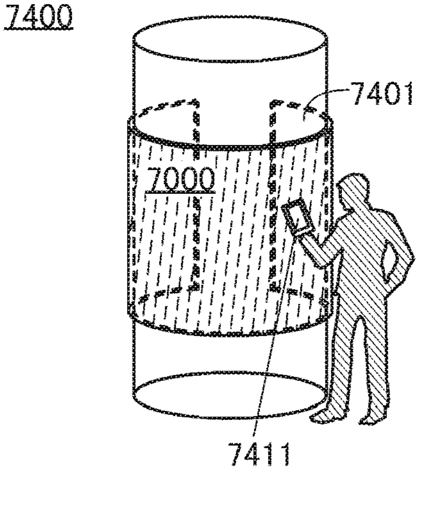

FIG. 38E and FIG. 38F illustrate examples of digital signage.

Digital signage 7300 illustrated in FIG. 38E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 38F is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in each of FIG. 38E and FIG. 38F.

A larger area of the display portion 7000 can increase the amount of information that can be provided at a time. The larger the display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As illustrated in FIG. 38E and FIG. 38F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 39A to FIG. 39G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display apparatus of one embodiment of the present invention can be used for the display portion 9001 in FIG. 39A to FIG. 39G.

The electronic devices illustrated in FIG. 39A to FIG. 39G have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 39A to FIG. 39G are described in detail below.

Figure 39A:
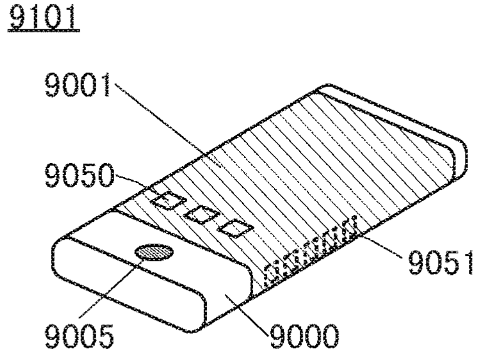
FIG. 39A to FIG. 39G are diagrams illustrating examples of electronic devices.

FIG. 39A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 39A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 39B:
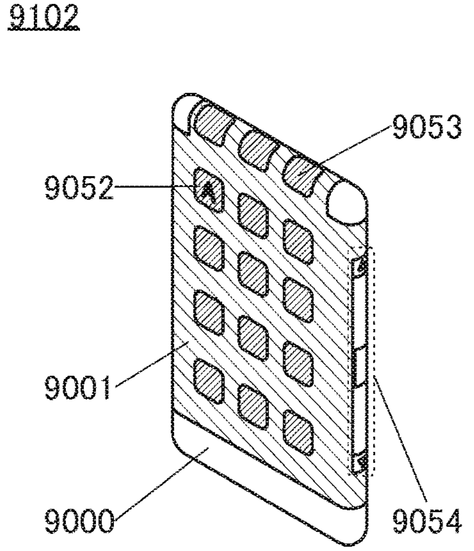

FIG. 39B is a perspective view illustrating a portable information terminal 9102. The portable information terminal 9102 has a function of displaying information on three or more surfaces of the display portion 9001. Shown here is an example where information 9052, information 9053, and information 9054 are displayed on different surfaces. For example, a user can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 39C:
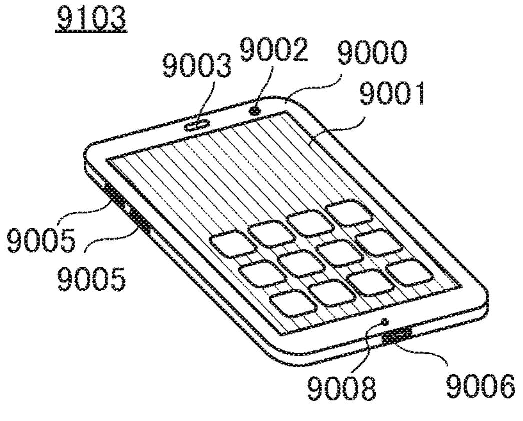

FIG. 39C is a perspective view illustrating a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 39D:
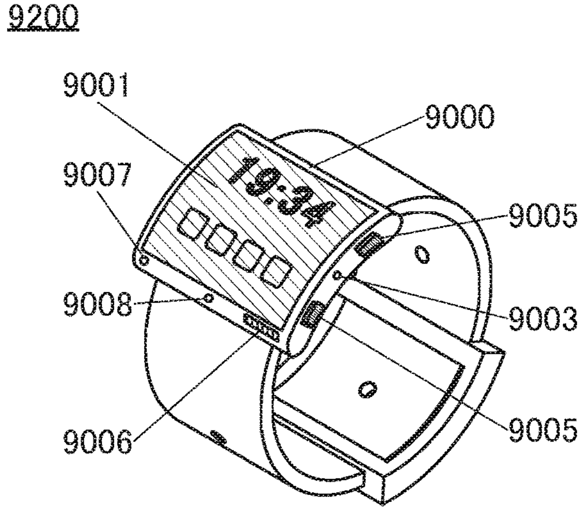

FIG. 39D is a perspective view illustrating a watch-type portable information terminal 9200. For example, the portable information terminal 9200 can be used for a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 39E:
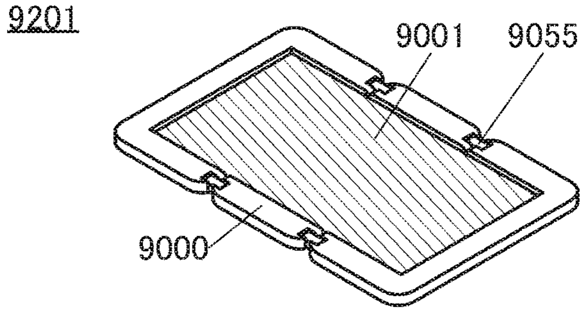
Figure 39F:
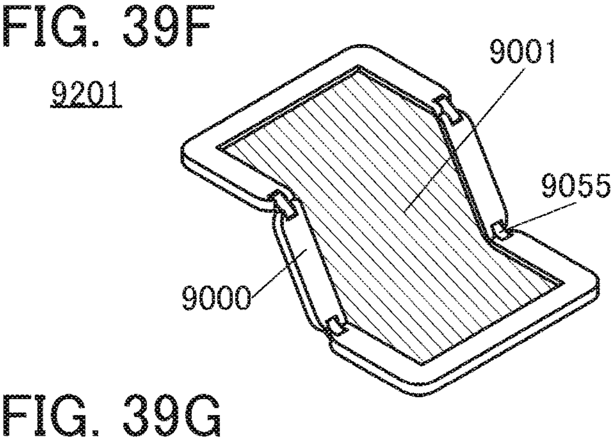
Figure 39G:
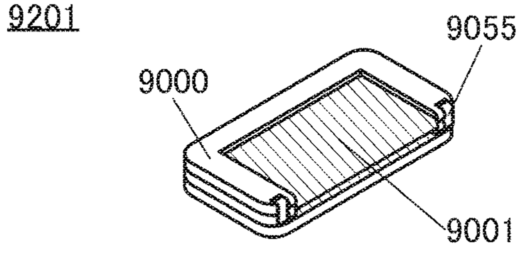

FIG. 39E to FIG. 39G are perspective views illustrating a foldable portable information terminal 9201. FIG. 39E is a perspective view of an opened state of the portable information terminal 9201, FIG. 39G is a perspective view of a folded state thereof, and FIG. 39F is a perspective view of a state in the middle of change from one of FIG. 39E and FIG. 39G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with the other embodiments as appropriate.

REFERENCE NUMERALS

100A: display apparatus, 100B: display apparatus, 100C: display apparatus, 100D: display apparatus, 100E: display apparatus, 100F: display apparatus, 100G: display apparatus, 100H: display apparatus, 100J: display apparatus, 100: display apparatus, 101: layer including transistors, 103: region, 110*a*: subpixel, 110B: subpixel, 110*b*: subpixel, 110*c*: subpixel, 110*d*: subpixel, 110*e*: subpixel, 110G: subpixel, 110R: subpixel, 110: pixel, 111*a*: pixel electrode, 111*b*: pixel electrode, 111*c*: pixel electrode, 111*d*: pixel electrode, 112*a*: conductive layer, 112*b*: conductive layer, 112*c*: conductive layer, 112*d*: conductive layer, 113A: film, 113: first layer, 114: common layer, 115: common electrode, 116: protruding portion, 117: light-blocking layer, 118*a*: mask layer, 118A: mask film, 118*b*: mask layer, 119*a*: mask layer, 119A: mask film, 120: substrate, 122: resin layer, 123: conductive layer, 124*a*: pixel, 124*b*: pixel, 125A: insulating film, 125: insulating layer, 126*a*: conductive layer, 126*b*: conductive layer, 126*c*: conductive layer, 126*d*: conductive layer, 127*a*: insulating film, 127*b*: insulating layer, 127*c*: insulating layer, 127: insulating layer, 128: layer, 129*a*: conductive layer, 129*b*: conductive layer, 129*c*: conductive layer, 129*d*: conductive layer, 130*a*: light-emitting device, 130B: light-emitting device, 130*b*: light-emitting device, 130*c*: light-emitting device, 130G: light-emitting device, 130R: light-emitting device, 131: protective layer, 132B: coloring layer, 132G: coloring layer, 132R: coloring layer, 133: lens array, 134: insulating layer, 135: depression portion, 140: connection portion, 142: adhesive layer, 150: light-receiving device, 151: substrate, 152: substrate, 153: insulating layer, 155: second layer, 162: display portion, 164: circuit, 165: wiring, 166: conductive layer, 172: FPC, 173: IC, 190*a*: resist mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231*i*: channel formation region, 231*n*: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 700A: electronic device, 700B: electronic device, 721: housing, 723: wearing portion, 727: earphone portion, 750: earphone, 751: display panel, 753: optical member, 756: display region, 757: frame, 758: nose pad, 761: lower electrode, 762: upper electrode, 763*a*: EL layer, 763*b*: EL layer, 763: EL layer, 764: layer, 765: layer, 766: layer, 767: active layer, 768: layer, 771: light-emitting layer, 772: light-emitting layer, 773: light-emitting layer, 780: layer, 781: layer, 782: layer, 785: charge generation layer, 790: layer, 791: layer, 792: layer, 800A: electronic device, 800B: electronic device, 820: display portion, 821: housing, 822: communication portion, 823: wearing portion, 824: control portion, 825: image capturing portion, 827: earphone portion, 832: lens, 6500: electronic device, 6501: housing, 6502: display portion, 6503: power button, 6504: button, 6505: speaker, 6506: microphone, 6507: camera, 6508: light source, 6510: protection member,

6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote control, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display apparatus comprising a first light-emitting device, a second light-emitting device, a first coloring layer, a second coloring layer, a first insulating layer, and a second insulating layer, wherein the first light-emitting device comprises a first pixel electrode, a first layer over the first pixel electrode, and a common electrode over the first layer, wherein the second light-emitting device comprises a second pixel electrode, a second layer over the second pixel electrode, and the common electrode over the second layer, wherein the first layer and the second layer each comprise a first light-emitting material emitting blue light and a second light-emitting material emitting light with a longer wavelength than blue light and are separated from each other, wherein the first coloring layer overlaps with the first light-emitting device, wherein the second coloring layer overlaps with the second light-emitting device, wherein the second coloring layer and the first coloring layer transmit light of different colors, wherein the first insulating layer covers a side surface and part of a top surface of the first layer and a side surface and part of a top surface of the second layer, wherein the second insulating layer overlaps with the side surface and the part of the top surface of the first layer and the side surface and the part of the top surface of the second layer with the first insulating layer therebetween, wherein the common electrode covers the second insulating layer, and wherein in a cross-sectional view, an end portion of the second insulating layer has a tapered shape with a taper angle less than 90°.

2. The display apparatus according to claim 1, wherein a top surface of the second insulating layer has a convex shape or a concave shape.

3. The display apparatus according to claim 1, wherein in the cross-sectional view, an end portion of the first insulating layer has a tapered shape with a taper angle less than 90°.

4. The display apparatus according to claim 1, wherein the second insulating layer covers at least part of a side surface of the end portion of the first insulating layer, and wherein an end portion of the second insulating layer is positioned outward from the end portion of the first insulating layer.

5. The display apparatus according to claim 1, further comprising a third insulating layer and a fourth insulating layer, wherein the third insulating layer is positioned between the top surface of the first layer and the first insulating layer, wherein the fourth insulating layer is positioned between the top surface of the second layer and the first insulating layer, and wherein an end portion of the third insulating layer and an end portion of the fourth insulating layer are each positioned outward from the end portion of the first insulating layer.

6. The display apparatus according to claim 5, wherein the second insulating layer covers at least part of a side surface of the third insulating layer and at least part of a side surface of the fourth insulating layer.

7. The display apparatus according to claim 5, wherein in the cross-sectional view, the end portion of the third insulating layer and the end portion of the fourth insulating layer each have a tapered shape with a taper angle less than 90°.

8. The display apparatus according to claim 1, wherein the end portion of the first insulating layer is positioned on an outer side of the end portion of the second insulating layer, and wherein in the cross-sectional view, the end portion of the first insulating layer has a tapered shape with a taper angle less than 90°.

9. The display apparatus according to claim 8, wherein the end portion of the first insulating layer comprises a portion with a smaller thickness than a portion of the first insulating layer overlapping with the second insulating layer.

10. The display apparatus according to claim 1, wherein the first layer and the second layer each comprise a light-emitting layer and a functional layer over the light-emitting layer, and wherein the functional layer comprises at least one of a hole-injection layer, an electron-injection layer, a hole-transport layer, an electron-transport layer, a hole-blocking layer, and an electron-blocking layer.

11. The display apparatus according to claim 1, wherein the first insulating layer and the second insulating layer each comprise a portion overlapping with a top surface of the first pixel electrode and a portion overlapping with a top surface of the second pixel electrode.

12. The display apparatus according to claim 1, wherein the first layer covers a side surface of the first pixel electrode, and wherein the second layer covers a side surface of the second pixel electrode.

13. The display apparatus according to claim 1, wherein in the cross-sectional view, an end portion of the first pixel electrode and an end portion of the second pixel electrode each have a tapered shape with a taper angle less than 90°.

14. The display apparatus according to claim 1, wherein the first insulating layer is an inorganic insulating layer, and wherein the second insulating layer is an organic insulating layer.

15. The display apparatus according to claim 1, wherein the first insulating layer comprises aluminum oxide.

16. The display apparatus according to claim 1, wherein the second insulating layer comprises an acrylic resin.

17. The display apparatus according to claim 1, wherein the first light-emitting device comprises a common layer between the first layer and the common electrode, wherein the second light-emitting device comprises the common layer between the second layer and the common electrode, and wherein the common layer is positioned between the second insulating layer and the common electrode.

18. A display module comprising:

the display apparatus according to claim 1; and at least one of a connector and an integrated circuit.

19. An electronic device comprising:

the display module according to claim 18; and at least one of a housing, a battery, a camera, a speaker, and a microphone.

20. A method for fabricating a display apparatus, comprising:

forming a first pixel electrode and a second pixel electrode;

forming a first film over the first pixel electrode and the second pixel electrode;

forming a mask film over the first film;

processing the first film and the mask film to form a first layer and a first mask layer over the first pixel electrode and to form a second layer and a second mask layer over the second pixel electrode;

forming a first insulating film over the first mask layer and the second mask layer;

forming a second insulating film over the first insulating film;

processing the second insulating film to form a second insulating layer so as to overlap with a region interposed between the first pixel electrode and the second pixel electrode;

performing heat treatment and then performing first etching treatment using the second insulating layer as a mask to remove part of the first mask layer and part of the second mask layer and to expose a top surface of the first layer and a top surface of the second layer; and forming a common electrode to cover the first layer, the second layer, and the second insulating layer, wherein the first layer and the second layer each comprise a first light-emitting material emitting blue light and a second light-emitting material emitting light with a longer wavelength than blue light.

21. The method for fabricating a display apparatus, according to claim 20, wherein second etching treatment is performed using the second insulating layer as a mask before the heat treatment to remove part of the first insulating film and to thin down the part of the first mask layer and the part of the second mask layer.

22. The method for fabricating a display apparatus, according to claim 20, wherein second etching treatment is performed using the second insulating layer as a mask after the heat treatment to remove part of the first insulating film and to thin down the part of the first mask layer and the part of the second mask layer, wherein plasma treatment is performed in an oxygen atmosphere to shrink the second insulating layer, and wherein the first etching treatment is then performed.

23. The method for fabricating a display apparatus, according to claim 20, wherein the first layer and the second layer each comprise a light-emitting layer and a functional layer over the light-emitting layer, and wherein the functional layer comprises at least one of a hole-injection layer, an electron-injection layer, a hole-transport layer, an electron-transport layer, a hole-blocking layer, and an electron-blocking layer.

24. The method for fabricating a display apparatus, according to claim 20, wherein aluminum oxide is deposited as the first insulating film by an ALD method.

25. The method for fabricating a display apparatus, according to claim 20, wherein aluminum oxide is deposited as the mask film by an ALD method.

26. The method for fabricating a display apparatus, according to claim 20, wherein the second insulating film is formed using a photosensitive acrylic resin.

27. The method for fabricating a display apparatus, according to claim 20, wherein the first etching treatment is performed by wet etching.

* * * * *